US012660309B2

(12) United States Patent
Doornbos et al.

(10) Patent No.: US 12,660,309 B2
(45) Date of Patent: Jun. 16, 2026

(54) CFET WITH ASYMMETRIC SOURCE/DRAIN FEATURES

(71) Applicant: Taiwan Semiconductor Manufacturing Co., Ltd., Hsinchu (TW)

(72) Inventors: Gerben Doornbos, Hsinchu (TW); Marcus Johannes Henricus Van Dal, Hsinchu (TW); Szuya Liao, Hsinchu (TW); Chung-Te Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 568 days.

(21) Appl. No.: 18/193,087

(22) Filed: Mar. 30, 2023

(65) Prior Publication Data

US 2024/0105725 A1 Mar. 28, 2024

Related U.S. Application Data

(60) Provisional application No. 63/410,176, filed on Sep. 26, 2022.

(51) Int. Cl.
| | |
|---|---|
| *H10D 84/85* | (2025.01) |
| *H10D 30/01* | (2025.01) |
| *H10D 30/43* | (2025.01) |
| *H10D 30/62* | (2025.01) |
| *H10D 30/67* | (2025.01) |
| *H10D 62/10* | (2025.01) |

(Continued)

(52) U.S. Cl.
CPC ......... *H10D 84/853* (2025.01); *H10D 30/014* (2025.01); *H10D 30/024* (2025.01); *H10D 30/43* (2025.01); *H10D 30/6211* (2025.01);

*H10D 30/6735* (2025.01); *H10D 62/121* (2025.01); *H10D 62/151* (2025.01); *H10D 64/017* (2025.01); *H10D 84/0167* (2025.01); *H10D 84/017* (2025.01); *H10D 84/0193* (2025.01); *H10D 84/038* (2025.01)

(58) Field of Classification Search
CPC ............... H10D 84/853; H10D 30/024; H10D 30/6211; H10D 84/0193; H10D 30/6757; H10D 84/0149; H10D 84/0186; H10D 84/83; H10D 84/85; H10D 88/00; H10D 88/01
See application file for complete search history.

(56) References Cited

U.S. PATENT DOCUMENTS

| | | | |
|---|---|---|---|
| 9,236,267 | B2 | 1/2016 | De et al. |
| 9,502,265 | B1 | 11/2016 | Jiang et al. |

(Continued)

FOREIGN PATENT DOCUMENTS

| | | |
|---|---|---|
| TW | 202226345 A | 7/2022 |

*Primary Examiner* — Fernando L Toledo
*Assistant Examiner* — Adam S Bowen
(74) *Attorney, Agent, or Firm* — Seed IP Law Group

(57) ABSTRACT

An integrated circuit includes a complimentary field effect transistor (CFET). The CFET includes a first transistor and a second transistor stacked vertically. A conductive via extends vertically from a first source/drain region of the first transistor past the second transistor. The second transistor includes an asymmetric second source/drain region. The asymmetry of the second source/drain region helps ensure that the second source/drain region does not contact the conductive via.

20 Claims, 44 Drawing Sheets

(51) Int. Cl.

| | |
|---|---|
| *H10D 62/13* | (2025.01) |
| *H10D 64/01* | (2025.01) |
| *H10D 84/01* | (2025.01) |
| *H10D 84/03* | (2025.01) |

(56) References Cited

U.S. PATENT DOCUMENTS

| | | | |
|---|---|---|---|
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2013/0049115 A1 | 2/2013 | Cheng et al. | |
| 2017/0040321 A1 | 2/2017 | Mitard | |
| 2020/0075574 A1 | 3/2020 | Smith et al. | |
| 2022/0149184 A1 | 5/2022 | Hekmatshoartabari et al. | |
| 2023/0326926 A1* | 10/2023 | Kwon | H10D 30/43 |

* cited by examiner

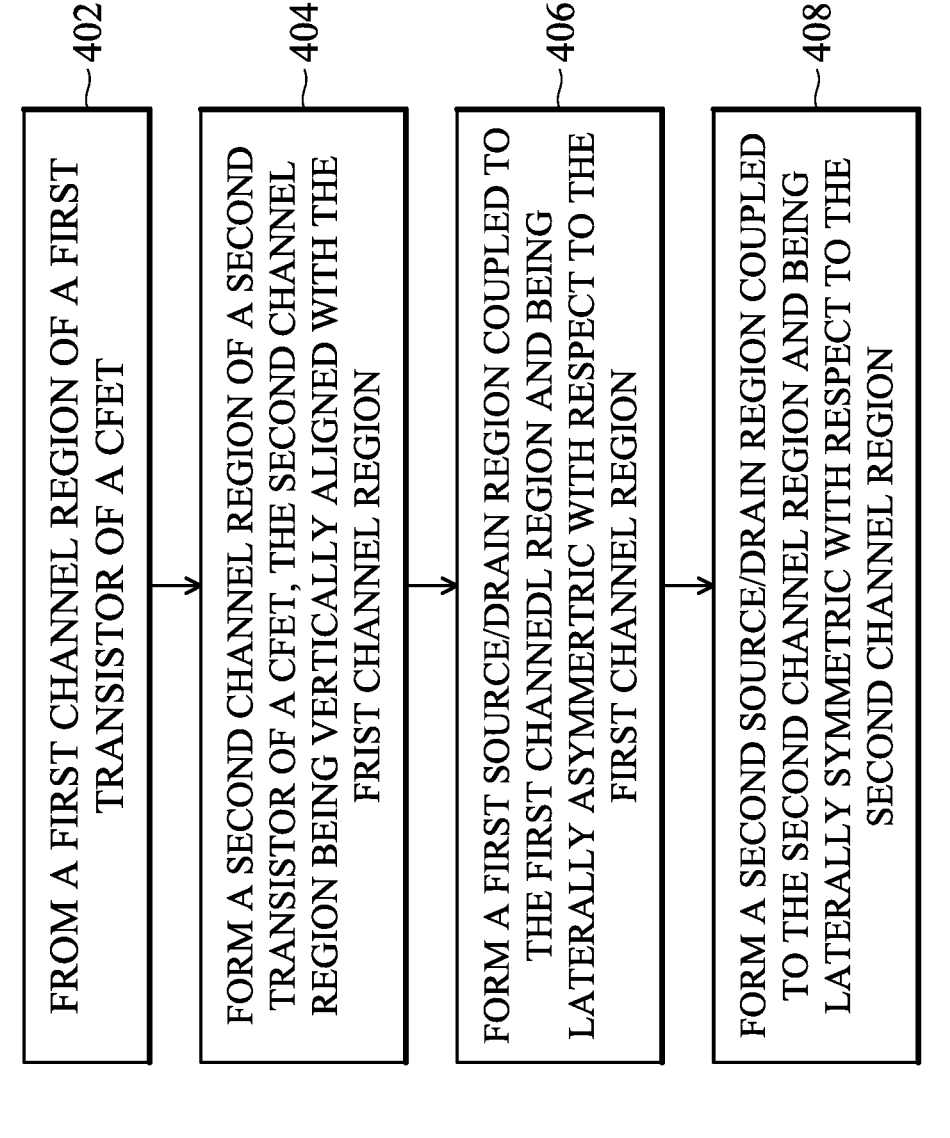

400

FROM A FIRST CHANNEL REGION OF A FIRST TRANSISTOR OF A CFET ⟋402

FORM A SECOND CHANNEL REGION OF A SECOND TRANSISTOR OF A CFET, THE SECOND CHANNEL REGION BEING VERTICALLY ALIGNED WITH THE FRIST CHANNEL REGION ⟋404

FORM A FIRST SOURCE/DRAIN REGION COUPLED TO THE FIRST CHANNEDL REGION AND BEING LATERALLY ASYMMERTRIC WITH RESPECT TO THE FIRST CHANNEL REGION ⟋406

FORM A SECOND SOURCE/DRAIN REGION COUPLED TO THE SECOND CHANNEL REGION AND BEING LATERALLY SYMMETRIC WITH RESPECT TO THE SECOND CHANNEL REGION ⟋408

FIG. 42

CFET WITH ASYMMETRIC SOURCE/DRAIN FEATURES

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Complementary field effect transistors (CFETs) may be utilized to increase the density of transistors in an integrated circuit. A CFET may include an N-type transistor and a P-type transistor stacked vertically. The gate electrodes of the N-type and P-type transistors may be electrically shorted together.

However, there are various difficulties associated with the formation of CFETs. For example, it can be difficult to form source/drain regions having desired characteristics in stacked transistors. The result is that one or both of the stacked transistors of the CFET may not function properly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 42 is a flow diagram of a method for forming an integrated circuit, in accordance with some embodiments.

DETAILED DESCRIPTION

Figure 1B:
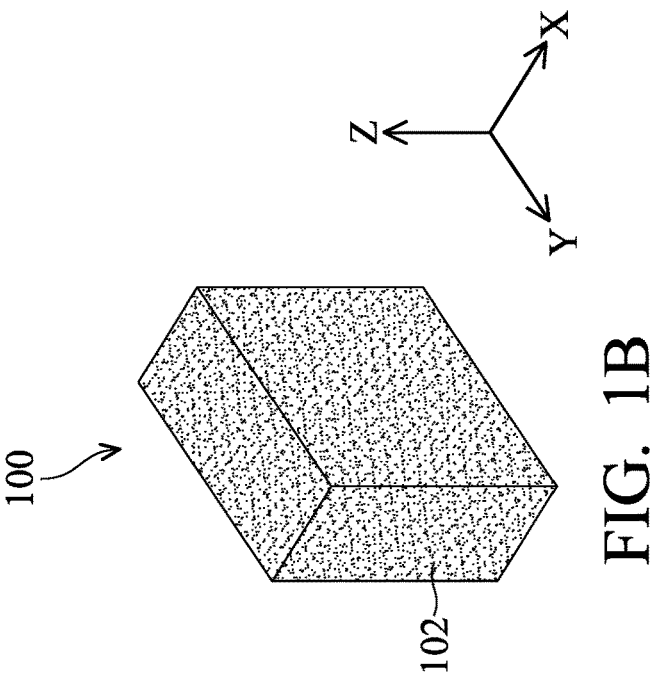
FIGS. 1A-16B are perspective views of an integrated circuit at intermediate stages of a process for forming a nanostructure CFET, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit including a CFET having source/drain regions and contact vias that consume a small amount of area while reducing the risk of unintended short circuits between source/drain regions and adjacent conductive vias. The CFET transistor includes a first transistor and a second transistor stacked vertically. Embodiments of the present disclosure provide asymmetrically shaped source/drain regions to enable conductive vias to be formed near source/drain regions without the risk of contacting the source/drain regions. The result is integrated circuits with dense arrays of CFETs and reduced risk of undesired short circuits. This leads to better performing devices and higher wafer yields.

FIGS. 1A-16B are perspective views of an integrated circuit 100 at various stages of processing, in accordance with some embodiments. In particular, FIGS. 1A-16B illustrate a process for forming a CFET 101 including a first transistor 103 and a second transistor 105 stacked above the first transistor. As will be set forth in more detail below, the CFET 101 utilizes one or more asymmetric source/drain regions to help facilitate reduced risk of unwanted contact between the asymmetric source/drain region and a nearby conductive structure.

The CFET 101 may correspond to a gate all around transistor. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around CFET 101 may include a plurality of semiconductor nanostructures corresponding to channel regions of the CFET 101. The semiconductor nanostructures may include nanosheets, nanowires, or other types of nanostructures. The gate all around transistors may also be termed nanostructure transistors.

Figure 1A:
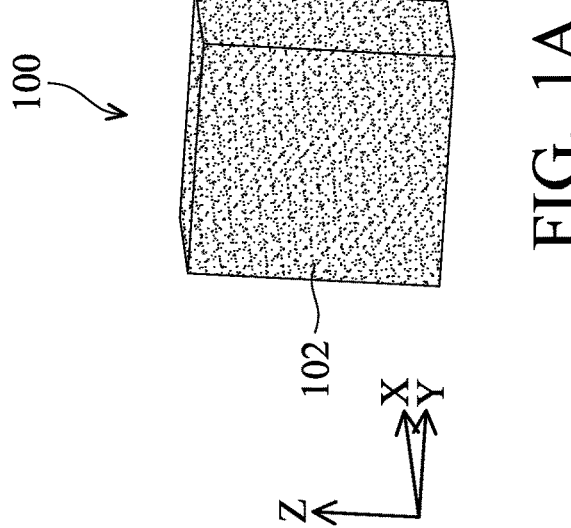

FIG. 1A illustrates a perspective view of an integrated circuit 100 and a set of X, Y, and Z axes. FIG. 1B illustrates a different perspective view of the same integrated circuit 100 and the corresponding orientation of the X, Y, and Z axes. In FIGS. 1A-16B, each figure with a suffix "A" (i.e., FIGS. 2A, 3A, etc.) has the same the orientation relative to the axes shown in FIG. 1A. In FIGS. 1A-16B, each figure with a suffix B (i.e., FIGS. 2B, 3B, etc.) has the same the orientation relative to the axes shown in FIG. 1B. In general, the X, Y, and Z axes may be shown in figures in which the axes are discussed and may not be shown in figures in which the axes are not discussed. The orientation of the axes can be obtained by reference back to FIGS. 1A and 1B.

In FIGS. 1A and 1B, the integrated circuit 100 includes a semiconductor substrate 102. The substrate 102 can include a semiconductor layer or combinations of semiconductor layers. In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP.

In some embodiments, the substrate 102 may include dielectric layers including one or more of silicon oxide, silicon nitride, silicon oxynitride, silicon carbonitride, silicon oxycarbonitride, fluorine-doped silicate glass (FSG), a low-K dielectric material or other dielectric materials. For example, the substrate 102 may be part of a silicon on insulator (SoI) substrate.

Figure 2B:
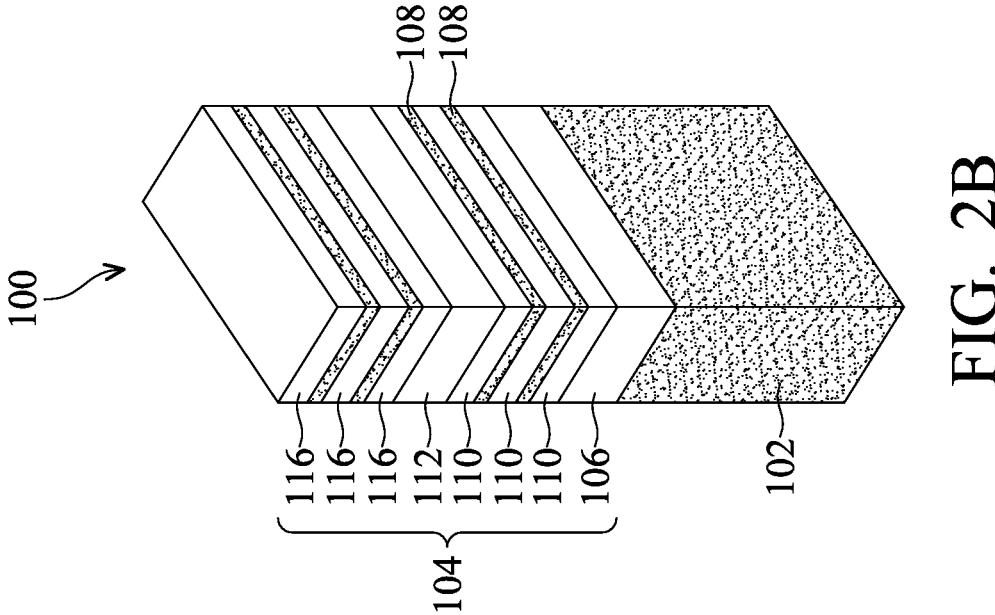
Figure 2A:
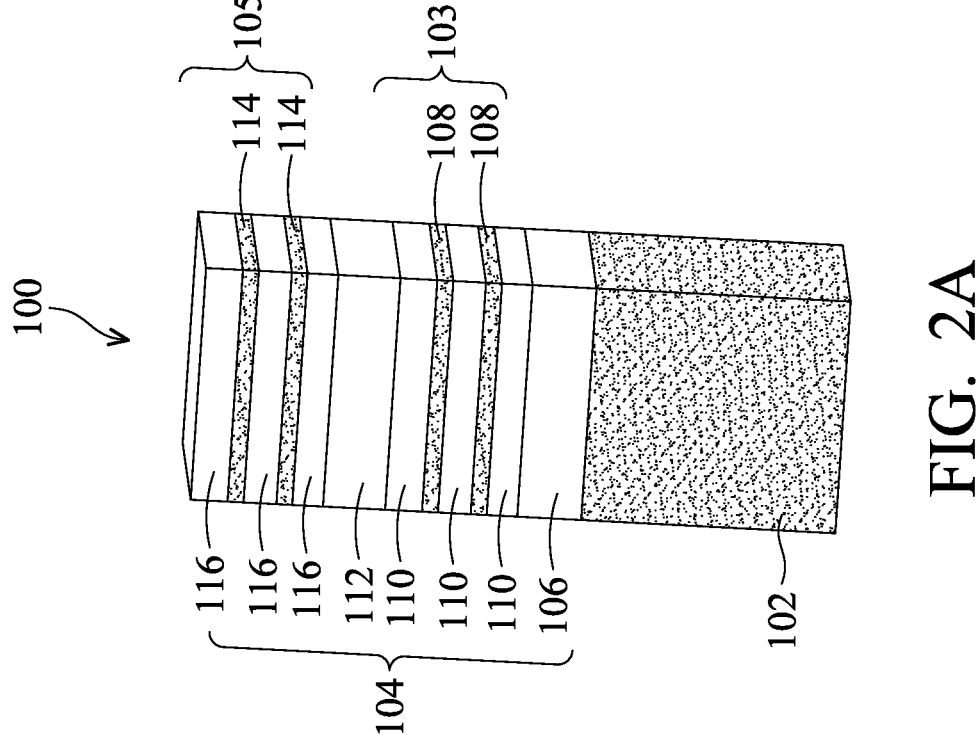

In FIGS. 2A and 2B, a stack 104 of layers has been formed over the substrate 102, in accordance with some embodiments. The stack 104 can be formed by performing a series of epitaxial growth processes from the substrate 102 to form the layers of the stack 104. Alternatively, the stack 104 can be formed by one or more atomic layer deposition (ALD) processes or one or more chemical vapor deposition (CVD) processes. The layers of the stack 104 may be formed by a combination of epitaxial growth processes, ALD processes, and CVD processes. In some embodiments, the stack 104 of layers is a semiconductor stack. In particular, the stack 104 can be formed by a plurality of epitaxial growth processes to grow a stack of semiconductor layers from the substrate 102. The semiconductor stack can include various layers that are selectively etchable with respect to each other. Other types of stacks can be utilized without departing from the scope of the present disclosure.

The stack 104 includes a spacing layer 106. The spacing layer 106 may be utilized to separate the substrate 102 from other semiconductor layers of the stack 104. The material of the spacing layer 106 is selected to be selectively etchable with respect to other layers of the stack 104. The spacing layer 106 may include a semiconductor material such as silicon germanium, silicon, or other types of semiconductor materials. The spacing layer 106 may include a dielectric material such as silicon oxide, or other types of dielectric materials. The spacing layer 106 may have a thickness between 10 nm and 30 nm. Other materials, thicknesses, and deposition processes can be utilized for the spacing layer 106 without departing from the scope of the present disclosure.

The stack 104 includes a plurality of sacrificial layers 110 and a plurality of semiconductor layers 108 interleaved between the sacrificial layers 110. As will be set forth in more detail below, the semiconductor layers 108 will eventually be patterned to form semiconductor nanostructures corresponding to channel regions of a lower transistor 103 of the CFET 101. As will be set forth in more detail below, the sacrificial layers 110 will eventually be patterned into sacrificial nanostructures. The sacrificial nanostructures will eventually be removed and the gate metals, gate dielectrics, and inner spacers of the lower transistor 103 will be formed in place of the sacrificial nanostructures. In one embodiment, the lower transistor 103 may be an N-type transistor while the upper transistor 105 may be a P-type transistor. Alternatively, the lower transistor 103 may be a P-type transistor while the upper transistor 105 may be an N-type transistor. In the CFET 101, one of the transistors is a P-type transistor and the other is an N-type transistor.

In some embodiments, the semiconductor layers 108 include a monocrystalline semiconductor material. The semiconductor material can include a single crystalline semiconductor material such as, but not limited to Si, Ge, SiGe, GaAs, InSb, GaP, GaSb, InAlAs, InGaAs, GaSbP, GaAsSb and InP. In an example process described herein, the semiconductor layers 108 include silicon. The semiconductor layers 108 may have a thickness between 2 nm and 5 nm. Other materials and thicknesses may be utilized for the semiconductor layers 108 without departing from the scope of the present disclosure.

The sacrificial layers 110 include a material different than the semiconductor material of the semiconductor layers 108. In particular, the sacrificial layers 110 include materials that are selectively etchable with respect to the material of the semiconductor layers 108. The sacrificial layers 110 can include a single crystalline material such as, but not limited to Si, Ge, SiGe, GaAs, InSb, GaP, GaSb, InAlAs, InGaAs, GaSbP, GaAsSb and InP. In an example process described herein, the sacrificial layers 110 include SiGe, while the semiconductor layers 108 include Si. The sacrificial layers 110 may have a thickness between 4 nm and 8 nm. Other materials and thicknesses can be utilized for the sacrificial layers 110 and the semiconductor layers 108 without departing from the scope of the present disclosure. Alternatively, the sacrificial layers 110 can include dielectric materials or other materials that are selectively etchable with respect to the semiconductor layers 108.

In the example in which the semiconductor layers 108 includes silicon, the spacing layer 106 can include silicon germanium having a different concentration of germanium than do the sacrificial layers 110, rendering the spacing layer 106 selectively etchable with respect to both the semiconductor layers 108 and the sacrificial layers 110. Other materials can be utilized without departing from the scope of the present disclosure.

The stack 104 includes a spacing layer 112 above the uppermost sacrificial layer 110. The spacing layer 112 may be utilized to separate the structures associated with the lower transistor 103 from structures associated with the upper transistor 105. The spacing layer 112 may have a same material and thickness as the spacing layer 106. The spacing layer 112 may have a thickness between 10 nm and 30 nm. Other materials and thicknesses can be utilized for the spacing layer 112 without departing from the scope of the present disclosure.

The stack 104 includes a plurality of sacrificial layers 116 and a plurality of semiconductor layers 114 interleaved between the sacrificial layers 116. As will be set forth in more detail below, the semiconductor layers 114 will eventually be patterned to form semiconductor nanostructures corresponding to channel regions of an upper transistor 105 of the CFET 101. As will be set forth in more detail below, the semiconductor layers 116 will eventually be patterned into sacrificial nanostructures. The sacrificial nanostructures will eventually be removed and the gate metals, gate dielectrics, and inner spacers of the upper transistor 105 will be formed in place of the sacrificial nanostructures.

The semiconductor layers 114 may have the same materials and thicknesses as the semiconductor layers 108. The sacrificial layers 116 may have the same materials and thicknesses as the sacrificial layers 110. The materials of the semiconductor layers 114, the sacrificial layers 116, and the spacing layer 112 may be selected so that they are selectively etchable with respect to each other. Alternatively, the layers 112, 114, and 116 can have different materials and thicknesses than those described in relation to the layers 106, 108, and 110. FIGS. 2A and 2B show examples where the number of semiconductor layers 108, and the number of semiconductor layers 114, are both equal to two. Other integer numbers of semiconductor layers are within the scope of this invention.

Figure 3B:
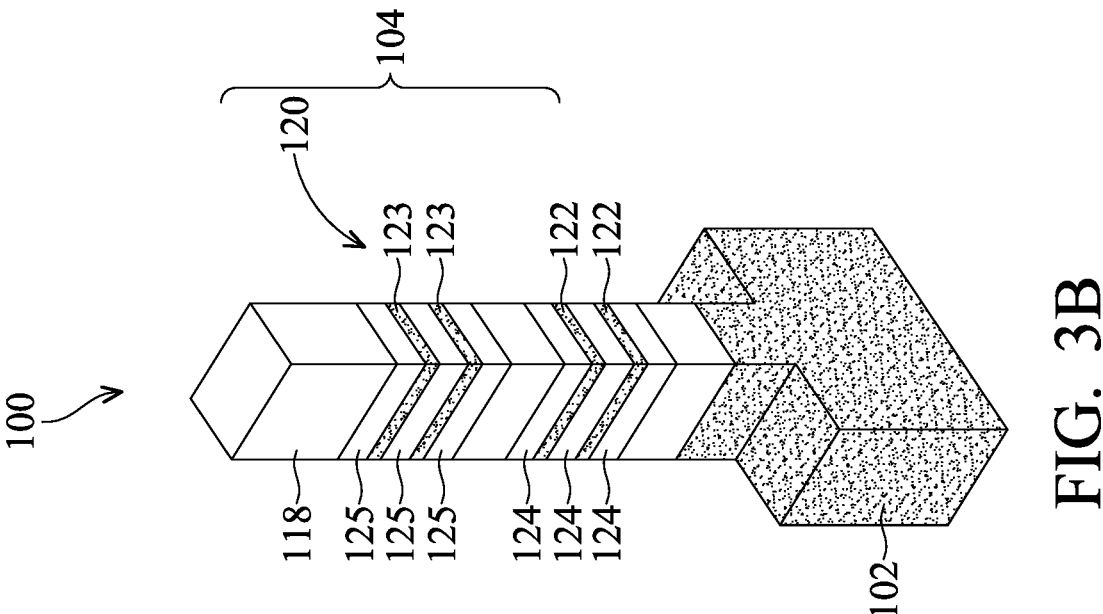
Figure 3A:
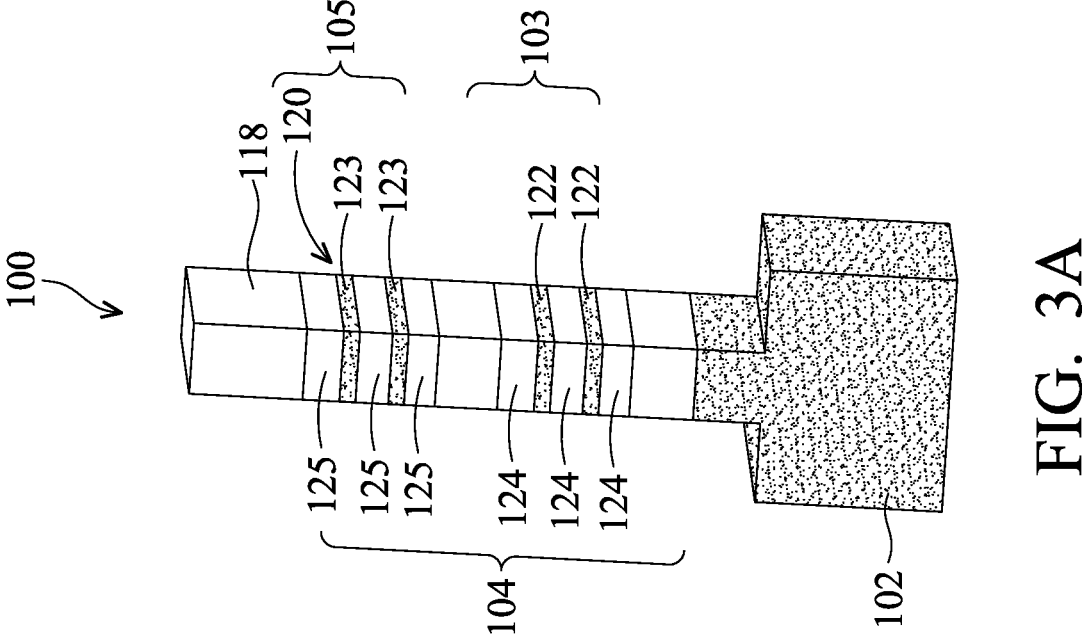

In FIGS. 3A and 3B, a hard mask layer 118 has been formed over the stack 104. In one example, the hard mask layer 118 can include silicon nitride. Alternatively, the hard mask layer 118 can include one or more of silicon oxide, silicon oxynitride, silicon carbonitride, silicon oxycarbonitride, fluorine-doped silicate glass (FSG), a low-K dielectric material or other dielectric materials. The hard mask layer 118 has been patterned with a photolithography process.

One or more etching processes have been performed in the presence of the hard mask layer 118 to etch the layers of the stack 104 in accordance with the pattern of the hard mask layer 118. The one or more etching processes can include one or more anisotropic etching processes that selectively etch in the vertical (z-)direction such that only those portions of the stack 104 directly below the hard mask layer 118 remain after the one or more etching processes. The one or more etching processes can include a dry etch, a wet etch, or other types of etching processes. The etching processes may be timed such that a portion of the substrate 102 is recessed by the one or more etching processes.

The one or more etching processes form a fin 120 from the stack 104. Though not apparent in the view of FIGS. 3A and 3B, the fin 120 extends over a certain length in the X direction. The channel regions and source/drain regions of a plurality of CFETs may be formed from the fin 120, though the formation of only a single CFET 101 will be shown.

The fin 120 includes a plurality of semiconductor nanostructures 122 formed from the semiconductor layers 108. The fin 120 includes a plurality of sacrificial nanostructures 124 formed from the sacrificial layers 110. The fin 120 includes a plurality of semiconductor nanostructures 123 formed from the semiconductor layers 114. The fin 120 includes a plurality of sacrificial nanostructures 125 formed from the sacrificial layers 116. As will be described in more detail below, the semiconductor nanostructures 122 correspond to stacked channel regions of the lower transistor 103. The stacked semiconductor nanostructures 123 correspond to stacked channel regions of the upper transistor 105.

Figure 4B:
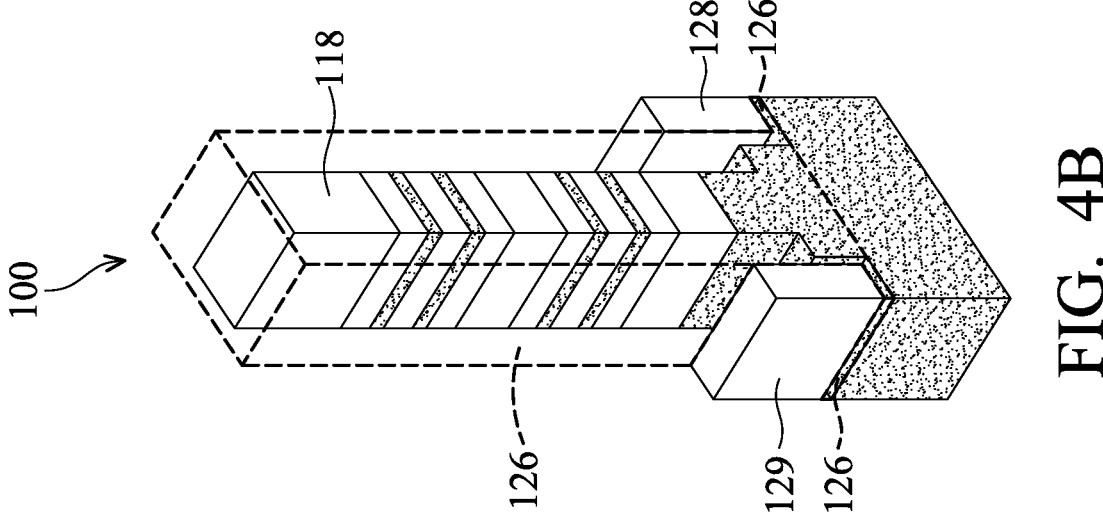
Figure 4A:
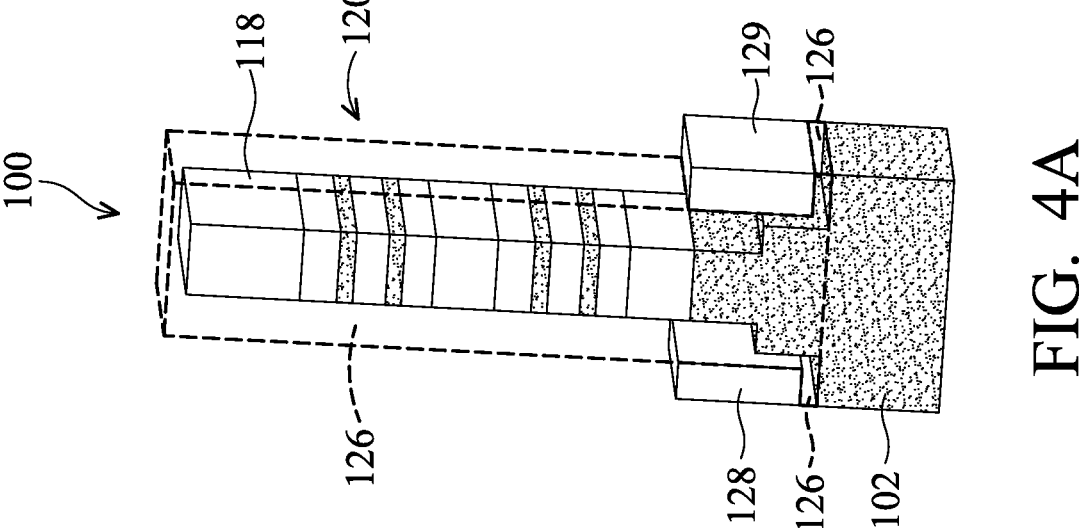

In FIGS. 4A and 4B, the semiconductor substrate 102 has been further recessed in preparation for forming buried metal lines 128 and 129. After formation of the recesses, a dielectric layer 126 is deposited on the fin 120 and the exposed surfaces of the substrate 102. In one example, the dielectric layer 126 includes silicon oxide, silicon nitride, silicon oxynitride, silicon carbonitride, silicon oxycarbonitride, fluorine-doped silicate glass (FSG), or another suitable dielectric material. The dielectric layer 126 can be formed by ALD, CVD, or another suitable deposition process.

After deposition of the dielectric layer 126, the buried metal lines 128 and 129 are formed. The buried metal lines can be formed by depositing a conductive material on the dielectric layer 126 in the recesses of the semiconductor substrate 102. A portion of the dielectric layer 126 is positioned between the substrate 102 and the buried metal lines 128 and 129. The conductive material can be deposited by physical vapor deposition (PVD), CVD, ALD, or another suitable deposition process. After deposition of the conductive material, one or more etching processes can be performed to pattern the metal layer into the buried metal lines 128 and 129 shown in FIGS. 4A and 4B. The buried metal lines 128 and 129 can include aluminum, titanium, tungsten, copper, cobalt, ruthenium, gold, or other suitable conductive materials. In some embodiments, the buried metal lines may supply voltages to the CFET structures, such as a positive voltage VDD, a negative voltage, or zero voltage VSS (ground).

In some embodiments, prior to formation of the buried metal lines 128 and 129, shallow trench isolation regions may be formed in recesses in the substrate 102 at the stage shown in FIGS. 3A and 3B. The shallow trench isolation regions can include silicon oxide or another suitable dielectric material. In some embodiments, the shallow trench isolation regions are formed by deposition of the dielectric layer 126.

In some embodiments, after formation of the buried metal lines 128 and 129, the dielectric layer 126 is further grown or deposited to cover the buried metal lines 128 and 129. Although a single dielectric layer 126 is shown in FIGS. 4A and 4B, in practice, the dielectric layer 126 can include multiple dielectric layers deposited before and after formation of the buried metal lines 128 and 129.

Figure 5B:
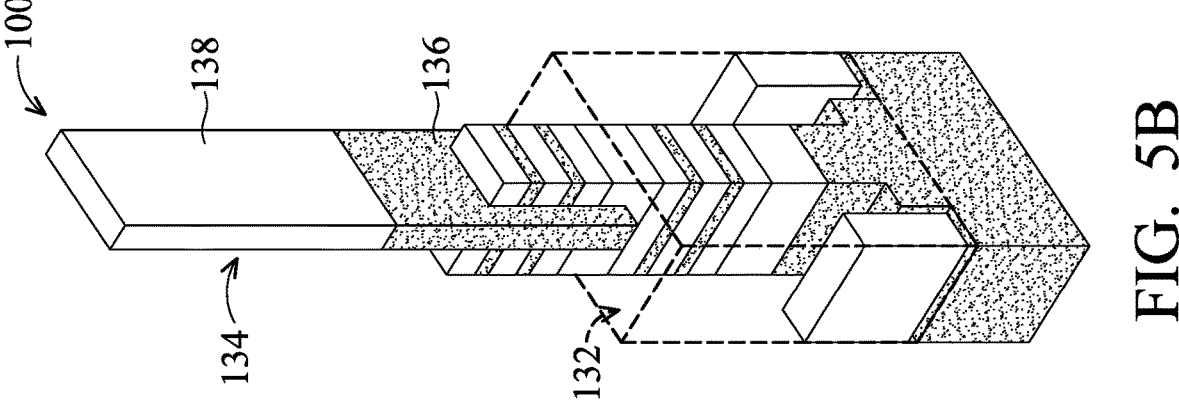
Figure 5A:
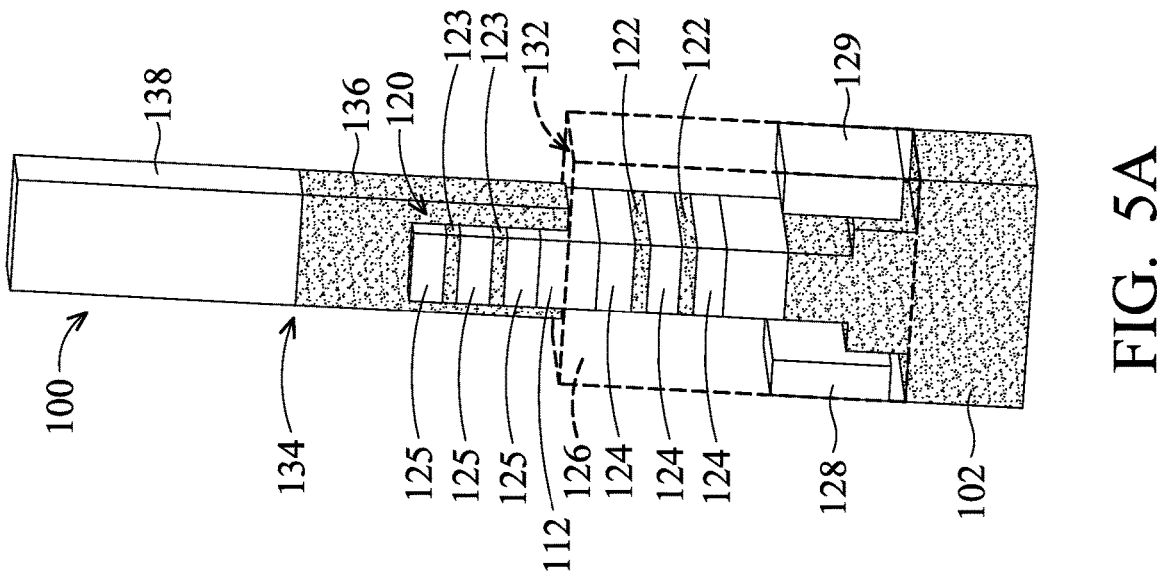

In FIGS. 5A and 5B, the dielectric layer 126 has been recessed such that a top surface 132 of the dielectric layer 126 is at a level between the highest sacrificial nanostructure 124 and the lowest sacrificial nanostructure 125. A first portion of the spacing layer 112 is below the top surface 132 of the dielectric layer 126. A second portion of the spacing layer 112 is above the top surface 132 of the dielectric layer 126. Portions of the semiconductor nanostructures 123 and sacrificial nanostructures 125 are exposed by recessing the dielectric layer 126.

After recessing the dielectric layer 126, a dummy gate structure 134 has been formed on the exposed portion of the fin 120 and on the top surface 132 of the dielectric layer 126. The dummy gate structure 134 includes a gate layer 136 and a hard mask layer 138. Though not shown in FIGS. 5A and 5B, the dummy gate structure 134 may include one or more dielectric liner layers between the gate layer 136 and the upper portions of the fin 120 such that the gate layer 136 is electrically isolated from the semiconductor nanostructures 123. The gate layer 136 may be polysilicon or any other suited material. The gate layer 136 can be deposited by PVD, CVD, ALD, or another suitable deposition process. Other materials can be utilized for the dummy gate structure 134 without departing from the scope of the present disclosure.

After deposition of the gate layer 136, the hard mask layer 138 is deposited. The hard mask layer 138 can include silicon nitride, silicon oxide, silicon oxynitride, silicon carbonitride, silicon oxycarbonitride, fluorine-doped silicate glass (FSG), or another suitable dielectric material. The hard mask layer 138 is patterned with a photolithography process to achieve the shape shown in FIGS. 5A and 5B. After patterning of the hard mask layer 138, etching processes are performed to remove portions of the gate layer 136 that are not directly below the hard mask layer 138.

The dummy gate structure 134 may extend in the Y direction. The dummy gate structure 134 is referred to as a dummy gate structure because the gate electrodes of the transistors 103 and 105 will be formed, in part, in place of the gate layer 136.

The dummy gate structure 134 may also include one or more additional dielectric layers above the gate layer 136. Various configurations and materials can be utilized for the dummy gate structure 134 without departing from the scope of the present disclosure.

Figure 6B:
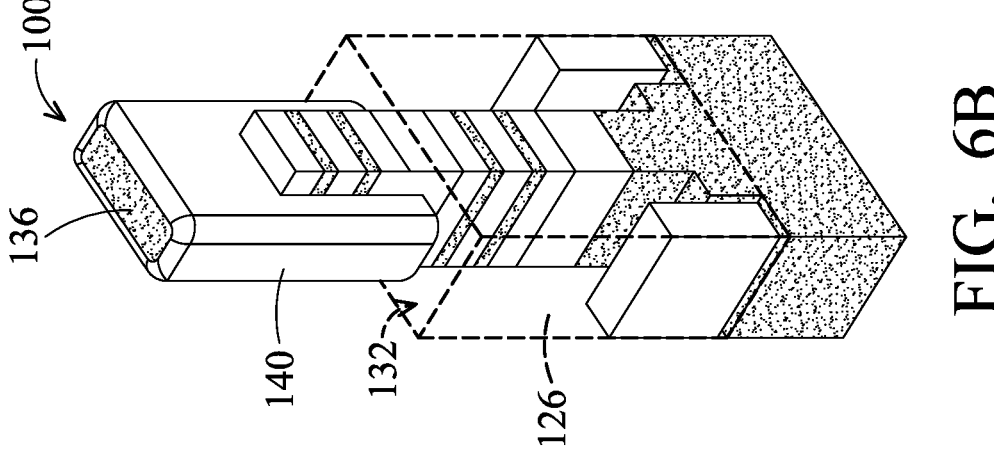
Figure 6A:
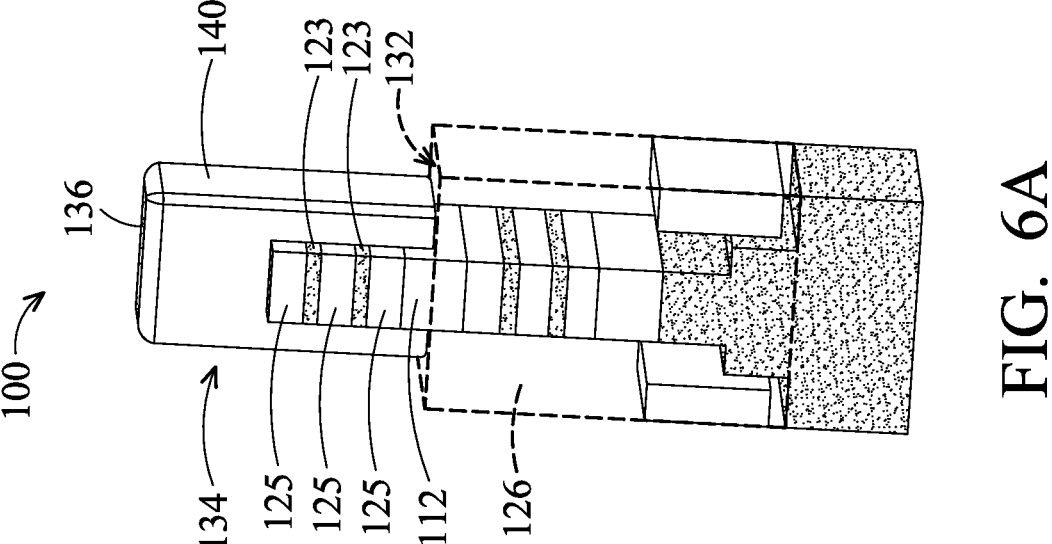

In FIGS. 6A and 6B, the hard mask layer 138 has been removed from the dummy gate structure 134. A gate spacer layer 140 has been formed on sidewalls of the gate layer 136. In one example, the gate spacer layer 140 includes silicon nitride. Alternatively, the gate spacer layer 140 can include silicon oxide, silicon oxynitride, silicon carbonitride, silicon oxycarbonitride, fluorine-doped silicate glass (FSG), or another suitable dielectric material. The gate spacer layer 140 may include multiple dielectric layers. The gate spacer layer 140 may also be termed a sidewall spacer.

Figure 7B:
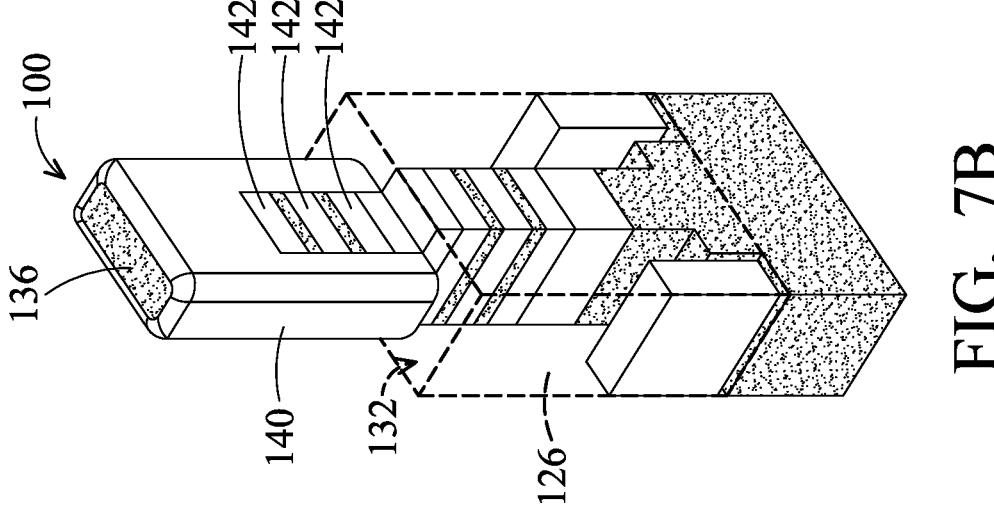
Figure 7A:
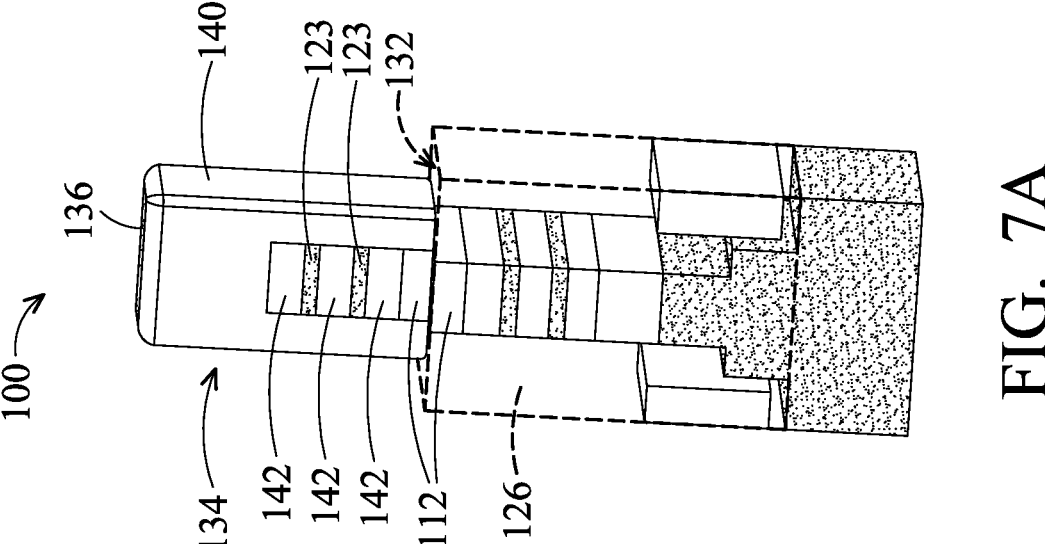

In FIGS. 7A and 7B an etching process has been performed to remove the portions of the sacrificial nanostructures 125 and semiconductor nanostructures 123 that are not directly below the gate spacer layer 140. The etching process can include an anisotropic etch that selectively etches in the downward (z-)direction.

After the initial downward etching process, further isotropic etching process is performed to recess the sacrificial nanostructures 125. The isotropic etching process selectively etches the material of the sacrificial nanostructures 125 with respect to the semiconductor nanostructures 123. The isotropic etching process is a timed process that recesses the sacrificial nanostructures 125 without entirely removing the sacrificial nanostructures 125.

After recessing the sacrificial nanostructures 125, inner spacers 142 are formed in the recesses of the sacrificial nanostructures 125. The inner spacers 142 can be formed by depositing a dielectric layer on the exposed sidewalls of the semiconductor nanostructures 123, on the top surface 132 of the dielectric layer 126, and in the recesses formed in the sacrificial nanostructures 125. The dielectric layer can include silicon oxide, silicon nitride, silicon oxynitride, silicon carbonitride, silicon oxycarbonitride, FSG, a low-K dielectric material or other dielectric materials without departing from the scope of the present disclosure. The dielectric layer can be formed by CVD, PVD, ALD, or via another process. The lateral thickness (in the x-direction) of the dielectric layer may be between 2 nm and 10 nm. Other thicknesses, materials, and deposition processes can be utilized for the dielectric layer without departing from the scope of the present disclosure.

An etching process is then performed to remove portions of the dielectric layer used to form the inner spacers 142. The etching process defines the inner spacers 142 as shown in FIGS. 7A and 7B. Other processes can be utilized to form the inner spacers 142 without departing from the scope of the present disclosure.

Figure 8B:
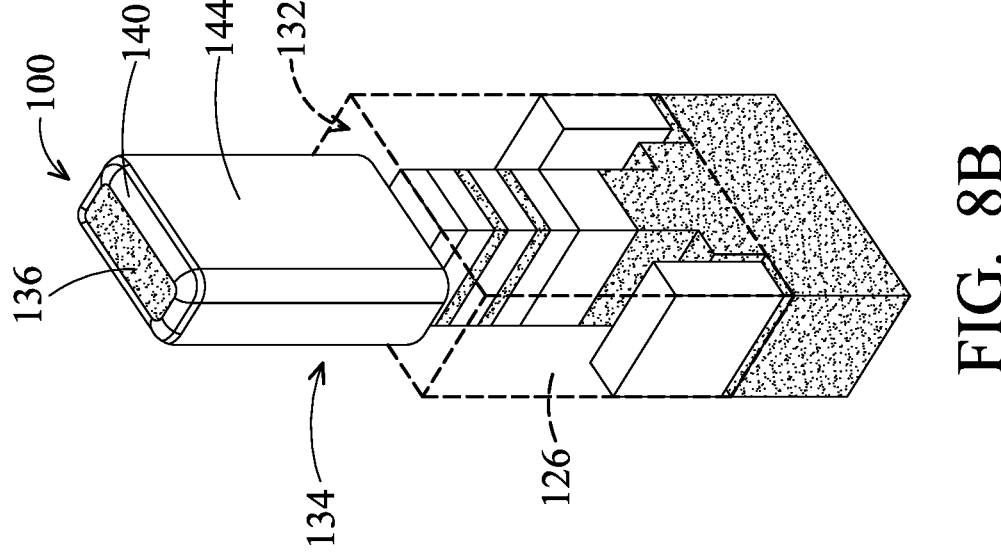
Figure 8A:
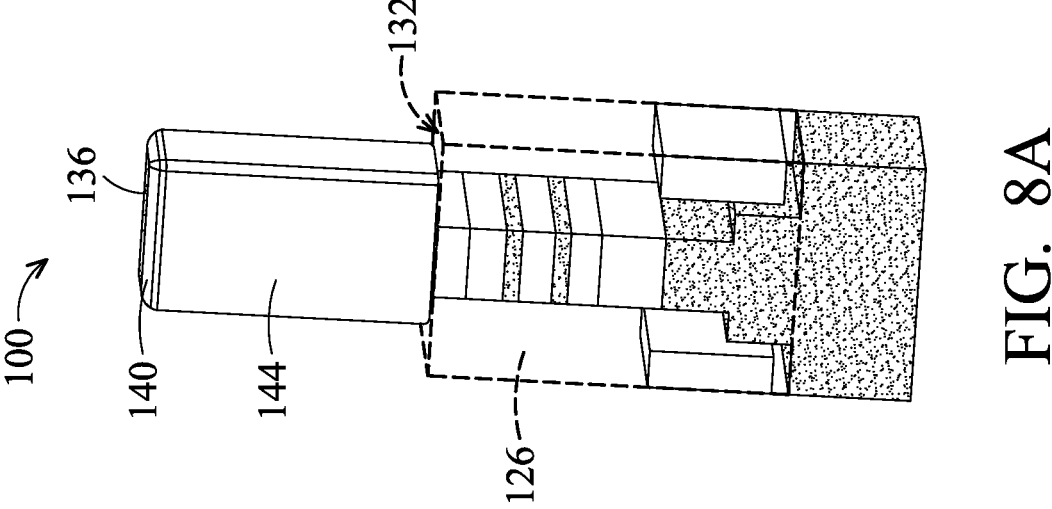

In FIGS. 8A and 8B, a dielectric layer 144 has been deposited. The dielectric layer 144 may initially be conformally deposited. An anisotropic etching process can then be performed to remove the portions of the dielectric layer 144 from the top surfaces of the gate layer 136 and gate spacer layer 140. The anisotropic etching process does not remove the vertically thicker portions of the dielectric layer 144 from the sidewalls of the gate spacer layers 140. In one example, the dielectric layer 144 includes SiOC. The dielectric layer 144 may also include silicon oxide, silicon nitride, silicon oxynitride, silicon carbonitride, silicon oxycarbonitride, FSG, a low-K dielectric material or other dielectric materials without departing from the scope of the present disclosure. The dielectric layer 144 may be deposited with a CVD process, an ALD process, a PVD process, or other suitable deposition processes.

Figure 9B:
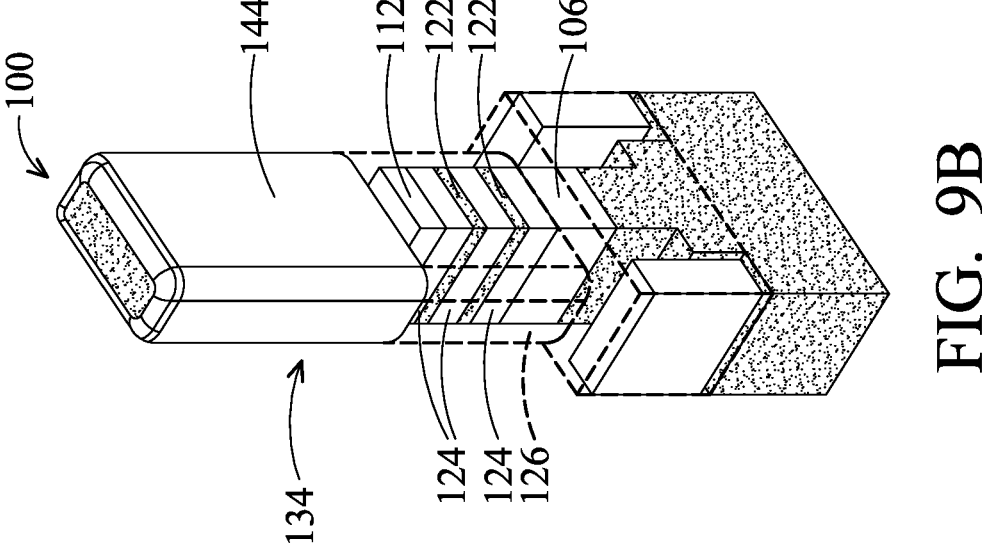
Figure 9A:
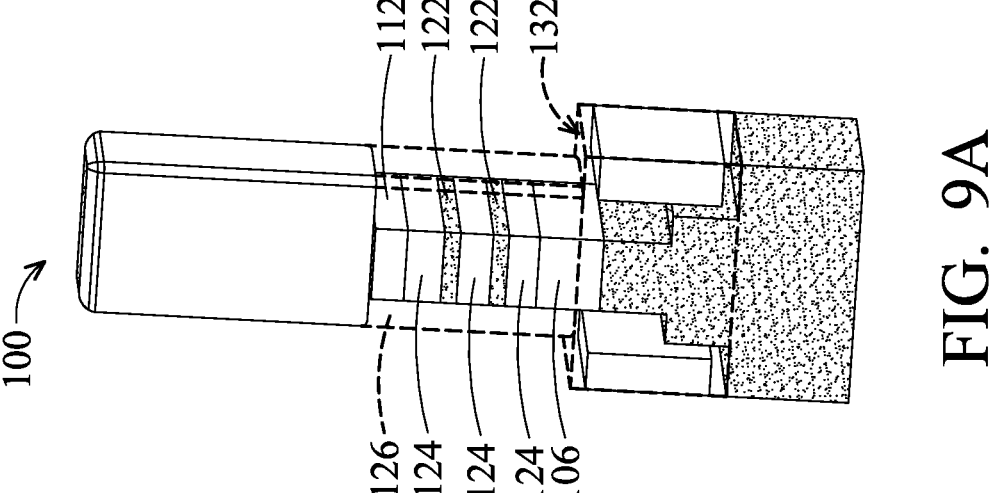

In FIGS. 9A and 9B, an etching process has been performed to recess the portions of the dielectric layer 126 that are not directly below the dielectric layer 144 and the other layers of the dummy gate structure 134. The result is that the exposed top surface 132 of the dielectric layer 126 is below the lowest sacrificial nanostructure 124 and intermediate to the spacing layer 106. Furthermore, portions of the spacing layer 112, the sacrificial nanostructures 124, and the semiconductor nanostructures 122 are exposed.

Figure 10B:
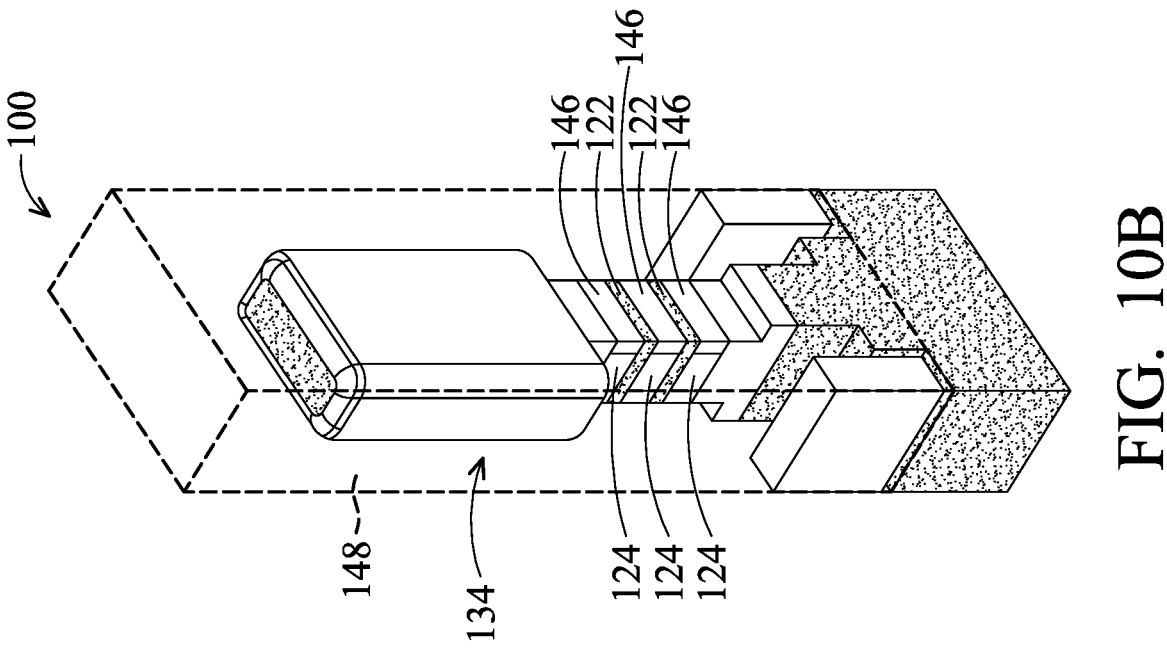
Figure 10A:
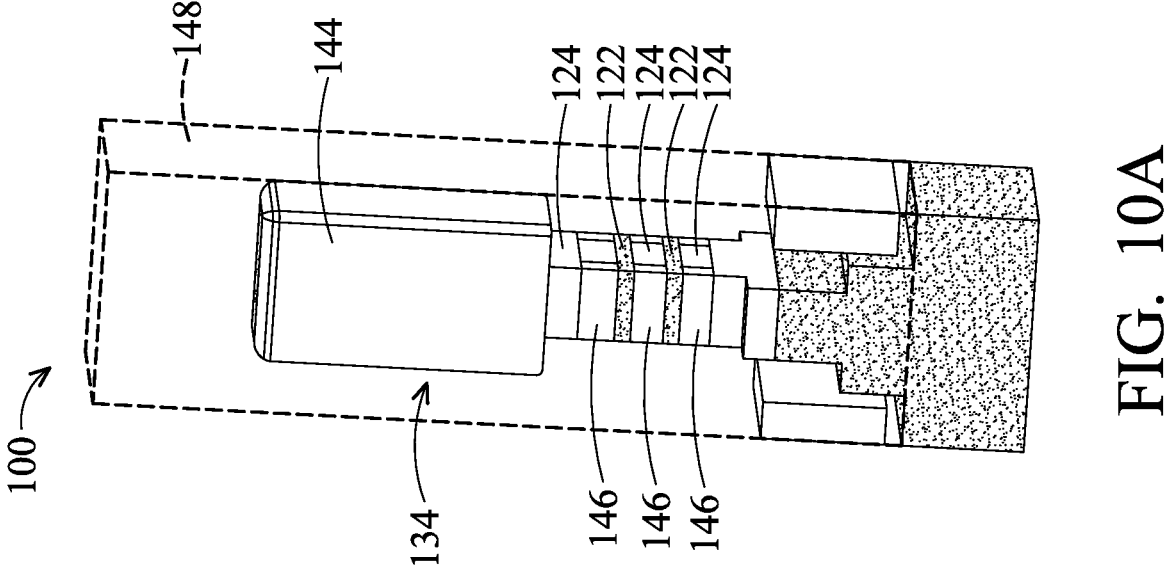

In FIGS. 10A and 10B, the portions of the sacrificial nanostructures 124 and semiconductor nanostructures 122 that protrude laterally from the dielectric layer 144 have been removed via one or more etching processes. In FIGS. 10A and 10B, inner spacers 146 have been formed in recessed portions of the sacrificial nanostructures 124. In one example, the inner spacers 146 include silicon nitride. Alternatively, the inner spacers 146 can include silicon oxide, silicon oxynitride, silicon carbonitride, silicon oxycarbonitride, FSG, a low-K dielectric material or other dielectric materials without departing from the scope of the present disclosure. The inner spacers 146 can be formed substantially as described in relation to the inner spacers 142. In particular, the sacrificial nanostructures 124 may be formed by recessing the sacrificial nanostructures 124 relative to the semiconductor nanostructures 122 and depositing a dielectric material in the recesses.

After formation of the inner spacers 146, a dielectric layer 148 is deposited. The dielectric layer 148 can include an interlayer dielectric (ILD) layer. In one example, the dielectric layer 148 includes silicon oxide. Alternatively, the dielectric layer 148 can include silicon nitride, silicon oxynitride, silicon carbonitride, silicon oxycarbonitride, FSG, a low-K dielectric material or other dielectric materials without departing from the scope of the present disclosure. The dielectric layer 148 can be deposited by CVD, ALD, PVD, or another suitable deposition process. After deposition of the dielectric layer 148, a chemical mechanical planarization (CMP) process can be performed to planarize the top surface of the dielectric layer 148.

In FIGS. 10A and 10B, the dielectric layer 148 is shown as being unitary with the remaining portions of the dielectric layer 126. The dielectric layer 148 may include a same material as the dielectric layer 126, such that they effectively form a single layer. In any case, for simplicity the remaining portions of the dielectric layer 126 will be shown as and referred to as part of the dielectric layer 148.

Figure 11B:
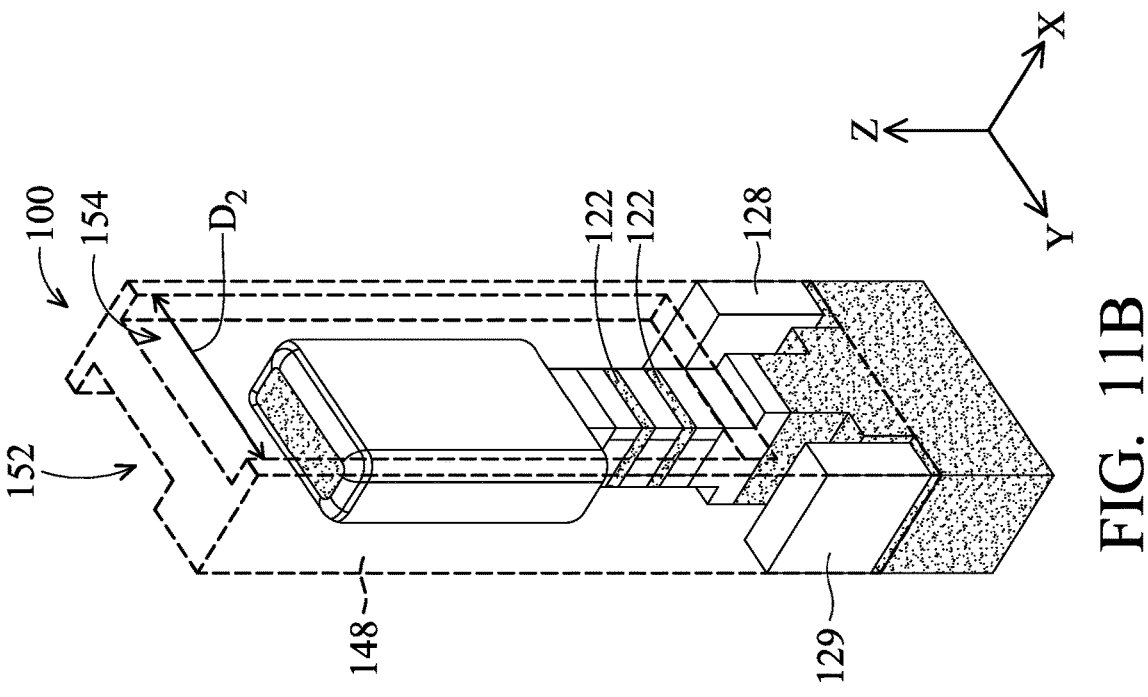
Figure 11A:
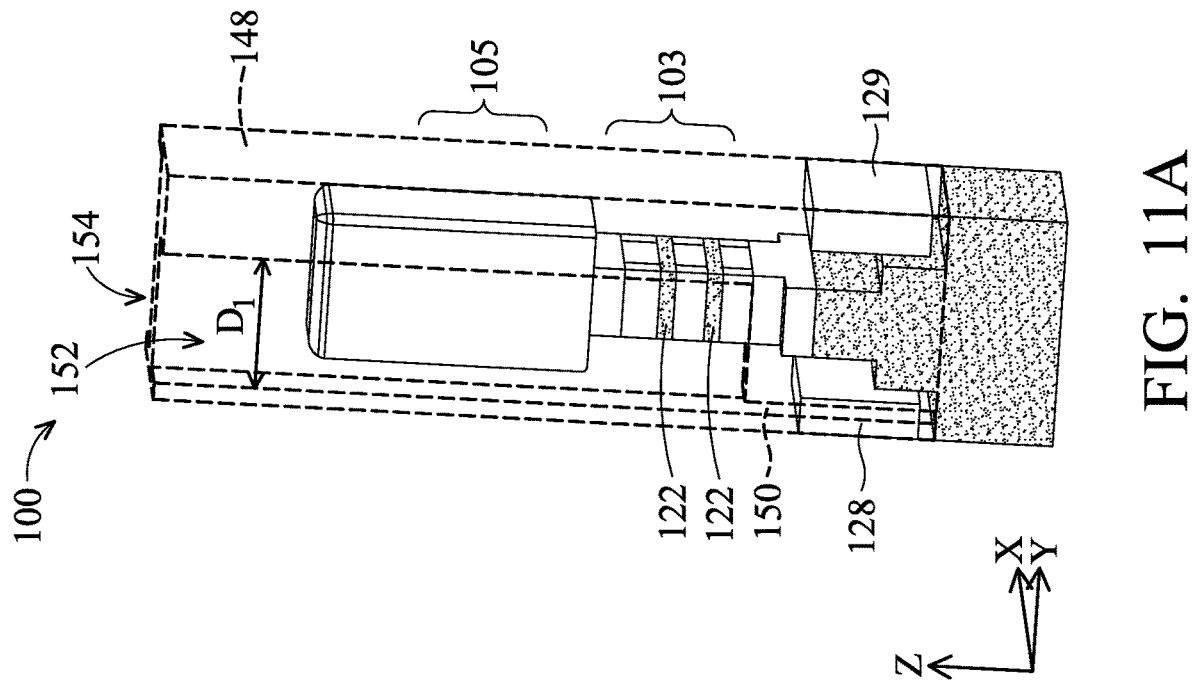

In FIGS. 11A and 11B, trenches 152 and 154 have been formed in the dielectric layer 148. A via 150 is also formed in the dielectric layer 148 exposing a portion of the top surface of the buried metal line 128. In practice, the via 150 may be formed in a first patterning process of the dielectric layer 148 in which the via 150 is formed from the top surface of the dielectric layer 148 to the top of the buried metal line 128. As used herein, the term "via" may be used to describe an opening formed in one or more layers or structures to expose a portion of a lower layer or structure. As used herein, the term "conductive via" may be used to refer to a conductive structure formed in the via.

The trenches 152 and 154 may be formed in the dielectric layer 148 in a patterning process after forming the via 150. The patterning process can include forming a hard mask layer over the dielectric layer 148 and etching the dielectric layer 148 in the presence of the patterned hard mask to form the trenches 152 and 154.

The trench 152 has a width dimension D1. The trench 154 has a width dimension D2. The width dimension D1 is less than the width dimension D2. The different widths of the trenches 152 and 154 are selected as part of the formation of source/drain regions for the lower transistor 103 having different dimensions from each other. Furthermore, the reduced width of the trench 152 is selected to result in the formation of an asymmetric source/drain region in conjunction with the exposed portions of the semiconductor nanostructures 122 in the trench 152. As will be set forth in more detail below, this can help ensure that a conductive via that extends from a source/drain region of the upper transistor 105 will not accidentally contact the source/drain region of the lower transistor 103. In some embodiments, the dimension D1 is between 12 nm and 25 nm. In some embodiments, the dimension D2 is between 20 nm and 35 nm. Other values can be used for the dimensions D1 and D2 without departing from the scope of the present disclosure.

In some embodiments, the trench 152 is positioned asymmetrically with respect to the semiconductor nanostructures 122 in the Y dimension. With reference particularly to the view of FIG. 11A, the right edge of the trench 152 is much closer to the right edge of the semiconductor nanostructures 122 than the degree of the left edge of the trench 152 is closer to the left edge of the semiconductor nanostructures 122. In some embodiments, the right edge of the trench 152 is aligned with the right edges of the semiconductor nanostructures 122. In some embodiments, the right edge of the trench 152 is slightly further to the right than the right edges of the semiconductor nanostructures 122. In some embodiments, the right edge of the trench 152 is slightly further to the left than the right edges of the semiconductor nanostructures 122. As will be set forth in more detail below, the asymmetric position of the trench 152 with respect to the semiconductor nanostructures 122 will result in constraining the growth of a source/drain region in the trench 152 in one direction from the semiconductor nanostructures 122, while the source/drain region is free to grow in the opposite direction. This will result in an asymmetric source/drain region in the trench 152.

With reference particularly to FIG. 11B, in one embodiment, the trench 154 is formed substantially symmetrically with respect to the semiconductor nanostructures 122 in the Y dimension. In particular, the left edges of the semiconductor nanostructures 122 may be substantially the same distance from the left edge of the trench 154 as the right edges of the semiconductor nanostructures 122 are from the right edge of the trench 154. This may result in the growth of the symmetric source/drain region from the semiconductor nanostructures 122 in the trench 154.

Figure 12B:
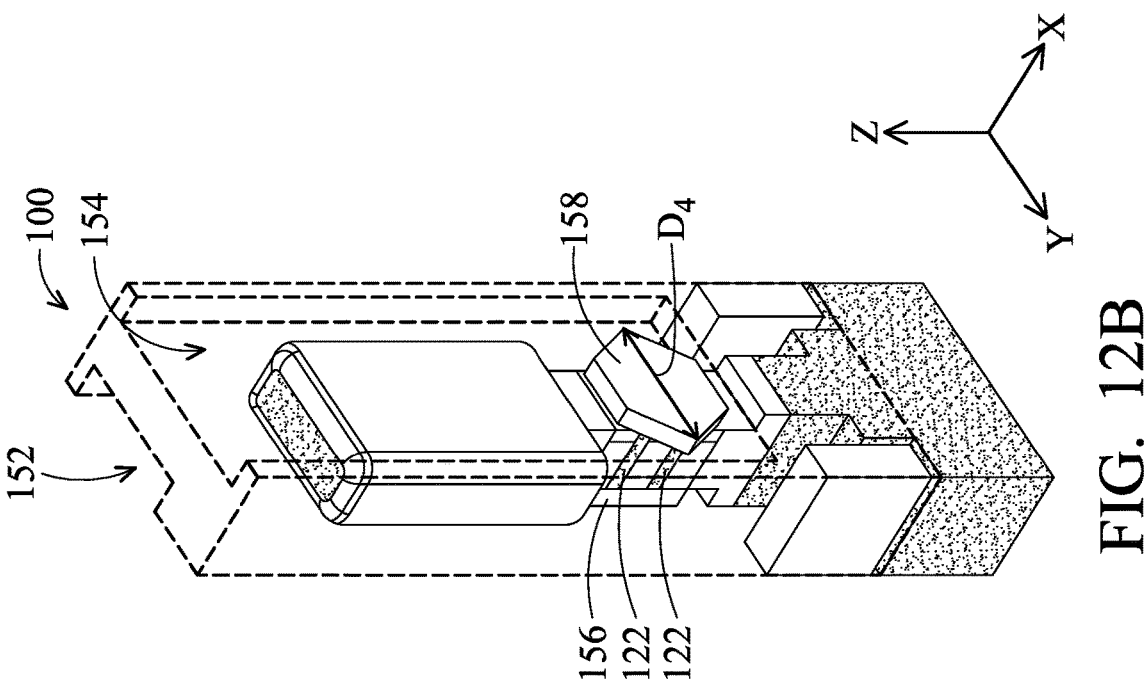
Figure 12A:
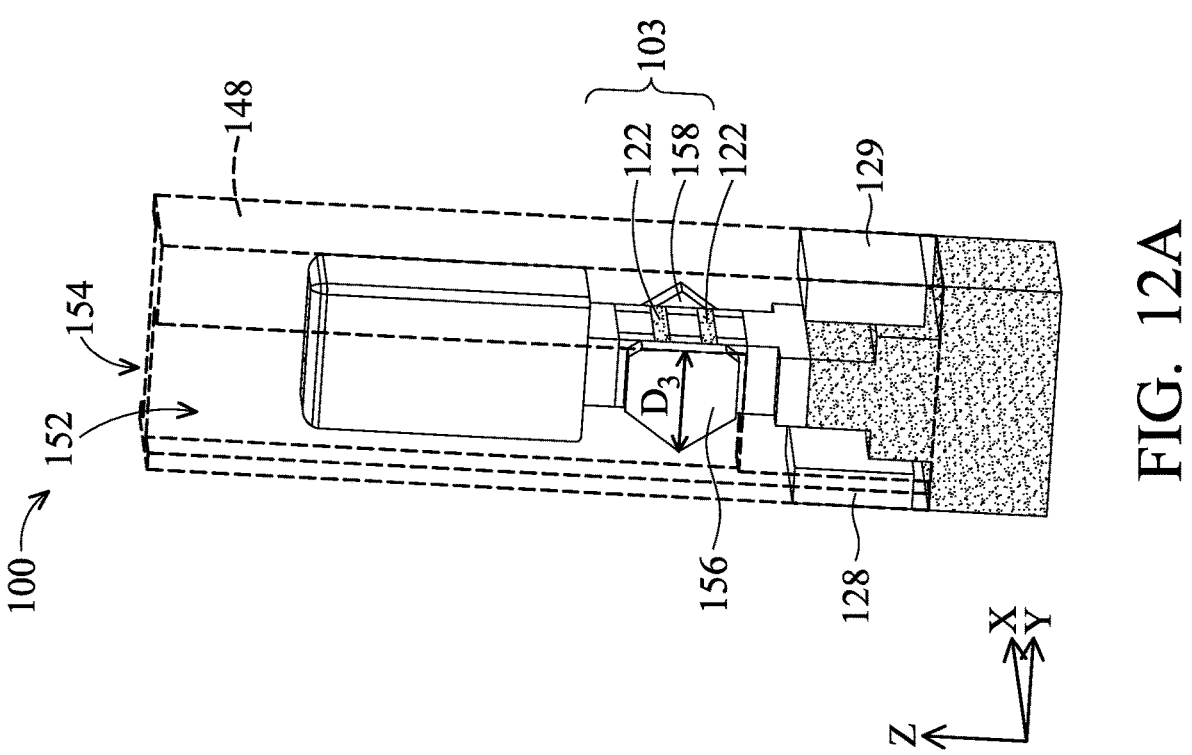

In FIGS. 12A and 12B, source/drain regions 156 and 158 have been formed, in accordance with some embodiments. The source/drain regions 156 and 158 may be formed in an epitaxial growth process on the semiconductor nanostructures 122. The source/drain regions 156 and 158 include a semiconductor material. The semiconductor material can include a same semiconductor material as the semiconductor nanostructures 122. Alternatively, the semiconductor material of the source/drain regions 156 and 158 can be different than the semiconductor material of the semiconductor nanostructures 122. The source/drain regions 156 and 158 may be doped in situ with dopant atoms during the epitaxial growth process. In the example in which the lower transistor 103 is a P-type transistor, the source/drain regions 156 and 158 may be doped in situ with P-type dopant atoms. The P-type dopant atoms can include boron or other P-type dopant atoms. In an example in which the lower transistor 103 is an N-type transistor, the source/drain regions 156 and 158 may be doped in situ with N-type dopant atoms. The N-type dopant atoms can include phosphorus, arsenic, or other N-type dopant atoms.

With particular reference to FIG. 12A, the source/drain region 156 is formed in the trench 152. The source/drain region 156 is asymmetric in the Y axis. In particular, the right edge of the source/drain region 156 abuts the right wall of the trench 152, substantially flush with the right edges of the semiconductor nanostructures 122. By contrast, the left half of the source/drain region 156 has a substantially diamond shape and extends to a point on the left side relatively far to the left of the left edges of the semiconductor nanostructures 122. Accordingly, the right edge of the source/drain region 156 is substantially flat, while the left edge of the source/drain region 156 has a substantially diamond shape.

Continuing with particular reference to FIG. 12A, one result of the asymmetric formation of the source/drain region 156 is that the right edge of the source/drain region 156 is relatively far in the Y direction from buried metal line 129. As will be set forth in more detail below, this can be beneficial in ensuring that source/drain region 156 does not hamper the formation of a conductive via extending through the dielectric layer 148 to the buried metal line 129.

With particular reference to FIG. 12B, the source/drain region 158 is formed in the trench 154. The source/drain region 158 is substantially symmetrical in the Y direction. The source/drain region 158 has a diamond shape on both the left and right sides. The left edge of the source/drain region 158 is substantially a same distance from a left edge of the trench 154 as a right edge of the source/drain region 158 is from a right edge of the trench 154. This is because the trench 154 is placed symmetrically with respect to the semiconductor nanostructures 122 and is wide enough such that the source/drain region 158 does not extend to contact either edge.

The source/drain region 156 has a width dimension D3. The source/drain region 158 has a width dimension D4. The width dimension D3 may be between 10 nm and 20 nm. The width dimension D4 may be between 15 nm and 30 nm. Other dimensions are possible for D3 and D4 without departing from the scope of the present disclosure.

Figure 13B:
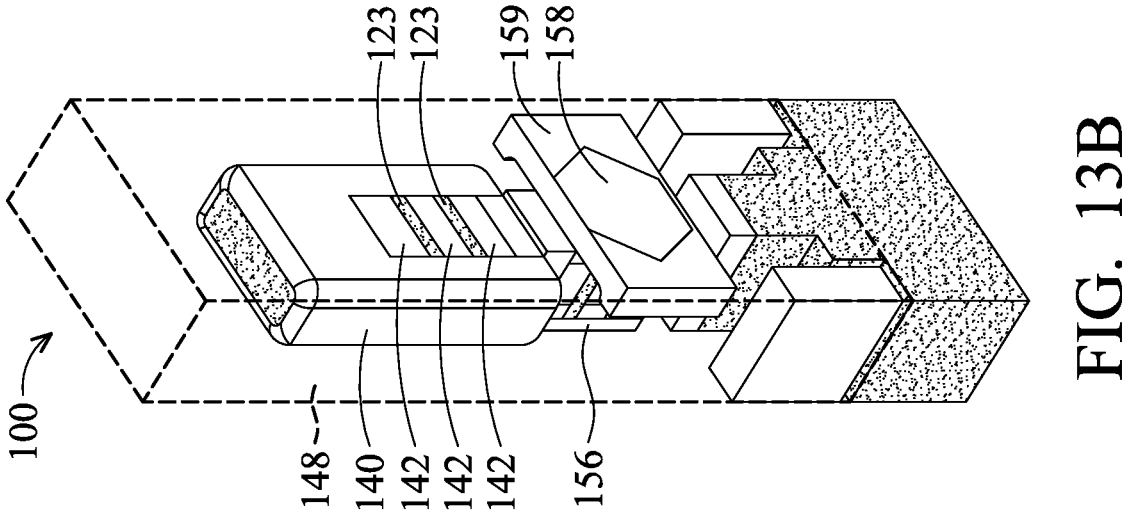
Figure 13A:
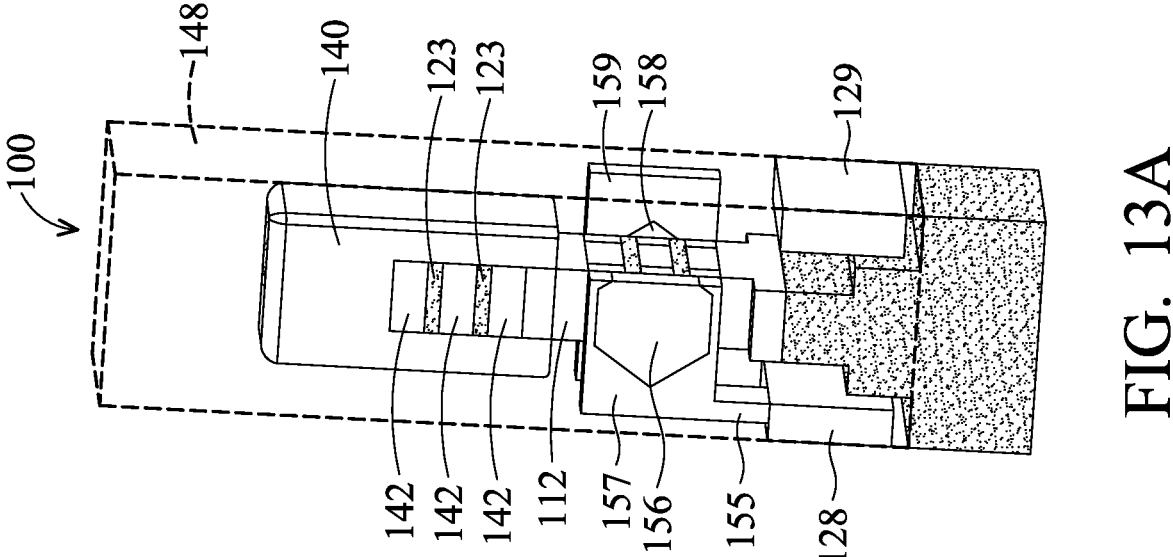

In FIGS. 13A and 13B, source/drain contacts 157 and 159 have been formed, in accordance with some embodiments. The source/drain contact 157 is formed in the trench 152 in contact with the source/drain region 156. A portion of the source/drain contact 157 may be considered a conductive via 155 positioned in the via 150 and contacting the top of the buried metal line 128. The source/drain contact 159 is formed in the trench 154 in contact with the source/drain region 158. Though not shown in FIGS. 13A and 13B, a silicide may be formed on the source/drain regions 156 and 158 prior to formation of the source/drain contacts 157 and 159.

The source/drain contacts 157 and 159 can be formed by depositing a conductive material. The conductive material can include one or more metals such as titanium, titanium nitride, tantalum, tantalum nitride, aluminum, copper, tungsten, gold, cobalt, ruthenium, or other suitable conductive materials. The source/drain contacts 157 and 159 can be deposited by PVD, CVD, ALD, or other suitable deposition processes.

In FIGS. 13A and 13B, a dielectric material has been deposited in the trenches 152 and 154, in accordance with some embodiments. The dielectric material may be the same material as the dielectric layer 148. The deposition of the dielectric material has the effect of refilling or rebuilding the dielectric layer 148. Accordingly, the dielectric layer 148 is shown as a single dielectric layer in FIGS. 13A and 13B.

Figure 14B:
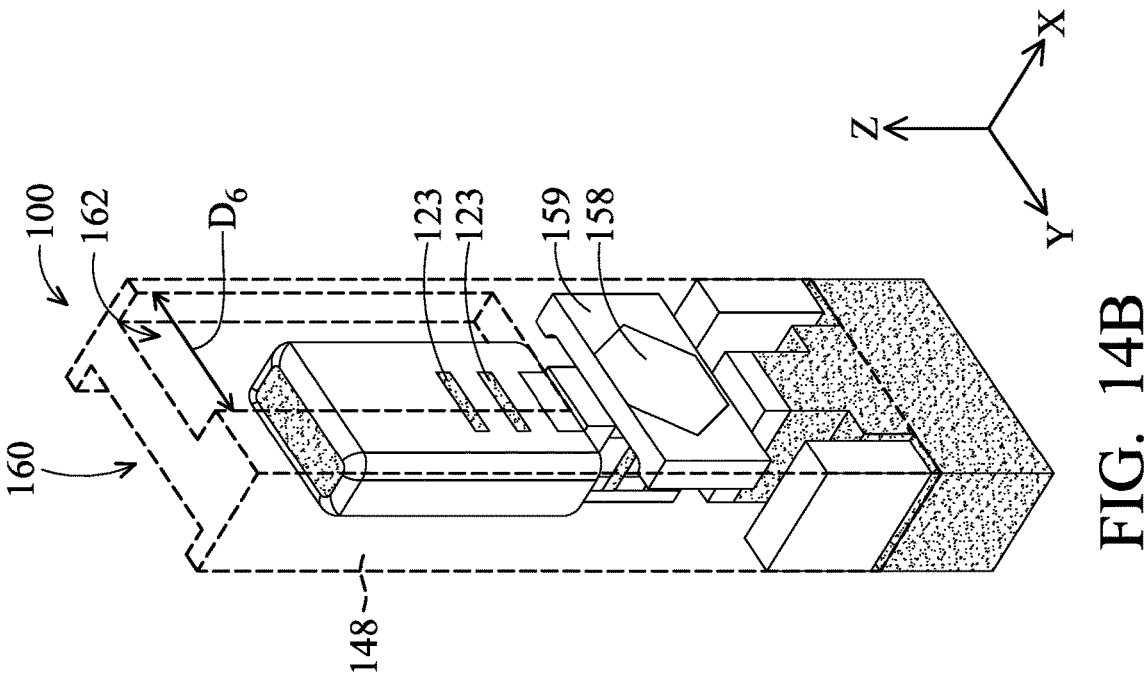
Figure 14A:
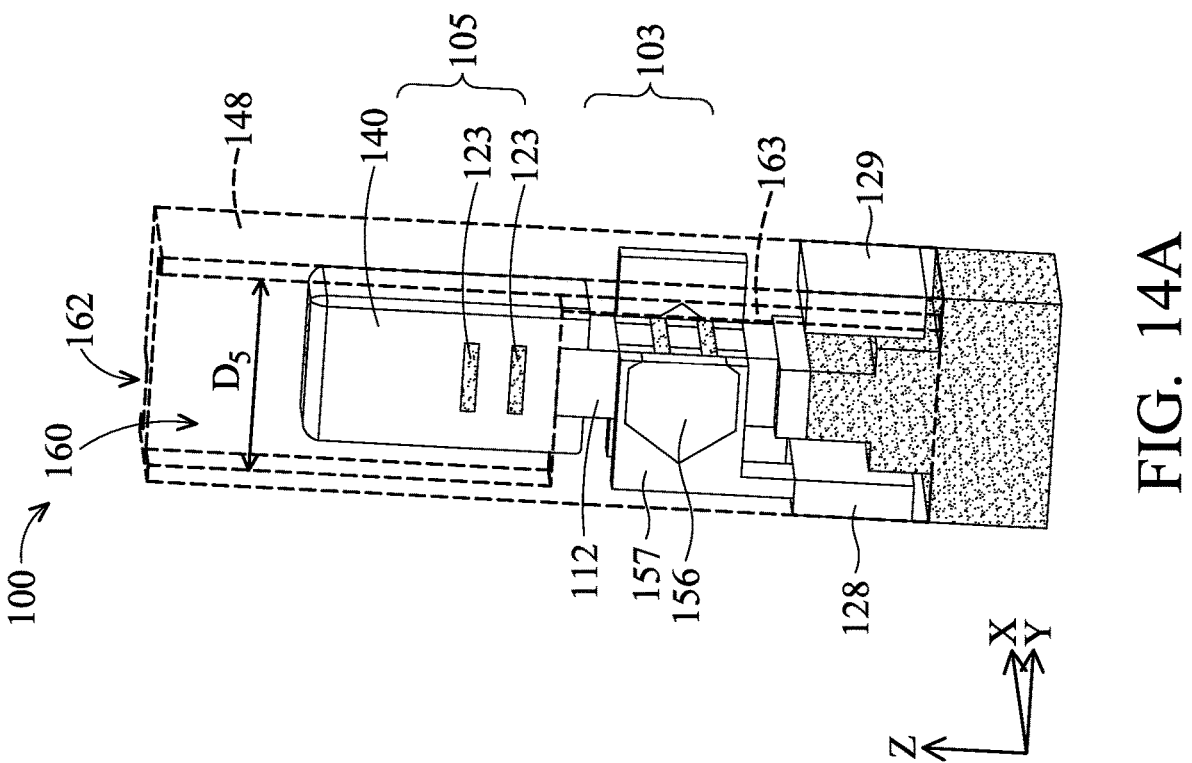

In FIGS. 14A and 14B, trenches 160 and 162 have been formed in the dielectric layer 148. A via 163 is also formed in the dielectric layer 148 exposing a portion of the top surface of the buried metal line 129. In practice, the via 163 may be formed in a first patterning process of the dielectric layer 148 in which the via 163 is formed from the top surface of the dielectric layer 148 to the top of the buried metal line 129.

The trenches 160 and 162 may be formed in the dielectric layer 148 in a patterning process after forming the via 163. The patterning process can include patterning a hard mask layer over the dielectric layer 148 and etching the dielectric layer 148 in the presence of the patterned hard mask to form the trenches 160 and 162. The trenches 160 and 162 are formed to a depth below the lowest semiconductor nanostructure 123, and above the source/drain regions 156 and 158. In some embodiments, the bottom of the trenches 160 and 162 is substantially even with a top of the spacing layer 112.

The trench 160 has a width dimension D5. The trench 162 has a width dimension D6. The width dimension D6 is less than the width dimension D5. The different widths of the trenches 160 and 162 are selected as part of the formation of source/drain regions for the upper transistor 105 having different dimensions from each other. Furthermore, the reduced width of the trench 162 is selected to result in the formation of an asymmetric source/drain region in conjunction with the exposed portions of the semiconductor nanostructures 123 in the trench 162. As will be set forth in more detail below, this can help ensure that a conductive via that extends from a metal line above the upper transistor 105 to the lower transistor 103 will not unintentionally contact the source/drain region of the upper transistor 105. In some embodiments, the dimension D6 is between 12 nm and 25 nm. In some embodiments, the dimension D5 is between 20 nm and 35 nm. Other values can be used for the dimensions D6 and D5 without departing from the scope of the present disclosure.

In some embodiments, the trench 162 is positioned asymmetrically with respect to the semiconductor nanostructures 123 in the Y dimension. With reference particularly to the view of FIG. 14B, the left edge of the trench 162 is much closer to the left edge of the semiconductor nanostructures 123 than the degree of the right edge of the trench 162 is closer to the right edge of the semiconductor nanostructures 123. In some embodiments, the left edge of the trench 162 is aligned with the left edges of the semiconductor nanostructures 123. In some embodiments, the left edge of the trench 162 is slightly further to the left than the left edges of the semiconductor nanostructures 123. In some embodiments, the left edge of the trench 162 is slightly further to the right than the left edges of the semiconductor nanostructures 123. As will be set forth in more detail below, the asymmetric position of the trench 162 with respect to the semiconductor nanostructures 123 will result in constraining the growth of a source/drain region in the trench 162 in one direction from the semiconductor nanostructures 123, while the source/drain region is free to grow in the opposite direction. This will result in an asymmetric source/drain region in the trench 162.

With reference particularly to FIG. 14A, in one embodiment, the trench 160 is formed substantially symmetrically with respect to the semiconductor nanostructures 123 in the Y dimension. In particularly, the right edges of the semiconductor nanostructures 123 may be substantially the same distance from the right edge of the trench 160 as the left edges of the semiconductor nanostructures 123 are from the left edge of the trench 160. This may result in the growth of the symmetric source/drain region from the semiconductor nanostructures 123 in the trench 160.

Figure 15B:
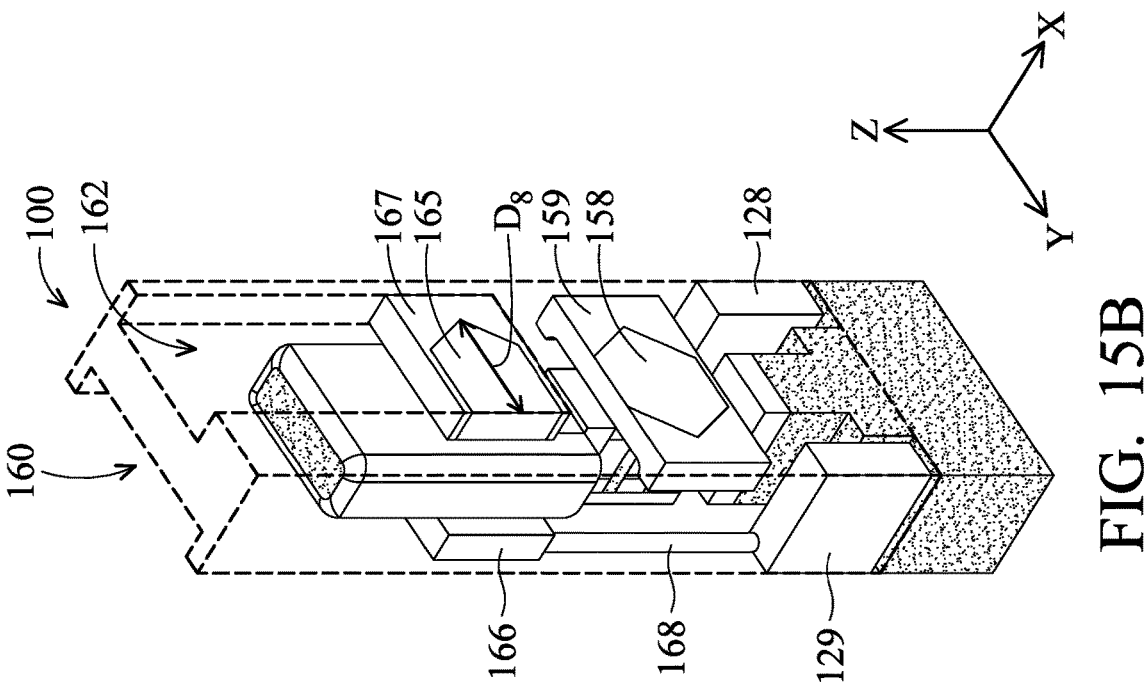
Figure 15A:
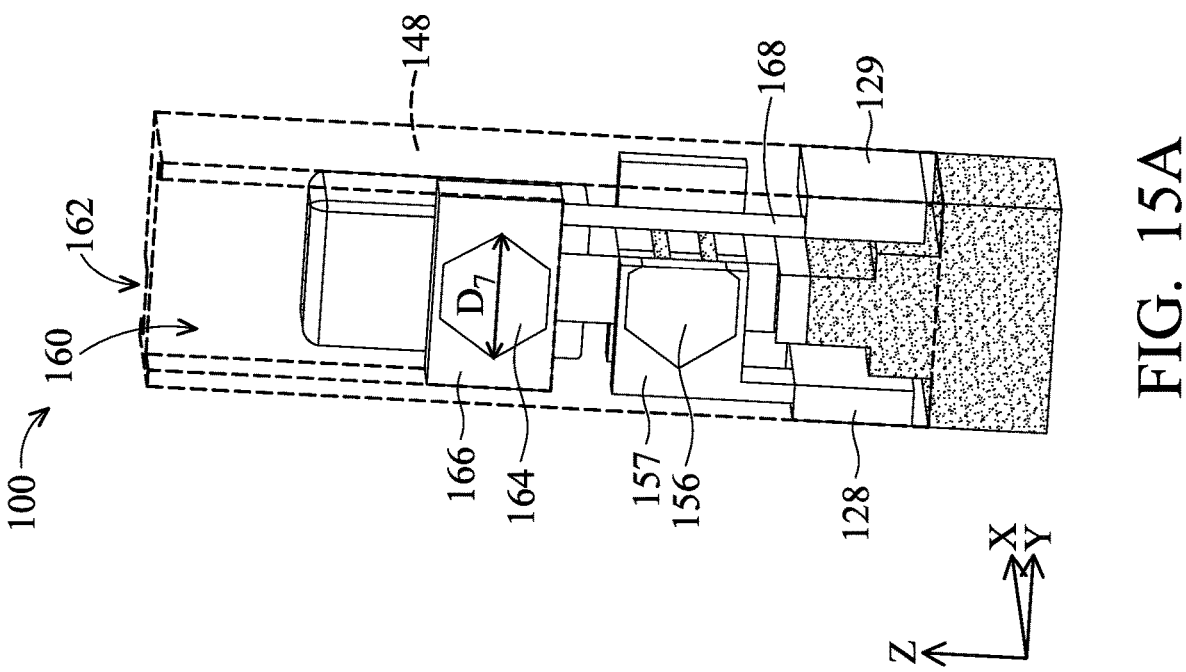

In FIGS. 15A and 15B, source/drain regions 164 and 165 have been formed, in accordance with some embodiments. The source/drain regions 164 and 165 may be formed in an epitaxial growth process from the semiconductor nanostructures 123. The source/drain regions 164 and 165 include a semiconductor material. The semiconductor material can include a same semiconductor material as the semiconductor nanostructures 123. Alternatively, the semiconductor material of the source/drain regions 164 and 165 can be different than the semiconductor material of the semiconductor nanostructures 123. The source/drain regions 164 and 165 may be doped in situ with dopant atoms during the epitaxial growth process. In the example in which the upper transistor 105 is a P-type transistor, the source/drain regions 164 and 165 may be doped in situ with P-type dopant atoms. The P-type dopant atoms can include boron or other P-type dopant atoms. In an example in which the upper transistor 105 is an N-type transistor, the source/drain regions 164 and 165 may be doped in situ with N-type dopant atoms. The N-type dopant atoms can include phosphorus, arsenic, or other N-type dopant atoms.

With particular reference to FIG. 15B, the source/drain region 165 is formed in the trench 162. The source/drain region 165 is asymmetric in the Y axis. In particular, the left edge of the source/drain region 165 abuts the left wall of the trench 162, substantially flush with the left edges of the semiconductor nanostructures 123. By contrast, the right half of the source/drain region 165 has a substantially diamond shape and comes to a point on the right side relatively far to the right of the right edges of the semiconductor nanostructures 123. Accordingly, the left edge of the source/drain region 165 is substantially flat, while the right edge of the source/drain region 165 has a substantially diamond shape.

Continuing with particular reference to FIG. 15B, one result of the asymmetric formation of the source/drain region 165 is that the left edge of the source/drain region 165 is relatively far in the Y direction from the left edge of source/drain region 158. As will be set forth in more detail below, this can be beneficial in ensuring isolation to a conductive via extending from above upper transistor 105 to lower transistor 103.

With particular reference to FIG. 15A, the source/drain region 164 is formed in the trench 160. The source/drain region 164 is substantially symmetrical in the Y direction. The source/drain region 164 has a diamond shape on both the right and left sides. The right edge of the source/drain region 164 is substantially a same distance from a right edge of the trench 160 as a left edge of the source/drain region 164 is from a left edge of the trench 160. This is because the trench 160 is placed symmetrically with respect to the semiconductor nanostructures 123 and is wide enough such that the source/drain region 164 does not grow to contact either edge.

The source/drain region 165 has a width dimension D8. The source/drain region 164 has a width dimension D7. The width dimension D8 may be between 10 nm and 20 nm. The width dimension D7 may be between 15 nm and 30 nm. Other dimensions are possible for D8 and D7 without departing from the scope of the present disclosure.

In FIGS. 15A and 15B, source/drain contacts 166 and 167 have been formed, in accordance with some embodiments. The source/drain contact 166 is formed in the trench 160 in contact with the source/drain region 164. A portion of the source/drain contact 166 may be considered a conductive via 168 positioned in the via 163 and contacting the top of the buried metal line 129. The source/drain contact 167 is formed in the trench 162 in contact with the source/drain region 165. Though not shown in FIGS. 15A and 15B, a silicide may be formed on the source/drain regions 164 and 165 prior to formation of the source/drain contacts 166 and 167.

The source/drain contacts 166 and 167 can be formed by depositing a conductive material. The conductive material can include one or more metals such as titanium, titanium nitride, tantalum, tantalum nitride, aluminum, copper, tungsten, gold, cobalt, ruthenium, or other suitable conductive materials. The source/drain contacts 166 and 167 can be deposited by PVD, CVD, ALD, or other suitable deposition processes.

Though not shown in FIGS. 15A and 15B, after formation of the source/drain contacts 166 and 167, a dielectric material may be deposited. The dielectric material may substantially rebuild the dielectric layer 148. Accordingly, the dielectric material can include the same material as the dielectric layer 148.

Figure 16A:
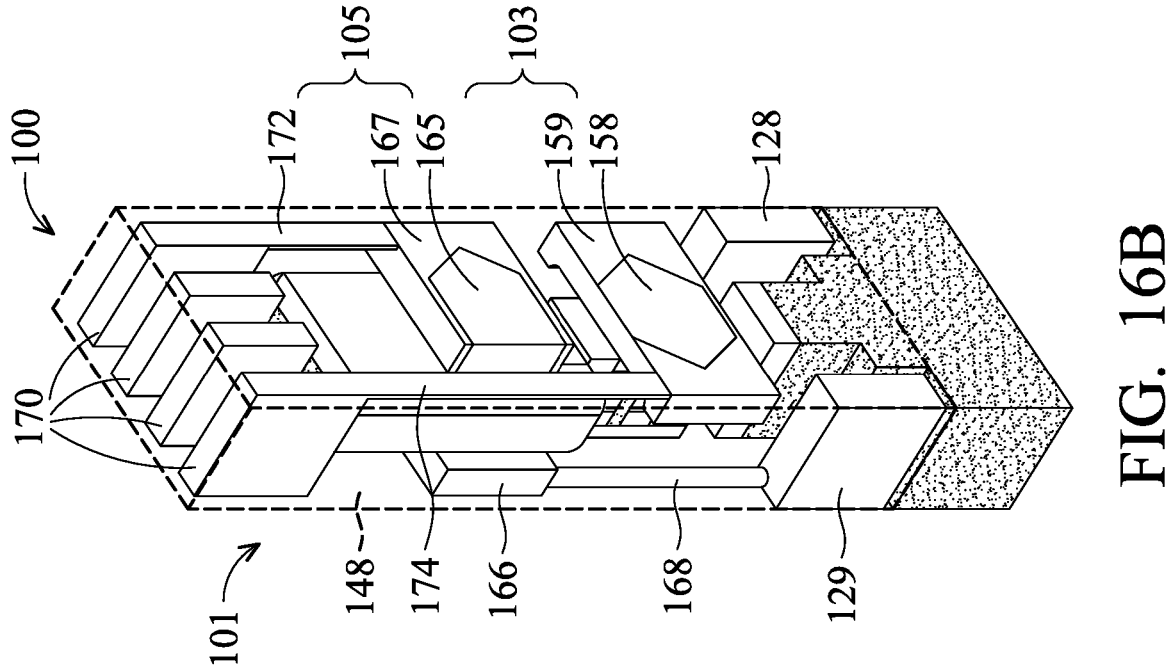
FIG. 16C is a top view of an integrated circuit, in accordance with some embodiments.
Figure 16B:
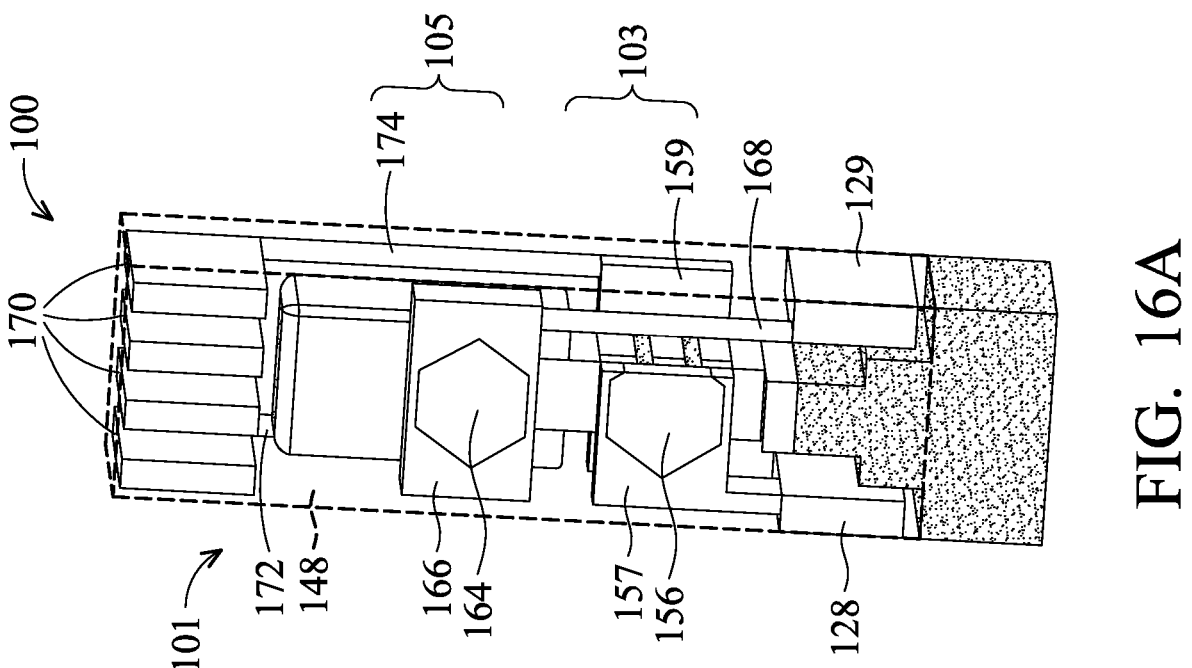

In FIGS. 16A and 16B, signal lines 170 and conductive vias 172 and 174 have been formed, in accordance with some embodiments. Prior to formation of the signal lines 170 and the conductive vias 172 and 174, vias may be formed in the dielectric layer 148 for the conductive vias 172 and 174. After formation of the vias, trenches can be formed in the dielectric layer 148 for the signal lines 170. After formation of the vias and trenches in the dielectric layer 148, the conductive vias 172 and 174 can be formed by depositing one or more conductive materials in the vias using deposition processes and conductive materials as described previously. After formation of the conductive vias 172 and 174, the signal lines 170 can be formed by depositing one or more conductive materials the trenches formed in the dielectric layer 148, using deposition processes and conductive materials as described previously.

The conductive via 172 contacts the source/drain contact 167, thereby providing an electrical connection between the source/drain region 165 and one of the signal lines 170. The conductive via 174 contacts the source/drain contacts 159, thereby providing electrical contact between the source/drain region 158 and one of the signal lines 170.

Because of the asymmetric structure of the source/drain region 165, the conductive via 174 can extend downward pass the source/drain region 165 without the risk of unintentionally contacting the source/drain region 165. Likewise, due to the asymmetric structure of the source/drain region 156, the conductive via 168 can extend downward pass the source/drain region 157 to contact the buried metal line 129.

Though not shown in FIGS. 1A-16B, in practice, the gate electrode will be formed by removing the gate layer 136 and the sacrificial nanostructures 124 and 125. One or more gate dielectric layers can then be deposited on exposed surfaces of the semiconductor nanostructures 122 and 123. Conductive materials can then be deposited in place of the sacrificial nanostructures 124 and 125 and the gate layer 136. The conductive materials surround the semiconductor nanostructures 122 and 123 and are separated from the semiconductor nanostructures 122 and 123 by the gate dielectric materials. The inner spacers 142 and 146 electrically isolate the source/drain regions 156, 157, 164, and 165 from the conductive materials of the gate electrodes. The upper and lower transistors 105 and 103 can operate by applying voltages to the gate electrodes and the source/drain regions in order to enable or prevent current flowing through the semiconductor nanostructures 122 and 123.

Current flows through the semiconductor nanostructures 122 between the source/drain region 156 and the source/drain region 158 in the X direction. Accordingly, the semiconductor nanostructures 122 are channel regions of the lower transistor 103. Current flows to the semiconductor nanostructures 123 between the source/drain regions 164 and 165 in the X direction. Accordingly, the semiconductor nanostructures 123 are channel regions of the upper transistor 105. The transistors 103 and 105 collectively make up the CFET 101.

Figure 16C:
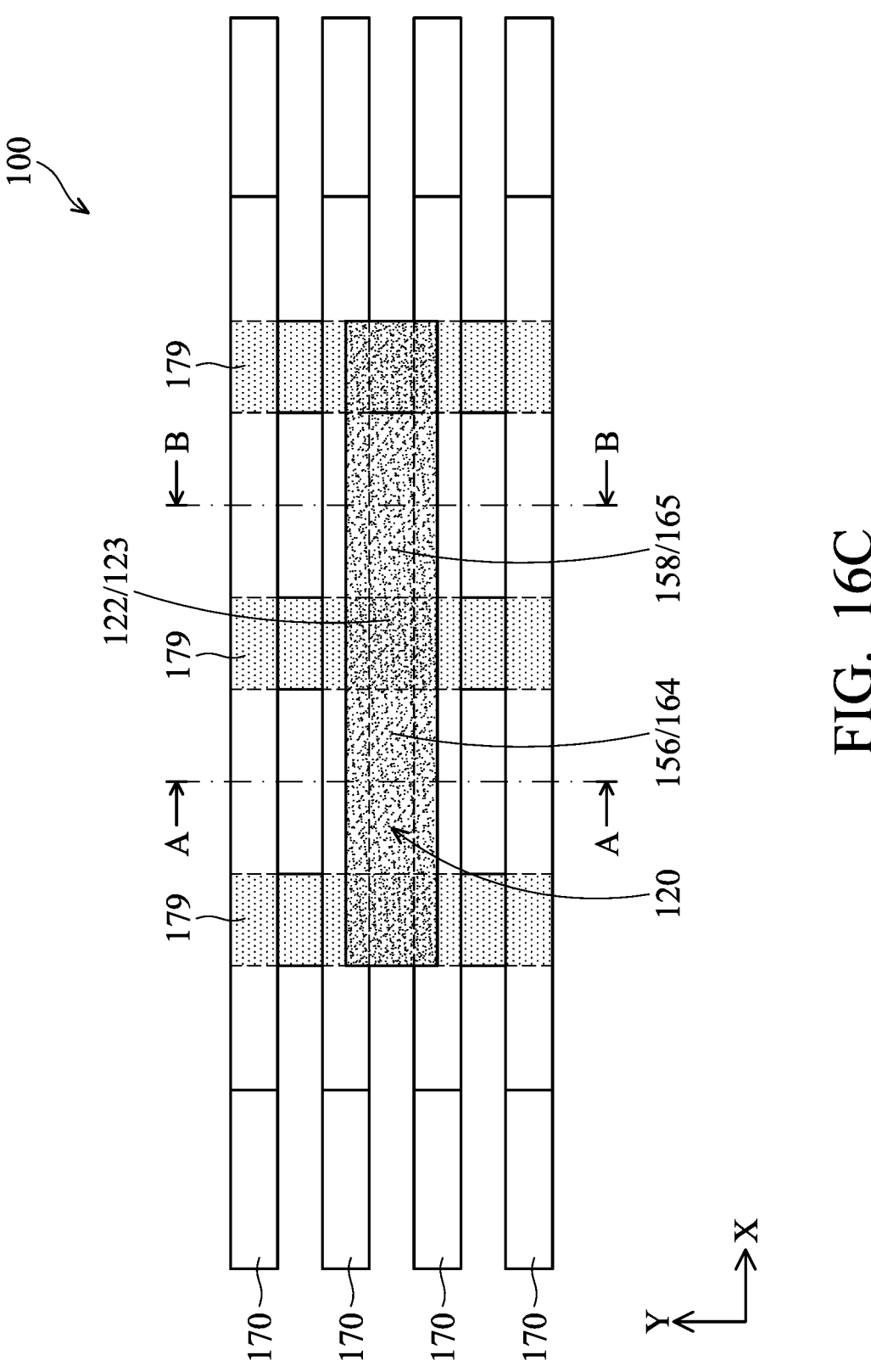

FIG. 16C is a simplified top view of the integrated circuit 100, according to one embodiment. The top view illustrates a fin 120 extending in the X direction. A plurality of gate structures 179 extends in the Y direction perpendicular to the fin 120. The fin 120 corresponds to the fin 120 associated with the CFET 101. The central gate structure 179 corresponds to a gate structure 179 associated with the CFET 101. The source/drain regions 156 and 164 are positioned to the left of the gate structure 179. The cut lines A indicate the cut lines along which each figure with a suffix "A" are taken. The source/drain regions 158 and 165 are positioned to the right of the gate structure 179. The cut lines B indicate the cut lines along which each figure with a suffix "B" are taken. Because FIG. 16C is a simplified top view, the relative vertical positions of the various structures are not shown.

Various other configurations of a CFET 101 can be utilized without departing from the scope of the present disclosure.

FIGS. 17A-28B are perspective views of an integrated circuit 100 at various stages of processing, in accordance with some embodiments. In particular, FIGS. 17A-28B illustrate a process for forming a CFET 101 including a first transistor 194 and a second transistor 196 stacked above the first transistor. As will be set forth in more detail below, the CFET 101 utilizes one or more asymmetric source/drain regions to help facilitate reduced risk of unwanted contact between the asymmetric source/drain region and a nearby conductive structure.

The CFET transistor 101 may correspond to FinFET transistors. Whereas the transistors 103 and 105 of 1A-16B each include multiple stacked channels and may be gate all around transistors, the transistors 196 and 194 may be FinFET transistors. The process for forming the FinFET transistors 196 and 194 has many similarities to the process for forming the transistors 103 and 105. Structures in 17A-28B may use the same reference numbers as common or similar structures in FIGS. 1A-16B.

Figure 17B:
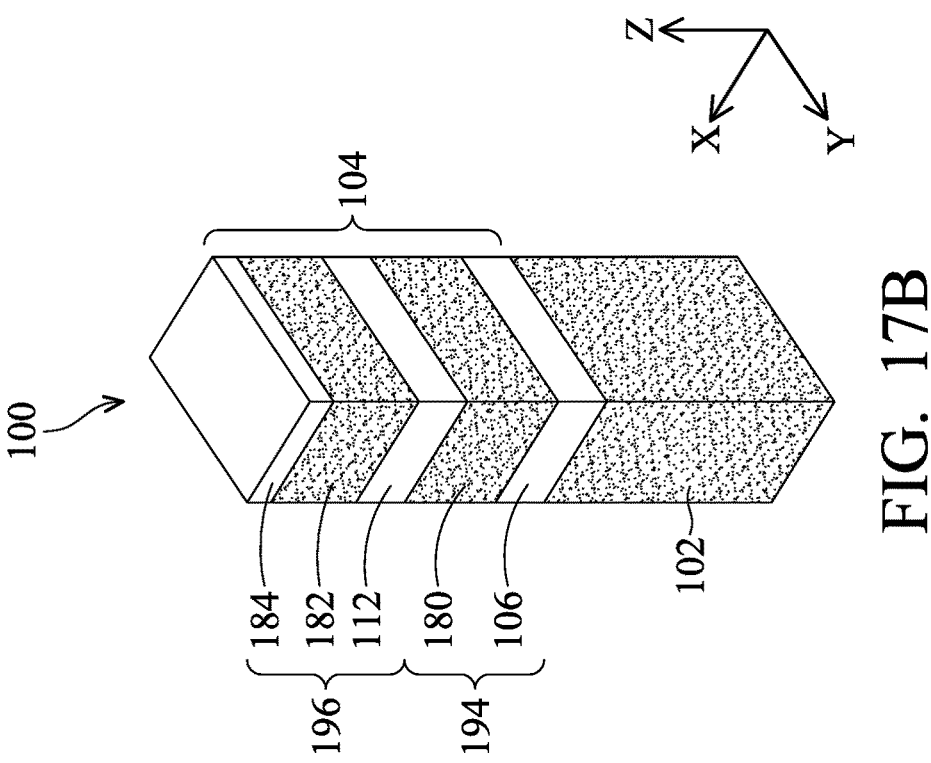
FIGS. 17A-28B are perspective views of an integrated circuit at intermediate stages of a process for forming a FinFET CFET, in accordance with some embodiments.
Figure 17A:
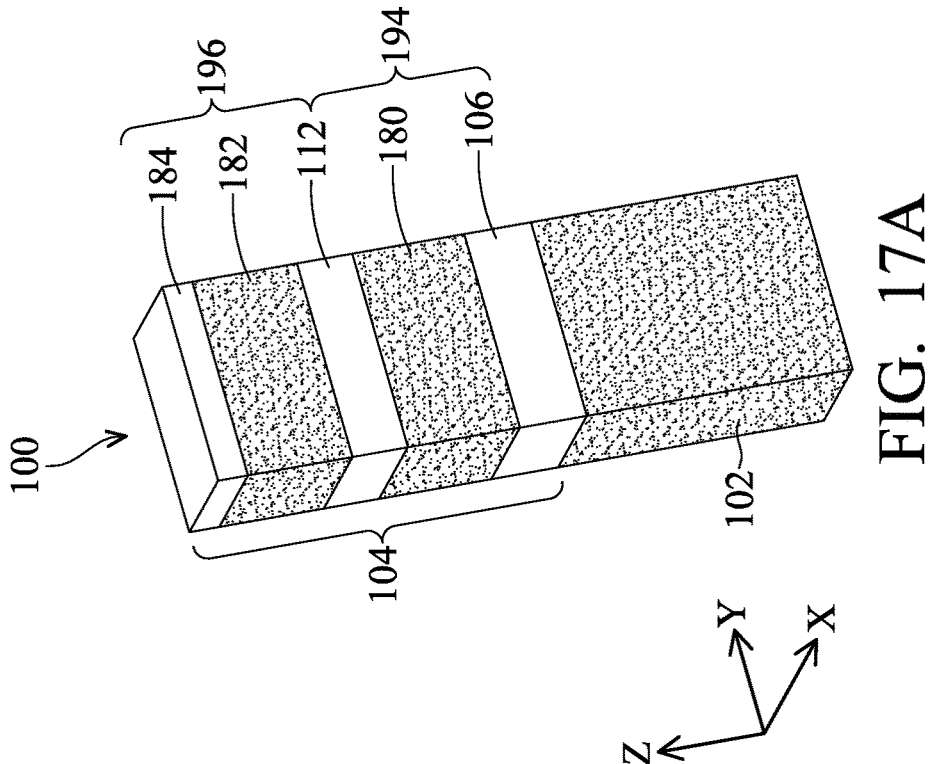

FIG. 17A illustrates a perspective view of an integrated circuit 100 and a set of X, Y, and Z axes. FIG. 17B illustrates a different perspective view of the same integrated circuit 100 and the corresponding orientation of the X, Y, and Z axes. In FIGS. 17A-28B, each figure with a suffix "A" (i.e., FIGS. 18A, 19A, etc.) has the same the orientation relative to the axes shown in FIG. 17A. In FIGS. 17A-28B, each figure with a suffix B (i.e., FIGS. 18B, 19B, etc.) has the same the orientation relative to the axes shown in FIG. 17B. In general, the X, Y, and Z axes may be shown in figures in which the axes are discussed and may not be shown in figures in which the axes are not discussed. The orientation of the axes can be obtained by reference back to FIGS. 17A and 17B.

In FIGS. 17A and 17B, the integrated circuit 100 includes a semiconductor substrate 102. The substrate 102 can include a semiconductor layer or combinations of semiconductor layers as described in relation to FIGS. 1A and 1B. The integrated circuit also includes a stack 104 formed over the substrate 102, in accordance with some embodiments. The stack 104 can be formed by performing a series of epitaxial growth processes from the substrate 102 to form the layers of the stack 104. Alternatively, the stack 104 can be formed by one or more atomic layer deposition (ALD) processes or one or more chemical vapor deposition (CVD) processes. The layers of the stack 104 may be formed by a combination of epitaxial growth processes, ALD processes, and CVD processes.

The stack 104 includes a spacing layer 106, a first semiconductor layer 180, a spacing layer 112 on the first semiconductor layer 180, a second semiconductor layer 182 on the spacing layer 112, and a sacrificial layer 184 on the semiconductor layer 182. The spacing layers 106 and 112 may have the same materials as described in relation to FIGS. 2A and 2B. The semiconductor layer 180 will eventually be patterned to form a channel region of the transistor 194. The semiconductor layer 182 will eventually be patterned to form a channel region of the transistor 196. The semiconductor layers 180 and 182 may have the same types of semiconductor materials as the semiconductor layers 108 and 114 of FIGS. 2A and 2B. The sacrificial layer 184 can include a same material as the sacrificial layers 116 of FIGS. 2A and 2B.

Figure 18B:
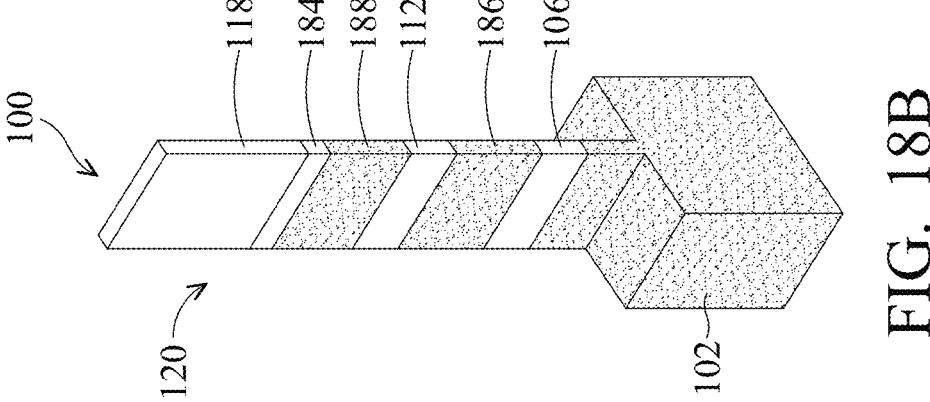
Figure 18A:
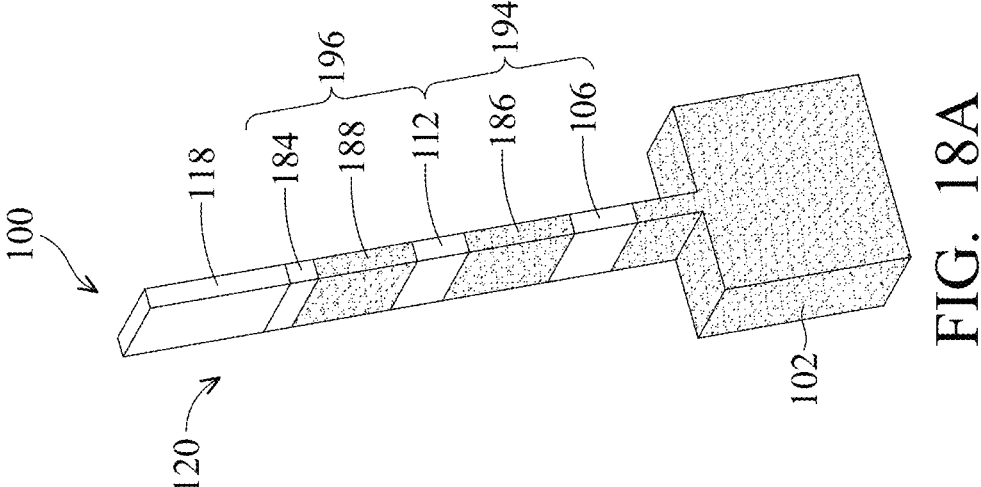

In FIGS. 18A and 18B, a hard mask layer 118 has been formed over the stack 104. In one example, the hard mask layer 118 can include silicon nitride. Alternatively, the hard mask layer 118 can include one or more of silicon oxide, silicon oxynitride, silicon carbonitride, silicon oxycarbonitride, FSG, a low-K dielectric material or other dielectric materials. The hard mask layer 118 has been patterned with a photolithography process.

One or more etching processes have been performed in the presence of the hard mask 118 to etch the layers of the stack 104 in accordance with the pattern of the hard mask layer 118. The one or more etching processes can include one or more anisotropic etching processes that selectively etch in the vertical direction such that only those portions of the stack 104 directly below the hard mask layer 118 remain after the one or more etching processes. The one or more etching processes can include a dry etch, a wet etch, or other types of etching processes. The etching processes may be timed such that a portion of the substrate 102 is recessed by the one or more etching processes.

The one or more etching processes form a fin 120 from the stack 104. Though not apparent in the view of FIGS. 18A and 18B, the fin 120 may extend in the X direction. The channel regions and source/drain regions of a plurality of CFETs may be formed from the fin 120, though the formation of only a single CFET 101 will be shown.

The fin 120 includes a semiconductor layer 186 formed from the semiconductor layer 180 and corresponding to a channel region of the transistor 194. The fin 120 includes a semiconductor layer 188 formed from the semiconductor layer 182 and corresponding to a channel region of the transistor 196.

Figure 19B:
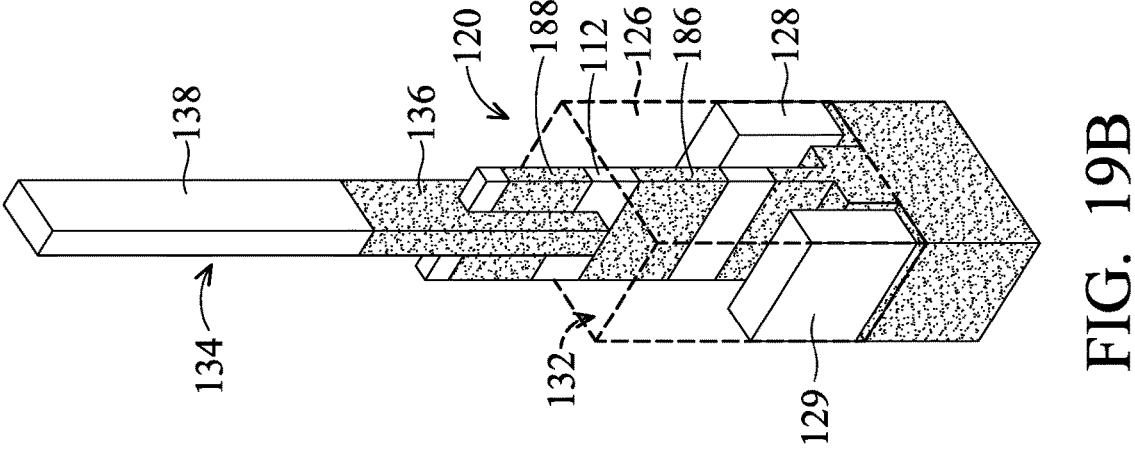
Figure 19A:
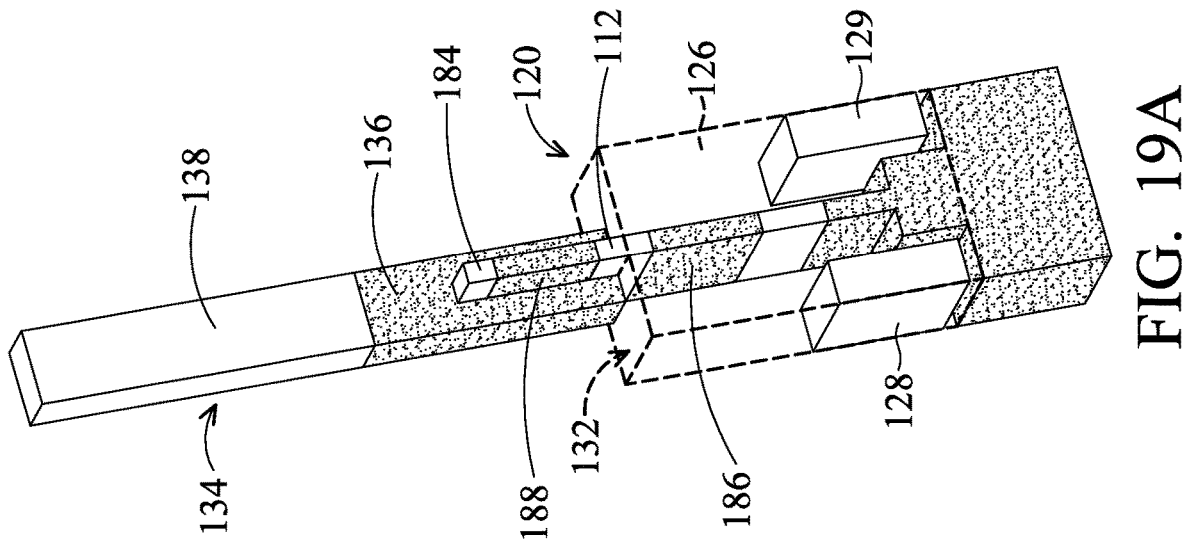

In FIGS. 19A and 19B, processes have been performed similar to those described in relation to FIGS. 4A-5B. In particular, the semiconductor substrate 102 has been further recessed in preparation for forming buried metal lines 128 and 129. The initial portion of the dielectric layer 126 has been formed and patterned. After deposition of the initial portion of the dielectric layer 126, the buried metal lines 128 and 129 are formed. Subsequent portions of the dielectric layer 126 have been deposited. The dielectric layer 126 has been recessed such that the top surface 132 of the dielectric layer 126 is intermediate to the spacing layer 112. In particular, a first portion of the spacing layer 112 is below the top surface 132 of the dielectric layer 126.

After recessing of the dielectric layer 126, a dummy gate structure 134 has been formed on the exposed portion of the fin 120 and on the top surface 132 of the dielectric layer 126. The dummy gate structure 134 includes a gate layer 136 and the hard mask layer 138. The dummy gate structure 134 may extend in the Y direction. The dummy gate structure 134 is referred to as a dummy gate structure because the gate electrodes of the transistor 103 and 105 will be formed, in part, in place of the gate layer 136.

The dummy gate structure 134 may also include one or more additional dielectric layers above the gate layer 136. Various configurations and materials can be utilized for the dummy gate structure 134 without departing from the scope of the present disclosure.

Figure 20B:
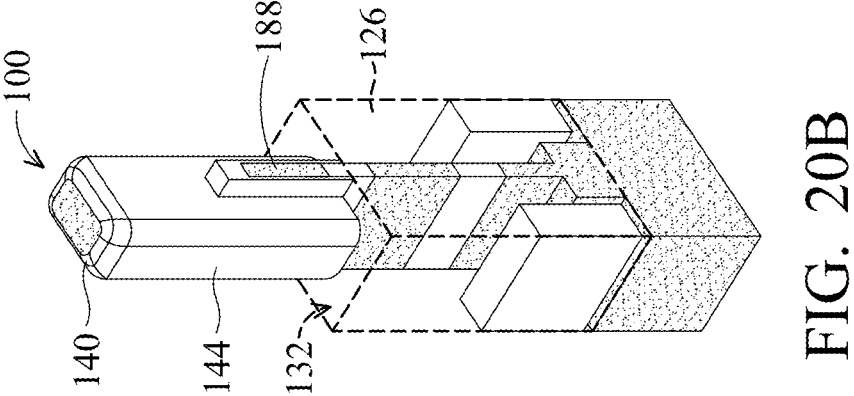
Figure 20A:
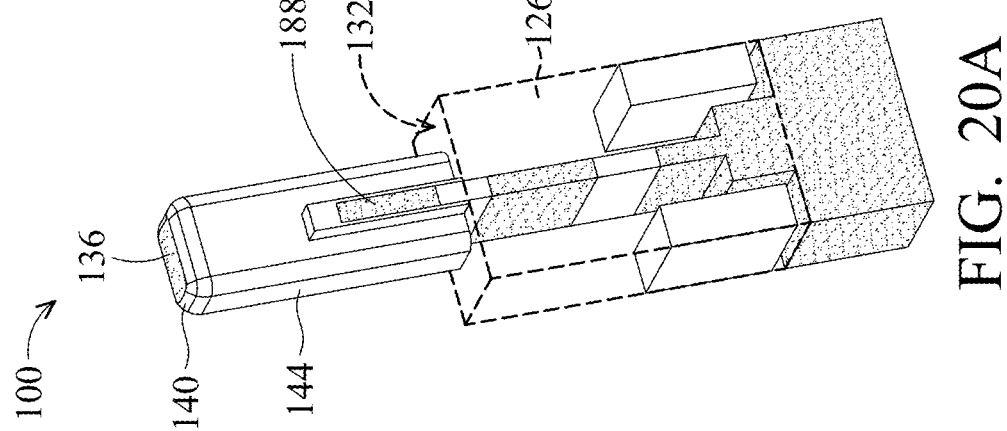

In FIGS. 20A and 20B, processes have been performed similar to some of those described in relation to FIGS. 7A-8B, aside from the further trimming of the upper portion of the fin 120 and the formation of the inner spacers 142. The hard mask layer 138 has been removed from the dummy gate structure 134. A gate spacer layer 140 has been formed on sidewalls of the gate layer 136. The dielectric layer 144 has been formed on the gate spacer layer 140, and on the sidewalls of the semiconductor layer 188.

Figure 21B:
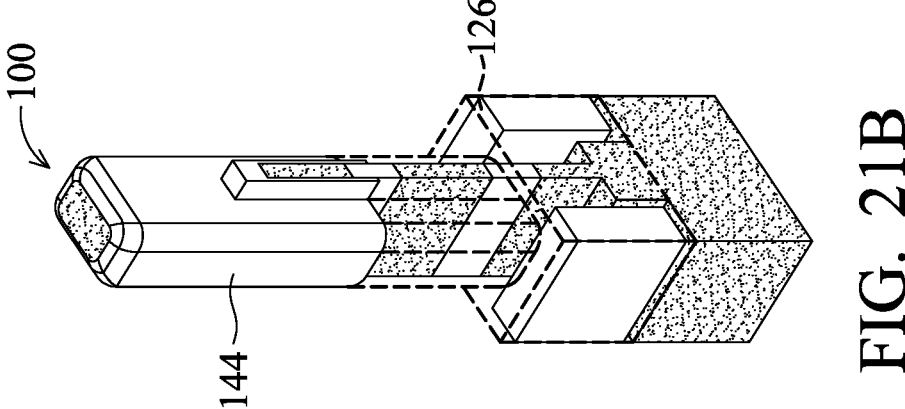
Figure 21A:
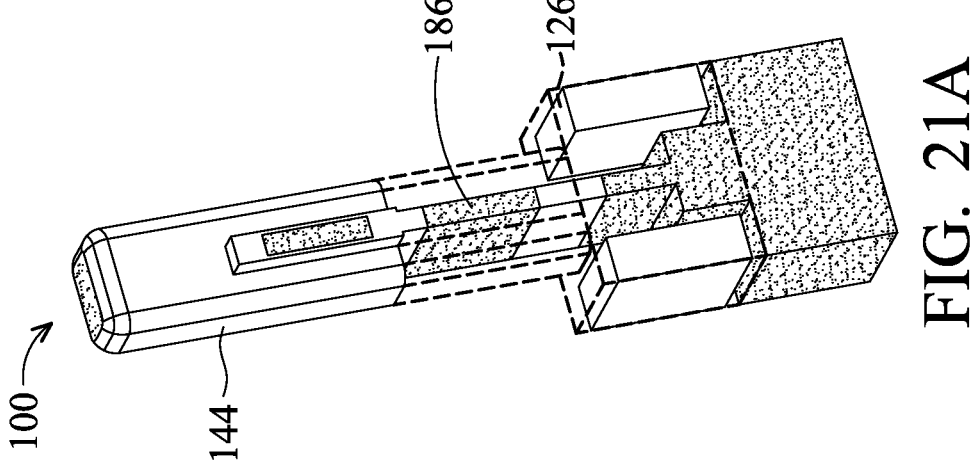

In FIGS. 21A and 21B, processes have been performed similar to those described in relation to FIGS. 9A and 9B. In particular, an etching process has been performed to recess the portions of the dielectric layer 126 that are not directly below the dielectric layer 144 and the other layers of the dummy gate structure 134. The result is that the exposed top surface 132 of the dielectric layer 126 is intermediate to the spacing layer 106.

Figure 22B:
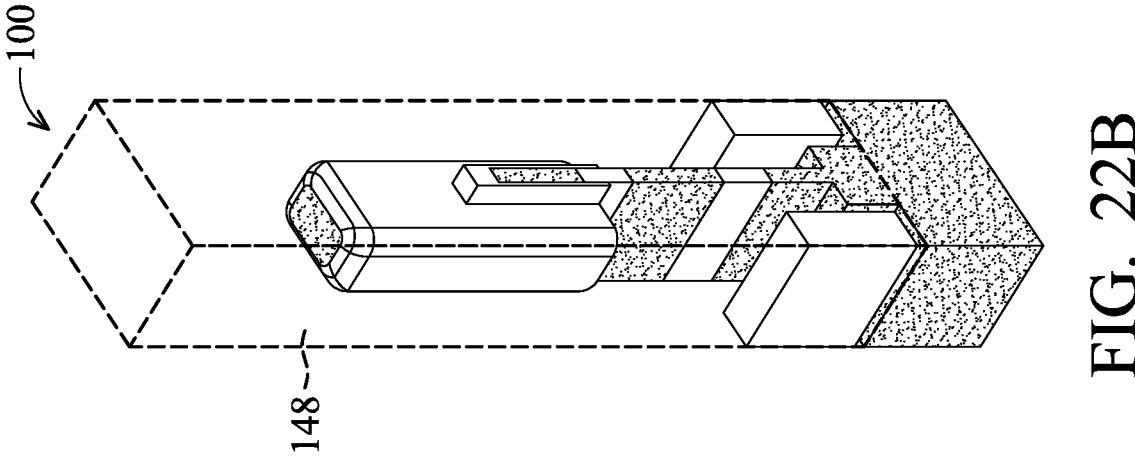
Figure 22A:
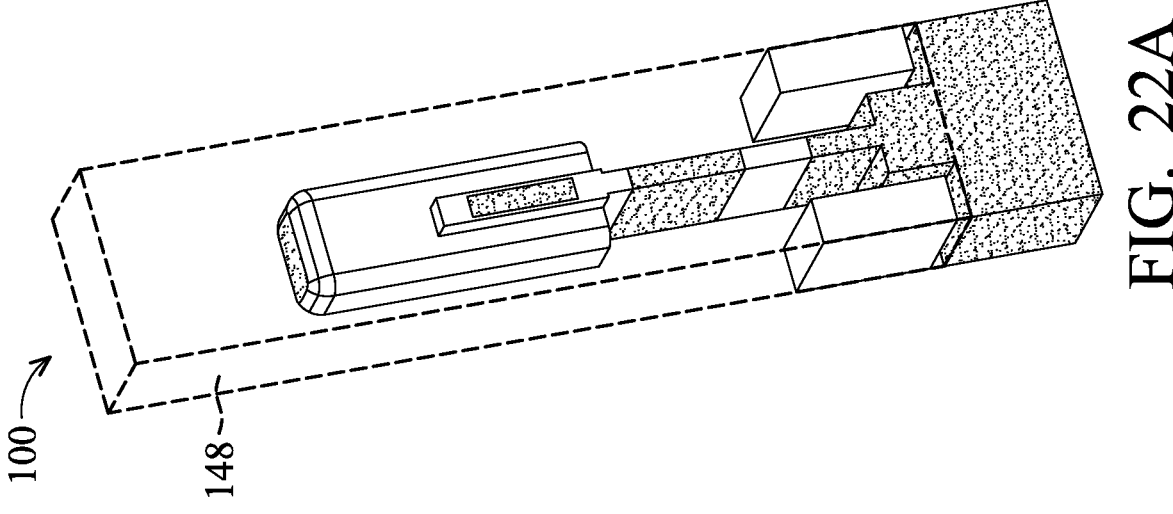

In FIGS. 22A and 22B, a dielectric layer 148 has been deposited. The dielectric layer 148 may be formed substantially as described in relation to FIGS. 10A and 10B.

Figure 23B:
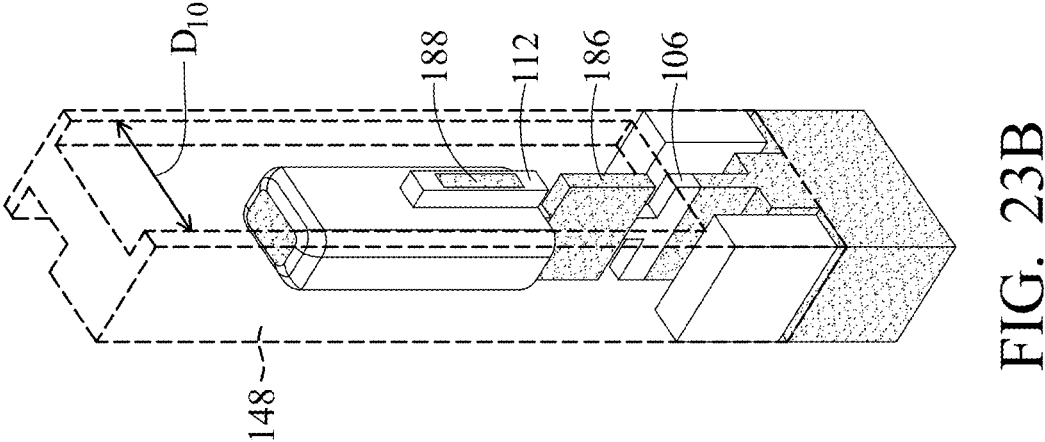
Figure 23A:
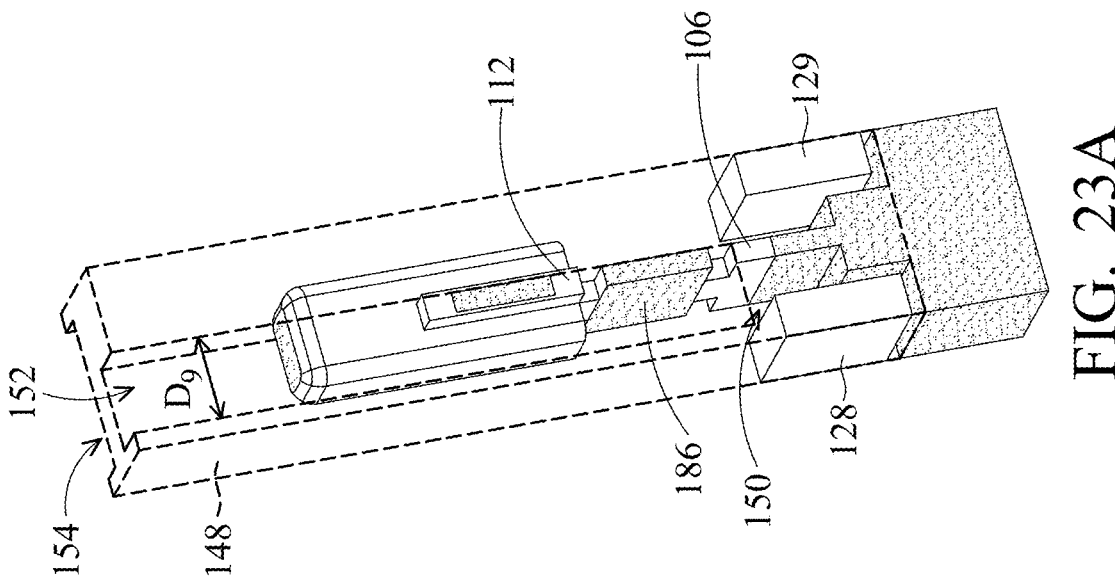

In FIGS. 23A and 23B, processes have been performed similar to those described in relation to FIGS. 11A and 11B. In particular, a via 150 and trenches 152 and 154 have been formed in the dielectric layer 148.

The trench 152 has a width dimension D9. The trench 154 has a width dimension D10. The width dimension D9 is less than the width dimension D10. The different widths of the trenches 152 and 154 are selected as part of the formation of source/drain regions for the lower transistor 194 having different dimensions from each other. Furthermore, the reduced width of the trench 152 is selected to result in the formation of an asymmetric source/drain region in conjunction with the exposed portions of the semiconductor layer 186 in the trench 152. As will be set forth in more detail below, this can help ensure that a conductive via that extends from a source/drain region of the upper transistor 196 will not accidentally contact the source/drain region of the lower transistor 194. In some embodiments, the dimension D9 is between 12 nm and 25 nm. In some embodiments, the dimension D10 is between 20 nm and 35 nm. Other values can be used for the dimensions D9 and D10 without departing from the scope of the present disclosure.

In some embodiments, the trench 152 is positioned asymmetrically with respect to the semiconductor layer 186 in the Y dimension. With reference particularly to the view of FIG. 23A, the right edge of the trench 152 is much closer to the right edge of the semiconductor layer 186 than the degree of the left edge of the trench 152 is closer to the left edge of the semiconductor layer 186. In some embodiments, the right edge of the trench 152 is aligned with the right edge of the semiconductor layer 186. In some embodiments, the right edge of the trench 152 is slightly further to the right than the right edge of the semiconductor layer 186. In some embodiments, the right edge of the trench 152 is slightly further to the left than the right edge of the semiconductor layer 186. As will be set forth in more detail below, the asymmetric position of the trench 152 with respect to the semiconductor layer 186 will result in constraining the growth of a source/drain region in the trench 152 in one direction from the semiconductor layer 186, while the source/drain region is free to grow in the opposite direction. This will result in an asymmetric source/drain region in the trench 152.

With reference particularly to FIG. 23B, in one embodiment, the trench 154 is formed substantially symmetrically with respect to the semiconductor layer 186 in the Y dimension. In particularly, the left edge of the semiconductor layer 186 may be substantially the same distance from the left edge of the trench 154 as the right edge of the semiconductor layer 186 is from the right edge of the trench 154. This may result in the growth of the symmetric source/drain region from the semiconductor layer 186 in the trench 154.

Figure 24B:
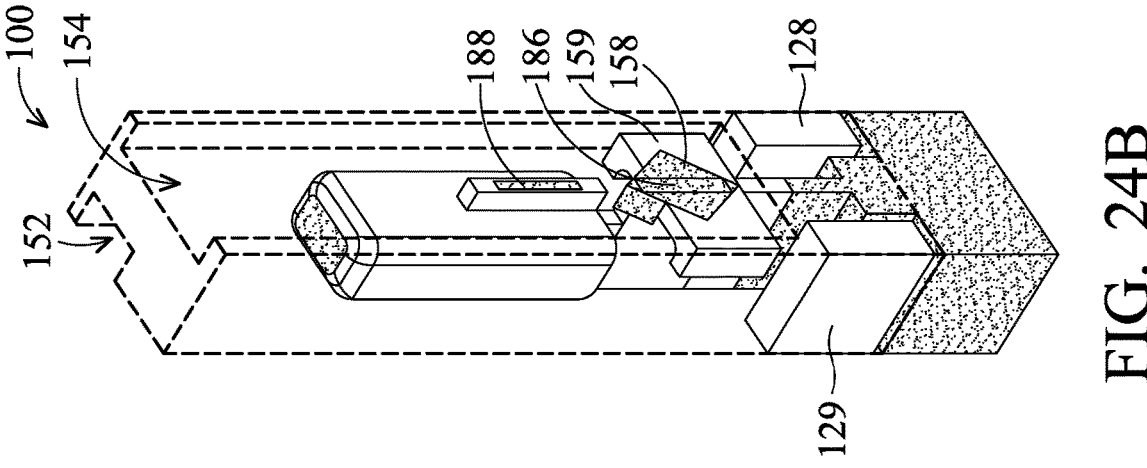
Figure 24A:
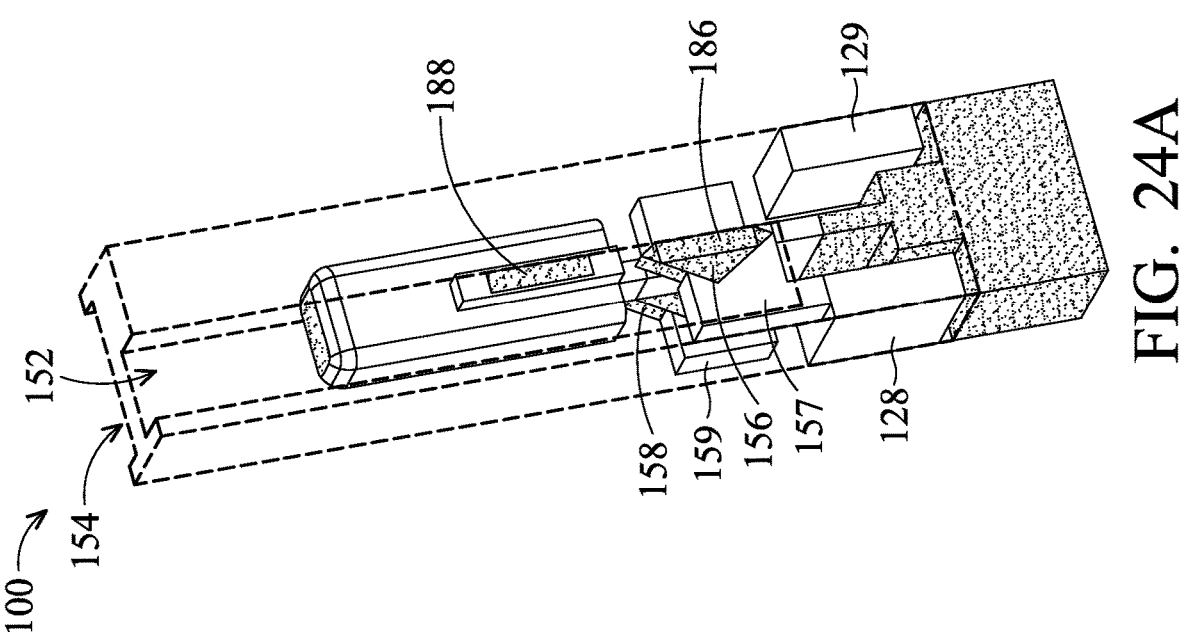

In FIGS. 24A and 24B, source/drain regions 156 and 158 have been formed, in accordance with some embodiments. The source/drain regions 156 and 158 may be formed in an epitaxial growth process on the semiconductor layer 186. The source/drain regions 156 and 158 include a semiconductor material. The semiconductor material can include a same semiconductor material as the semiconductor layer 186. Alternatively, the semiconductor material of the source/drain regions 156 and 158 can be different than the semiconductor material of the semiconductor layer 186. The source/drain regions 156 and 158 may be doped in situ with dopant atoms during the epitaxial growth process. In the example in which the lower transistor 194 is a P-type transistor, the source/drain regions 156 and 158 may be doped in situ with P-type dopant atoms. The P-type dopant atoms can include boron or other P-type dopant atoms. In an example in which the lower transistor 194 is an N-type transistor, the source/drain regions 156 and 158 may be doped in situ with N-type dopant atoms. The dopant atoms can include phosphorus, arsenic, or other N-type dopant atoms.

With particular reference to FIG. 24A, the source/drain region 156 is formed in the trench 152. The source/drain region 156 is asymmetric in the Y axis. In particular, the right edge of the source/drain region 156 abuts the right wall of the trench 152, substantially flush with the right edges of the semiconductor layer 186. By contrast, the left half of the source/drain region 156 has a substantially diamond shape and comes to a point on the left side relatively far to the left of the left edge of the semiconductor layer 186. Accordingly, the right edge of the source/drain region 156 is substantially flat, while the left edge of the source/drain region 156 has a substantially diamond shape.

Continuing with particular reference to FIG. 24A, one result of the asymmetric formation of the source/drain region 156 is that the right edge of the source/drain region 156 is relatively far in the Y direction from buried metal line 129. As will be set forth in more detail below, this can be beneficial in making a conductive via extending through the dielectric layer 148 to the buried metal line 129 without electrically contacting source/drain region 156.

With particular reference to FIG. 24B, the source/drain region 158 is formed in the trench 154. The source/drain region 158 is substantially symmetrical in the Y direction. The source/drain region 158 has a diamond shape on both the left and right sides. The left edge of the source/drain region 158 is substantially a same distance from a left edge of the trench 154 as a right edge of the source/drain region 158 is from a right edge of the trench 154. This is because the trench 154 is placed symmetrically with respect to the semiconductor layer 186 and is wide enough such that the source/drain region 158 does not grow to contact either edge.

In FIGS. 24A and 24B, source/drain contacts 157 and 159 have been formed, in accordance with some embodiments. The source/drain contacts 157 is formed in the trench 152 in contact with the source/drain region 156. A portion of the source/drain contact 157 may be considered a conductive via 155 positioned in the via 150 and contacting the top of the buried metal line 128. The source/drain contact 159 is formed in the trench 154 in contact with the source/drain region 158. Though not shown in FIGS. 24A and 24B, a silicide may be formed on the source/drain regions 156 and 158 prior to formation of the source/drain contacts 157 and 159.

The source/drain contacts 157 and 159 can be formed by depositing a conductive material. The conductive material can include one or more metals such as titanium, TiN, tantalum, TaN, aluminum, copper, tungsten, gold, cobalt, ruthenium, or other suitable conductive materials. The source/drain contacts 157 and 159 can be deposited by PVD, CVD, ALD, or other suitable deposition processes.

Figure 25B:
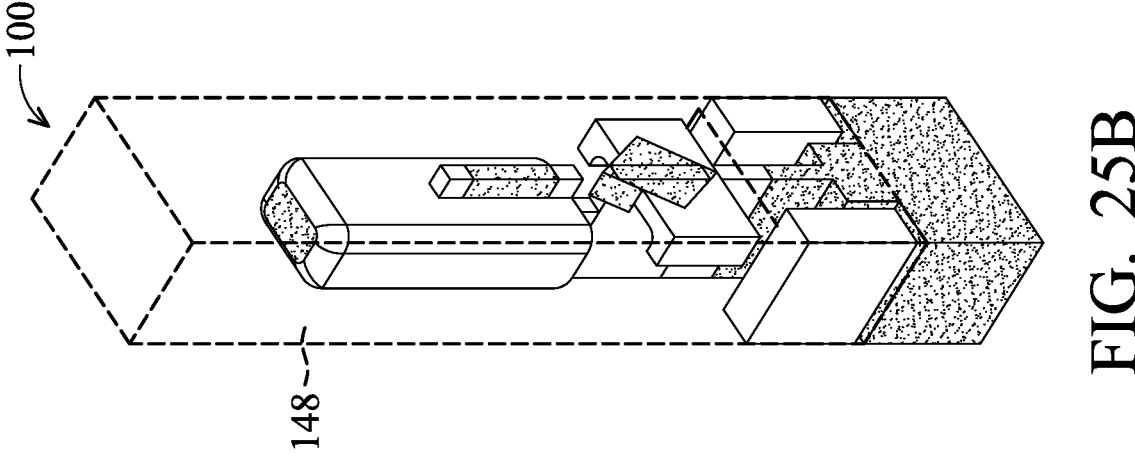
Figure 25A:
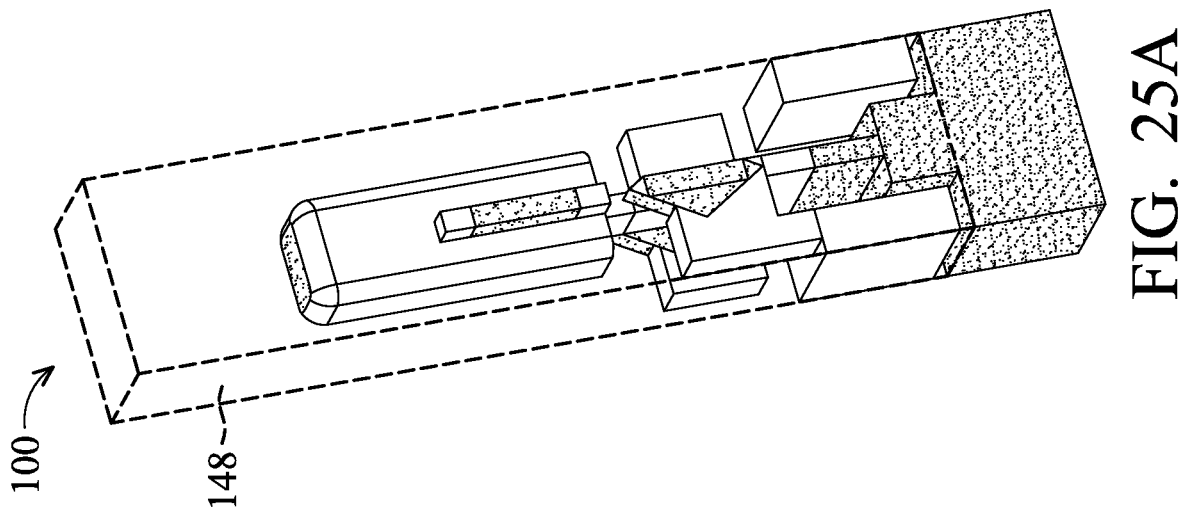

In FIGS. 25A and 25B, a dielectric material has been deposited in the trenches 152 and 154, in accordance with some embodiments. The dielectric material may be the same material as the dielectric layer 148. The deposition of the dielectric material has the effect of refilling or rebuilding the dielectric layer 148. Accordingly, the dielectric layer 148 is shown as a single dielectric layer in FIGS. 25A and 25B.

Figure 26B:
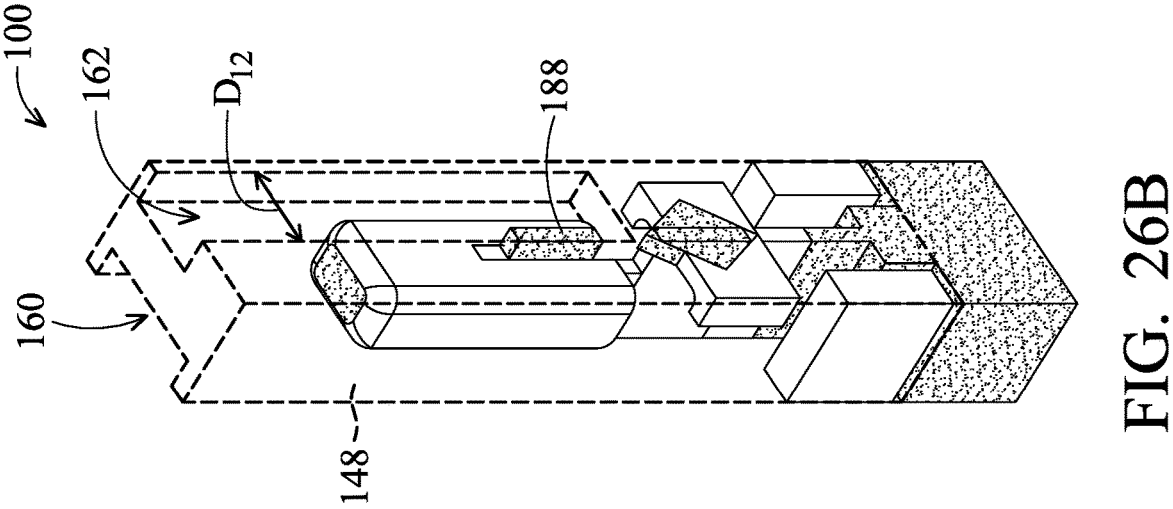
Figure 26A:
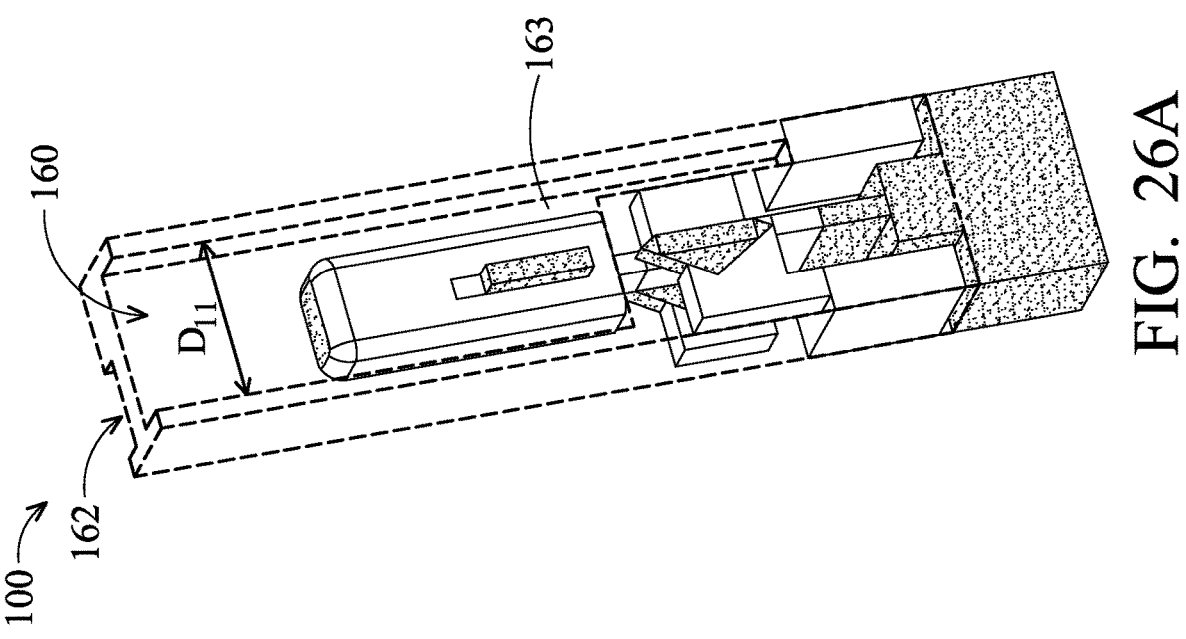

In FIGS. 26A and 26B, trenches 160 and 162 have been formed in the dielectric layer 148. A via 163 is also formed in the dielectric layer 148 exposing a portion of the top surface of the buried metal line 129. In practice, the via 163 may be formed in a first patterning process of the dielectric layer 148 in which the via 163 is formed from the top surface of the dielectric layer 148 to the top of the buried metal line 129.

The trenches 160 and 162 may be formed in the dielectric layer 148 in a patterning process after forming the via 163. The patterning process can include forming a hard mask layer over the dielectric layer 148 and etching the dielectric layer 148 in the presence of the patterned hard mask to form the trenches 160 and 162. The trenches 160 and 162 are formed to a depth below the semiconductor layer 188 or above the source/drain regions 156 and 158. In some embodiments, the bottom of the trenches 160 and 162 is substantially even with a top of the spacing layer 112.

The trench 160 has a width dimension D11. The trench 160 has a width dimension D12. The width dimension D12 is less than the width dimension D11. The different widths of the trenches 160 and 162 are selected as part of the formation of source/drain regions for the upper transistor 196 having different dimensions from each other. Furthermore, the reduced width of the trench 162 is selected to result in the formation of an asymmetric source/drain region in conjunction with the exposed portions of the semiconductor layer 188 in the trench 162. As will be set forth in more detail below, this can help ensure that a conductive via that extends from a metal line above the upper transistor 196 to the lower transistor194 will not unintentionally contact the source/drain region of the upper transistor 196. In some embodiments, the dimension D12 is between 12 nm and 25 nm. In some embodiments, the dimension D11 is between 20 nm and 35 nm. Other values can be used for the dimensions D12 and D11 without departing from the scope of the present disclosure.

In some embodiments, the trench 162 is positioned asymmetrically with respect to the semiconductor layer 188 in the Y dimension. With reference particularly to the view of FIG. 26B, the left edge of the trench 162 is much closer to the left edge of the semiconductor layer 188 than the degree of the right edge of the trench 162 is closer to the right edge of the semiconductor layer 188. In some embodiments, the left edge of the trench 162 is aligned with the left edge of the semiconductor layer 188. In some embodiments, the left edge of the trench 162 is slightly further to the left than the left edge of the semiconductor layer 188. In some embodiments, the left edge of the trench 162 is slightly further to the right than the left edge of the semiconductor layer 188. As will be set forth in more detail below, the asymmetric position of the trench 162 with respect to the semiconductor layer 188 will result in constraining the growth of a source/drain region in the trench 162 in one direction from the semiconductor layer 188, while the source/drain region is free to grow in the opposite direction. This will result in an asymmetric source/drain region in the trench 162.

With reference particularly to FIG. 26A, in one embodiment, the trench 160 is formed substantially symmetrically with respect to the semiconductor layer 188 in the Y dimension. In particular, the right edge of the semiconductor layer 188 may be substantially the same distance from the right edge of the trench 160 as the left edge of the semiconductor layer 188 is from the left edge of the trench 160. This may result in the growth of the symmetric source/drain region from the semiconductor layer 188 in the trench 160.

Figure 27B:
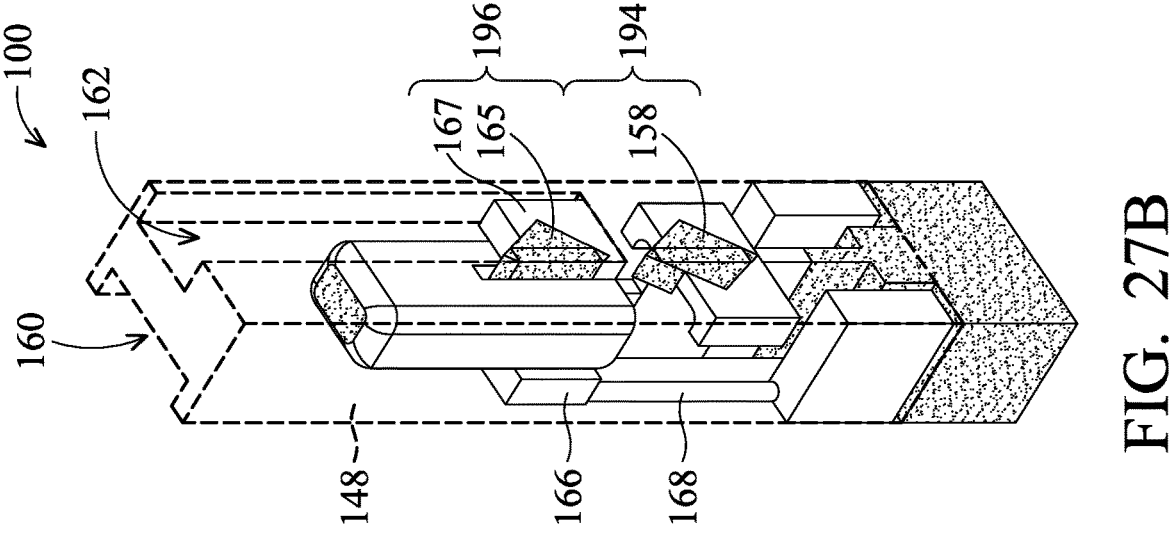
Figure 27A:
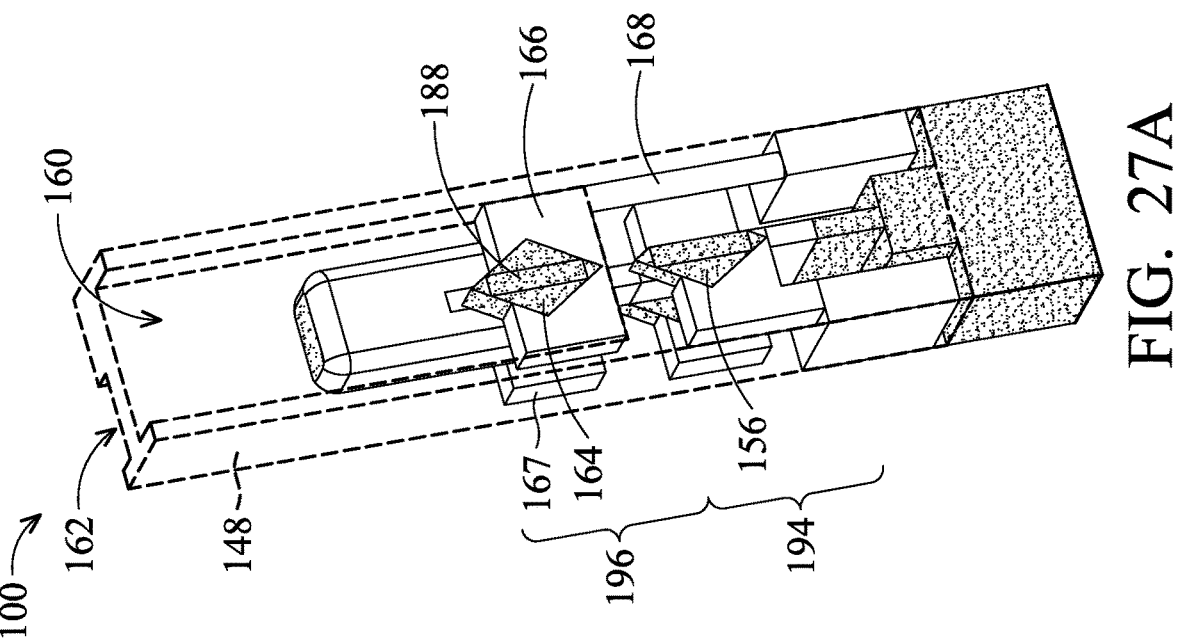

In FIGS. 27A and 27B, source/drain regions 164 and 165 have been formed, in accordance with some embodiments. The source/drain regions 164 and 165 may be formed in an epitaxial growth process on the semiconductor layer 188. The source/drain regions 164 and 165 include a semiconductor material. The semiconductor material can include a same semiconductor material as the semiconductor layer 188. Alternatively, the semiconductor material of the source/drain regions 164 and 165 can be different than the semiconductor material of the semiconductor layer 188. The source/drain regions 164 and 165 may be doped in situ with dopant atoms during the epitaxial growth process. In the example in which the upper transistor 196 is a P-type transistor, the source/drain regions 164 and 165 may be doped in situ with P-type dopant atoms. The P-type dopant atoms can include boron or other P-type dopant atoms. In an example in which the upper transistor 196 is an N-type transistor, the source/drain regions 164 and 165 may be doped in situ with N-type dopant atoms. The dopant atoms can include phosphorus, arsenic, or other N-type dopant atoms.

With particular reference to FIG. 27B, the source/drain region 165 is formed in the trench 162. The source/drain region 165 is asymmetric in the Y axis. In particular, the left edge of the source/drain region 165 abuts the left wall of the trench 162, substantially flush with the left edges of the semiconductor layer 188. By contrast, the right half of the source/drain region 165 has a substantially diamond shape and comes to a point on the right side relatively far to the right of the right edges of the semiconductor layer 188. Accordingly, the left edge of the source/drain region 165 is substantially flat, while the right edge of the source/drain region 165 has a substantially diamond shape.

Continuing with particular reference to FIG. 27B, one result of the asymmetric formation of the source/drain region 165 is that the left edge of the source/drain region 165 is relatively far in the Y direction from the left edge of the source/drain contact 159. As will be set forth in more detail below, this can be beneficial in ensuring that a conductive via extending through the dielectric layer 148 to lower transistor 194 can be made without contacting source/drain region 165.

With particular reference to FIG. 27A, the source/drain region 164 is formed in the trench 160. The source/drain region 164 is substantially symmetrical in the Y direction. The source/drain region 164 has a diamond shape on both the right and left sides. The right edge of the source/drain region 164 is substantially a same distance from a right edge of the trench 160 as a left edge of the source/drain region 164 is from a left edge of the trench 160. This is because the trench 160 is placed symmetrically with respect to the semiconductor layer 188 and is wide enough such that the source/drain region 164 does not grow to contact either edge.

In FIGS. 27A and 27B, source/drain contacts 166 and 167 have been formed, in accordance with some embodiments. The source/drain contact 166 is formed in the trench 160 in contact with the source/drain region 164. A portion of the source/drain contact 166 may be considered a conductive via 168 positioned in the via 163 and contacting the top of the buried metal line 129. The source/drain contact 167 is formed in the trench 162 in contact with the source/drain region 165. Though not shown in FIGS. 27A and 27B, a silicide may be formed on the source/drain regions 164 and 165 prior to formation of the source/drain contacts 166 and 167.

The source/drain contacts 166 and 167 can be formed by depositing a conductive material. The conductive material can include one or more metals such as titanium, TiN, tantalum, TaN, aluminum, copper, tungsten, gold, cobalt, ruthenium, or other suitable conductive materials. The source/drain contacts 166 and 167 can be deposited by PVD, CVD, ALD, or other suitable deposition processes.

Though not shown in FIGS. 27A and 27B, after formation of the source/drain contacts 166 and 167, a dielectric material may be deposited. The dielectric material may substantially rebuild or refill the dielectric layer 148. Accordingly, the dielectric material can include the same material as the dielectric layer 148.

Figure 28B:
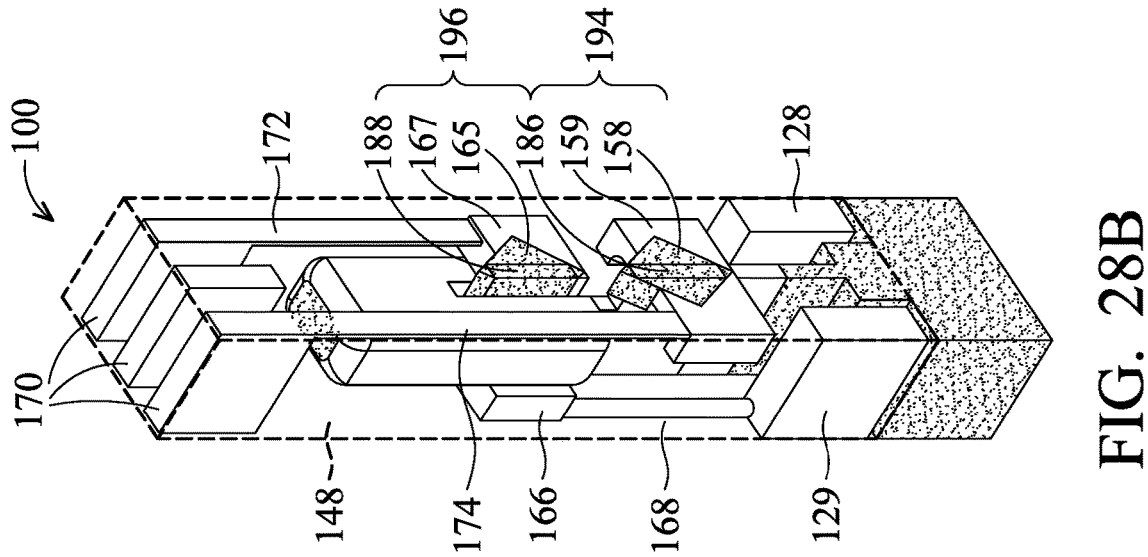
Figure 28A:
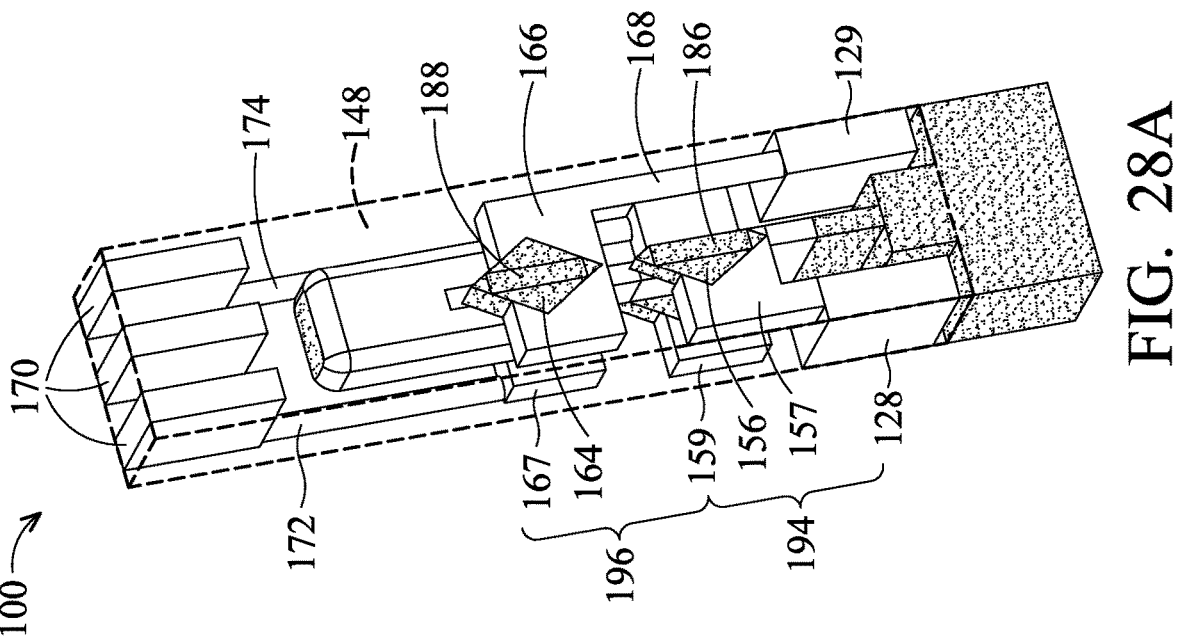
FIG. 28C is a top view of an integrated circuit, in accordance with some embodiments.

In FIGS. 28A and 28B, signal lines 170 and conductive vias 172 and 174 have been formed, in accordance with some embodiments. Prior to formation of the signal lines 170 and the conductive vias 172 and 174, vias may be formed in the dielectric layer 148 for the conductive vias 172 and 174. After formation of the vias, trenches can be formed in the dielectric layer 148 for the signal lines 170. After formation of the vias and trenches in the dielectric layer 148, the conductive vias 172 and 174 can be formed by depositing one or more conductive materials in the vias using deposition processes and conductive materials as described previously. After formation of the conductive vias 172 and 174, the signal lines 170 can be formed by depositing one or more conductive materials the trenches formed in the dielectric layer 148, using deposition processes and conductive materials as described previously.

The conductive via 172 contacts the source/drain contact 167, thereby providing an electrical connection between the source/drain region 165 and one of the signal lines 170. The conductive via 174 contacts the source/drain contacts 159, thereby providing electrical contact between the source/drain region 158 and one of the signal lines 170.

Because of the asymmetric structure of the source/drain region 165, the conductive via 174 can extend downward pass the source/drain region 165 without the risk of unintentionally contacting the source/drain region 165. Likewise, due to the asymmetric structure of the source/drain region 156, the conductive via 168 can extend downward pass the source/drain region 157 to contact the buried metal line 129.

Though not shown in FIGS. 17A-28B, in practice, the gate electrode will be formed by removing the gate layer 136. The etching process may further etch through the dielectric layer 148 below the gate layer 136 to expose sidewalls of the semiconductor layer 186. One or more gate dielectric layers can then be deposited on exposed surfaces of the semiconductor layers 186 and 188. Conductive materials can then be deposited in contact with the dielectric materials on the exposed sidewalls of semiconductor layers 186 and 188. The upper and lower transistors 194 and 196 can operate by applying voltages to the gate electrode and the source/drain regions in order to enable or prevent current flowing through the semiconductor layer 186 and 188.

Current flows through the semiconductor layer 186 between the source/drain region 156 and the source/drain region 158 in the X direction. Accordingly, the semiconductor layer 186 is a channel region of the lower transistor 194. Current flows through the semiconductor layer 188 between the source/drain regions 164 and 165 in the X direction. Accordingly, the semiconductor layer 188 is a channel region of the upper transistor 196. The transistors 194 and 196 collectively make up the CFET 101.

Figure 28C:
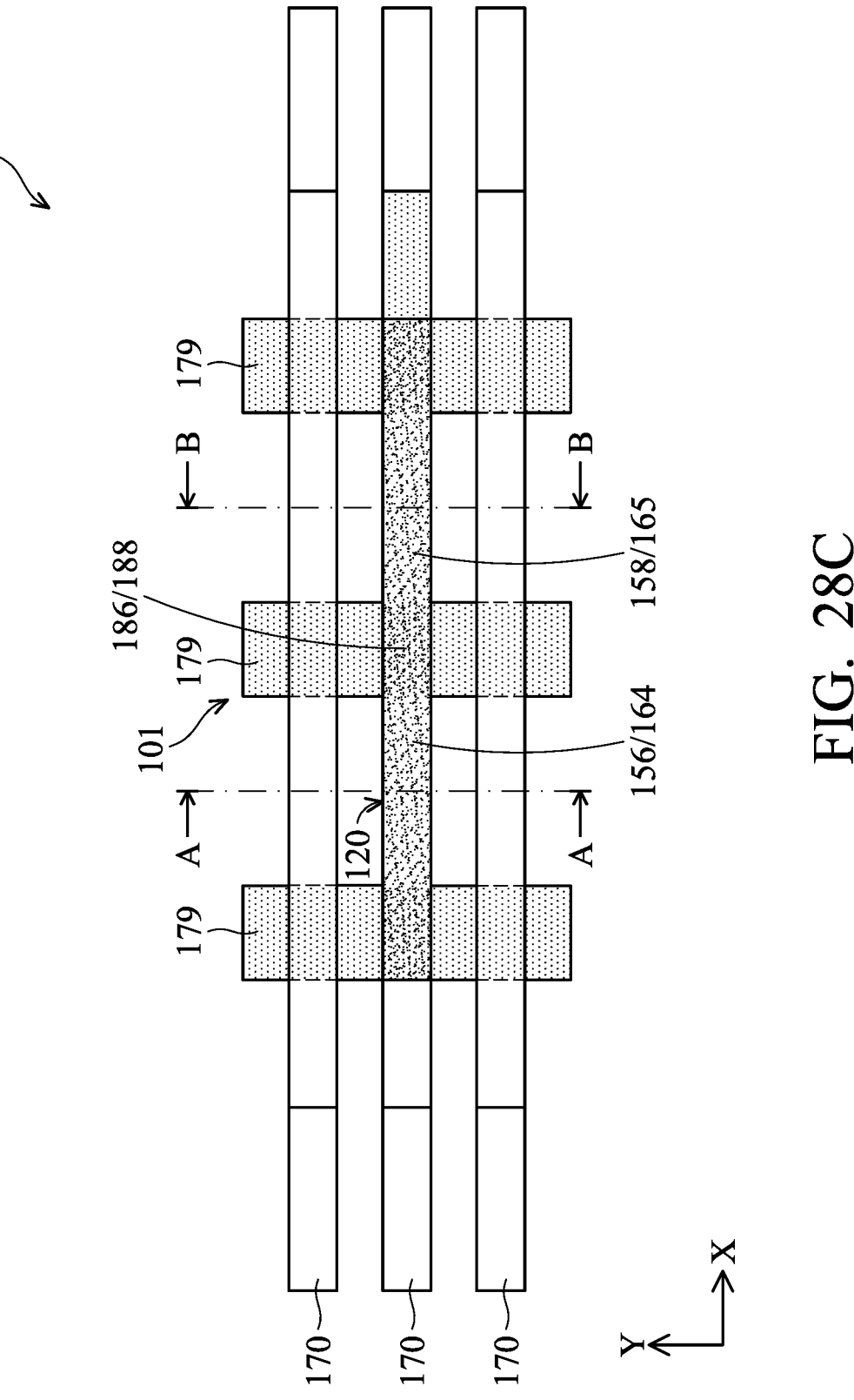

FIG. 28C is a simplified top view of the integrated circuit 100, according to one embodiment. The top view illustrates a plurality of metal lines 170 extending in the X direction. A fin 120 extends in the X direction. A plurality of gate structures 179 extends in the Y direction perpendicular to the fin 120 and the metal lines 170. The fin 120 corresponds to the fin 120 associated with the CFET 101. The central gate structure 179 corresponds to a gate structure 179 associated with the CFET 101. The semiconductor layers 186, 188 are positioned centrally to the gate structure 179. The source/drain regions 156 and 164 are positioned to the left of the gate structure 179. The cut lines A indicate the cut lines along which each figure with a suffix "A" are taken. The source/drain regions 158 and 165 are positioned to the right of the gate structure 179. The cut lines B indicate the cut lines along which each figure with a suffix "B" are taken. Because FIG. 28C is a simplified top view, the relative vertical positions of the various structures are not shown. Various other configurations of a CFET 101 can be utilized without departing from the scope of the present disclosure.

FIGS. 29-41 are cross-sectional views of integrated circuits 100, in accordance with some embodiments. In particular, FIGS. 29-41 are simplified cross-sectional views of CFET transistors 101, in accordance with some embodiments. For simplicity in understanding the basic relationships between metal structures and semiconductor structures, FIGS. 29-41 do not illustrate dielectric layers, aside from a portion of the dielectric layer 126 corresponding to shallow trench isolation regions. FIGS. 29-41 may utilize structures, processes, components, and principles described in relation to FIGS. 1A-28C.

Furthermore, reference may be made below to the semiconductor nanostructures 122/123 or semiconductor layers 186/188 "remaining in" the source/drain regions 156/164. The semiconductor nanostructures 122/123 or semiconductor layers 186/188 remain in the source/drain regions when a portion of the semiconductor nanostructures 122/123 or semiconductor layers 186/188 are exposed in the X direction such that an epitaxial growth occurs not only from an exposed end surface (Y-Z plane) but also from at least a portion of the top (X-Y plane), bottom (X-Y plane), or side surfaces (X-Z plane) of the corresponding semiconductor layers 186/188 or semiconductor nanostructures 122/123. The semiconductor nanostructures 122/123 or semiconductor layers 186/188 do not remain in the source/drain regions when the source/drain regions grown epitaxially only from an exposed end (Y-Z plane) of the corresponding semiconductor nanostructures 122/123 or semiconductor layers 186/188, as the case may be.

Figure 29:
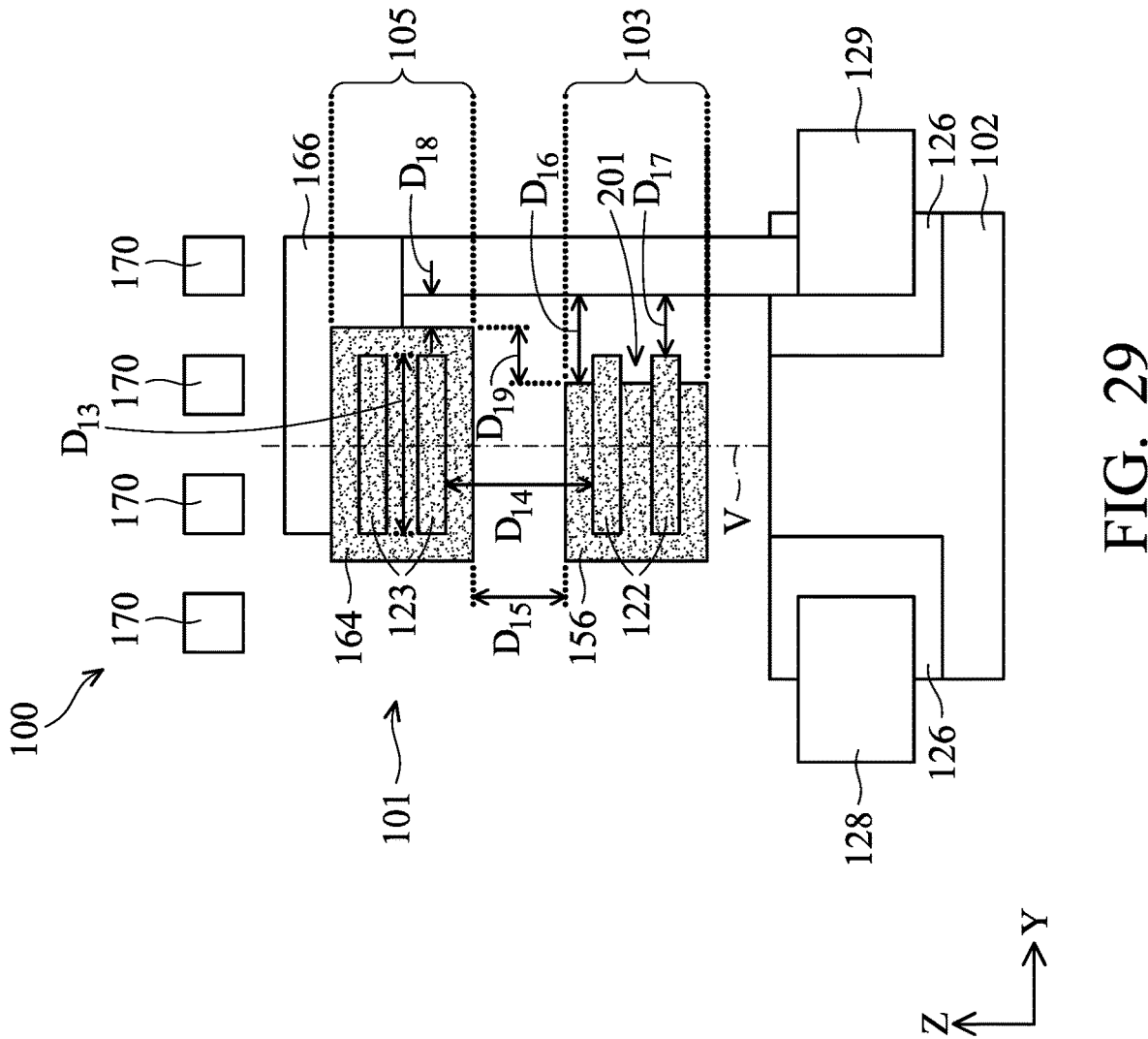
FIGS. 29-41 are cross-sectional views of CFET transistors, in accordance with some embodiments.

FIG. 29 is a cross-sectional view of a CFET 101, in accordance with some embodiments. The CFET 101 includes a lower transistor 103 including semiconductor nanostructures 122 and a source/drain region 156. The CFET 101 includes an upper transistor 105 including semiconductor nanostructures 123 and a source/drain region 164. Buried metal lines 128 and 129 are positioned in the dielectric layer 126 (shallow trench isolation region) adjacent to the substrate 102. Metal lines 170 are positioned above the CFET 101. A source/drain contact 166 is in contact with the source/drain region 164. A conductive via 168 extends from the source/drain contact 166 to the buried metal line 129.

In order to help ensure that the source/drain region 156 does not unintentionally contact the conductive via 168, the source/drain region 156 is an asymmetric source/drain region 156 with respect to the semiconductor nanostructures 122. The asymmetry of the source/drain region 156 can be implemented via formation of the trench 152/162 and the dielectric layer 148 as described in relation to FIGS. 11A-12B. The semiconductor nanostructures 122 and 123 remain in the source/drain regions 156 and 164. The right edges of the semiconductor nanostructures 122 are further to the right than the right edge of the source/drain region 156, forming a forked region 201 due to the semiconductor nanostructures 122 extending further to the right than the source/drain region 156. This is different than the source/drain region 164 which has symmetrical with respect to the semiconductor nanostructures 123.

The source/drain regions 156 and 164 have been formed with a rectangular epitaxy, as opposed to the faceted or diamond-shaped epitaxy of FIGS. 12A-15B. Various types of epitaxial growth processes can be used to form source/drain regions with various shapes such as diamond, faceted, or rectangular.

The semiconductor nanostructures 122 and 123 have a width dimension D13 in the Y direction between 16 nm and 32 nm. The highest semiconductor nanostructure 122 and the lowest semiconductor nanostructure 123 are separated by a dimension D14 in the Z direction between 20 nm and 30 nm. The source/drain region 156 is separated from the source/drain region 164 by a dimension D15 in the Z direction between 10 nm and 20 nm. The right edge of the source/drain region 156 is separated from the conductive via 168 by a dimension D16 in the Y direction between 8 nm and 16 nm. The semiconductor nanostructures 122 are separated from the conductive via 168 by a dimension D17 in the Y direction between 4 nm and 10 nm. The source/drain region 164 is separated from the conductive via 168 by a dimension D18 in the Y direction between 2 nm and 4 nm. The right edge of the source/drain region 156 and the right edge of the source/drain region 164 are separated in the Y direction by a dimension D19 between 4 nm and 8 nm. Other values for the various dimensions can be utilized without departing from the scope of the present disclosure.

The semiconductor nanostructures 123 and the semiconductor nanostructures 122 are aligned around a vertical axis V. The source/drain region 164 is symmetrically aligned around the vertical axis V. In particular, a left lateral end of the source/drain region 164 is substantially a same distance from the vertical axis V as is a right lateral end of the source/drain region 164. The source/drain region 156 is asymmetrically aligned with respect to the vertical axis V. In particular, a left lateral end of the source/drain region 156 is farther from the vertical axis V than is the right lateral end of the source/drain region 156.

Figure 30:
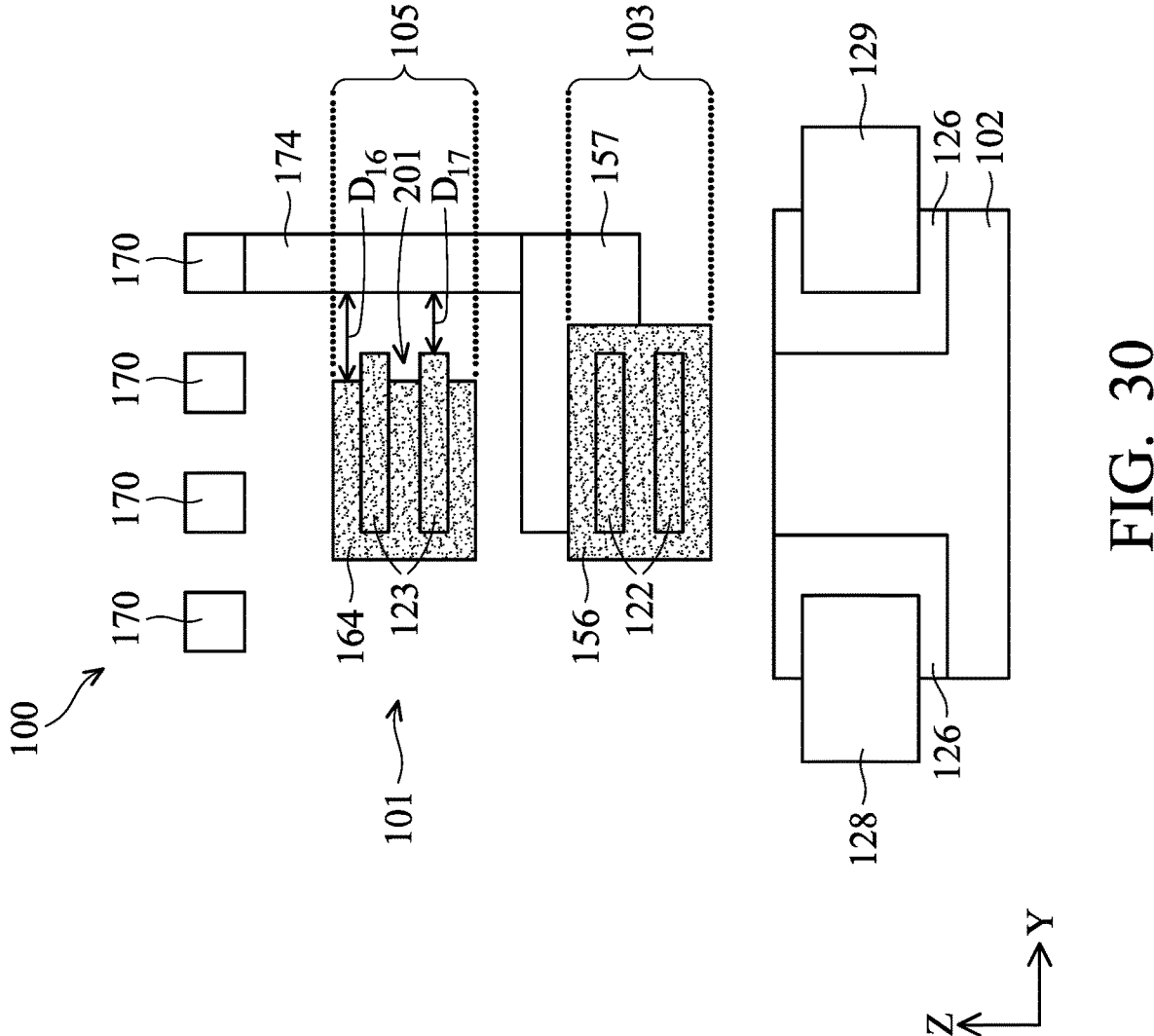

FIG. 30 illustrates a CFET 101, in accordance with some embodiments. The CFET 101 of FIG. 30 is similar in many ways to the CFET 101 of FIG. 29. A source/drain contact 157 is formed on the source/drain region 156. The semiconductor nanostructures 122 and 123 remain in the source/drain regions 156 and 164, forming a forked region 201 due to the semiconductor nanostructures 123 extending further to the right than the source/drain region 164. A conductive via 174 couples the source/drain contact 157 to one of the metal lines 170. The conductive via 174 extends upward to the right of the source/drain region 164. In order to ensure that the source/drain region 164 does not unintentionally contact the conductive via 174, the source/drain region 164 is formed in an asymmetrical manner using processes and principles described previously. The right edge of the source/drain region 164 is separated from the conductive via 174 by the dimension D16. The right edge of the semiconductor nanostructures 123 is separated from the conductive via 174 by the dimension D17.

Figure 31:
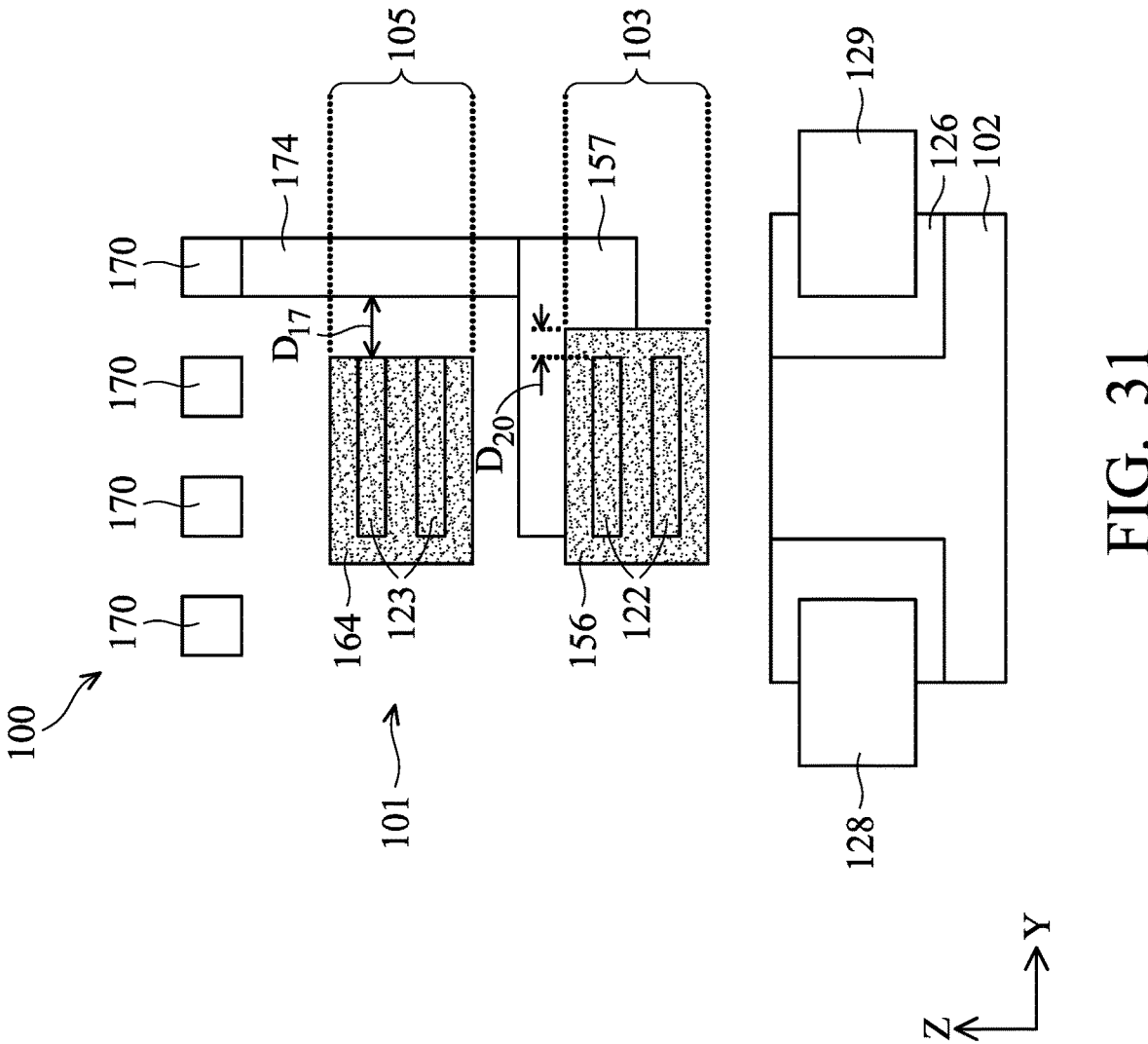

FIG. 31 illustrates a CFET 101, in accordance with some embodiments. The CFET 101 of FIG. 31 is similar to the CFET 101 of FIG. 30 in many ways. A source/drain contact 157 is formed on the source/drain region 156. The semiconductor nanostructures 122 and 123 remain in the source/drain regions 156 and 164. A conductive via 174 couples the source/drain contact 157 to one of the metal lines 170. The CFET 101 of FIG. 31 differs from the CFET 101 of FIG. 30 in that the right edge of the source/drain region 164 is aligned with the right edges of the semiconductor nanostructures 123 and both are separated from the conductive via 174 in the Y direction by the dimension D17. The right edge of the source/drain region 164 is separated from the right edge of the source/drain region 156 in the Y direction by a dimension D20 between 2 nm and 4 nm, though other values can be utilized without departing from the scope of the present disclosure.

Figure 32:
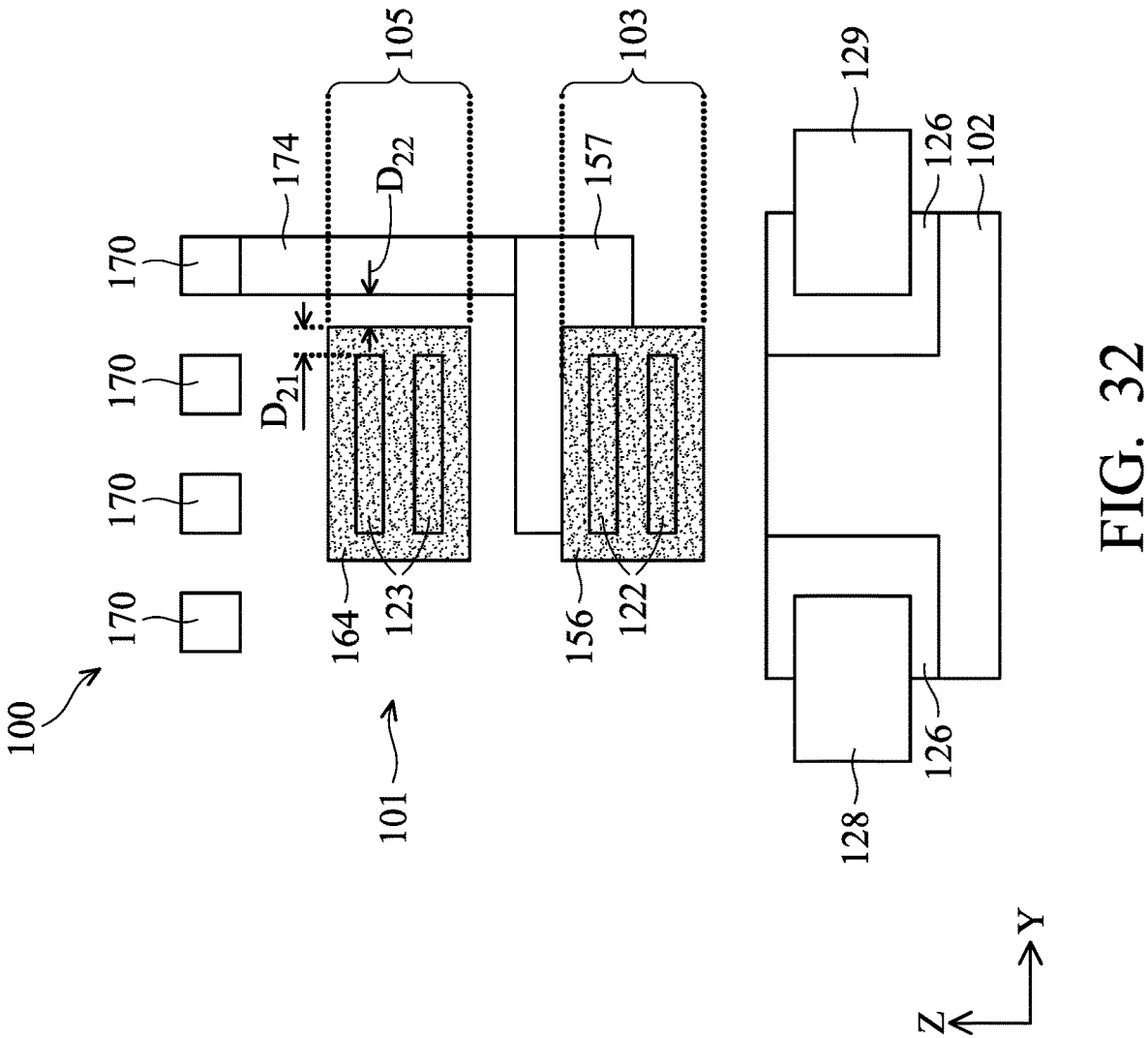

FIG. 32 illustrates a CFET 101 similar to the CFET 101 of FIG. 31, in accordance with some embodiments. A source/drain contact 157 is formed on the source/drain region 156. The semiconductor nanostructures 122 and 123 remain in the source/drain regions 156 and 164. A conductive via 174 couples the source/drain contact 157 to one of the metal lines 170. The CFET 101 of FIG. 32 differs from the CFET 101 of FIG. 31 in that the right edge of the source/drain region 164 is slightly further to the right than are the right edges of the semiconductor nanostructures 123 by a dimension D21 between 0.5 nm and 2 nm, though other values can be utilized without departing from the scope of the present disclosure. The right edge of the source/drain region 164 is separated from the conductive via 174 by a dimension D22 in the Y direction between 3 nm and 6 nm though other values can be utilized without departing from the scope of the present disclosure.

Figure 33:
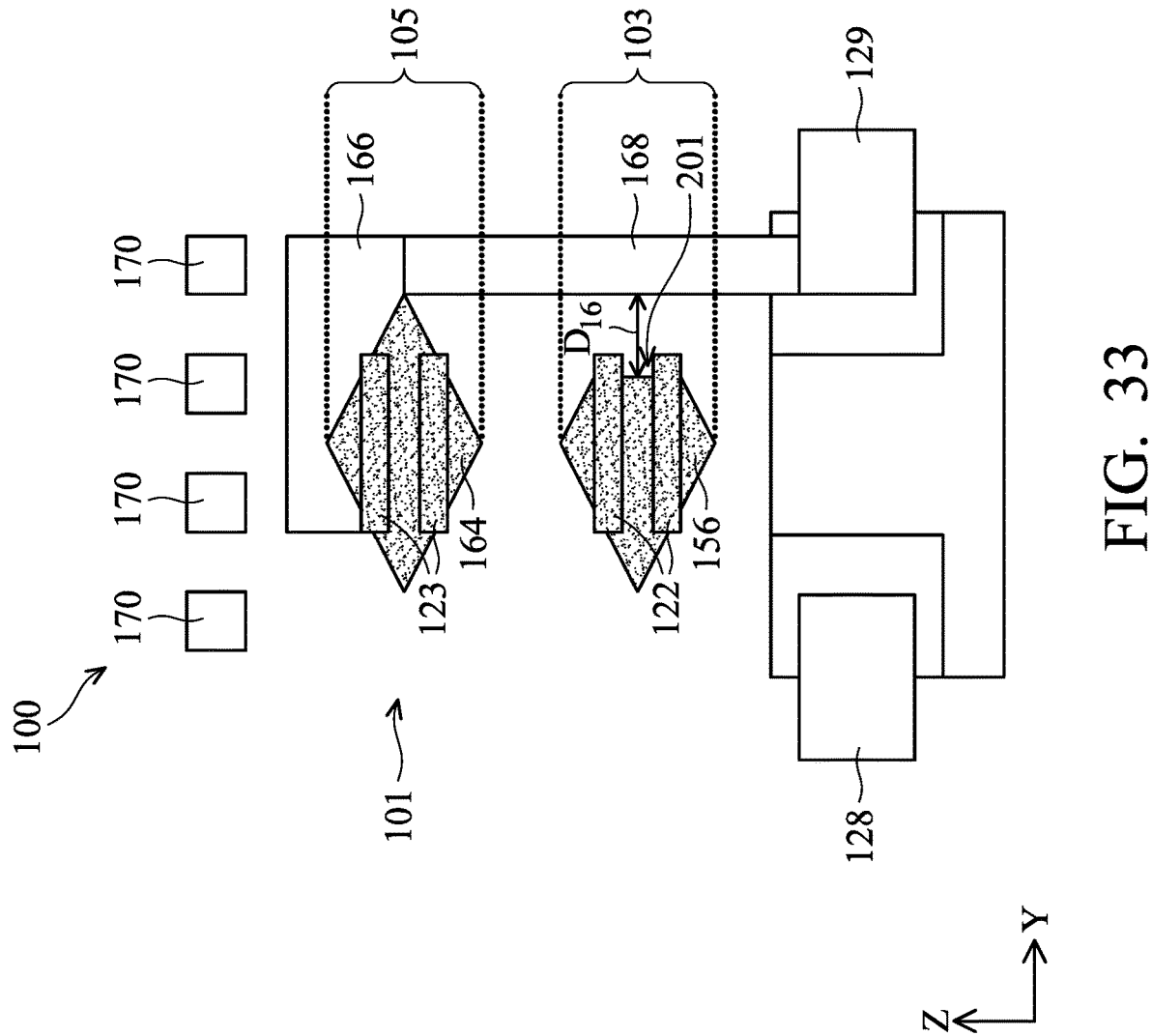

FIG. 33 illustrates a CFET 101 similar to the CFET 101 of FIG. 29, in accordance with some embodiments. The CFET 101 of FIG. 33 differs from the CFET 101 of FIG. 29 in that the source/drain regions 156 and 164 are formed with a faceted or diamond epitaxial growth process. The left half of the asymmetrical source/drain region 156 is substantially a diamond shape. The right half of the asymmetrical source/drain region 156 has a fork shaped feature 201. The right edge of the source/drain region 156 is separated from the conductive via 168 by the dimension D16.

Figure 34:
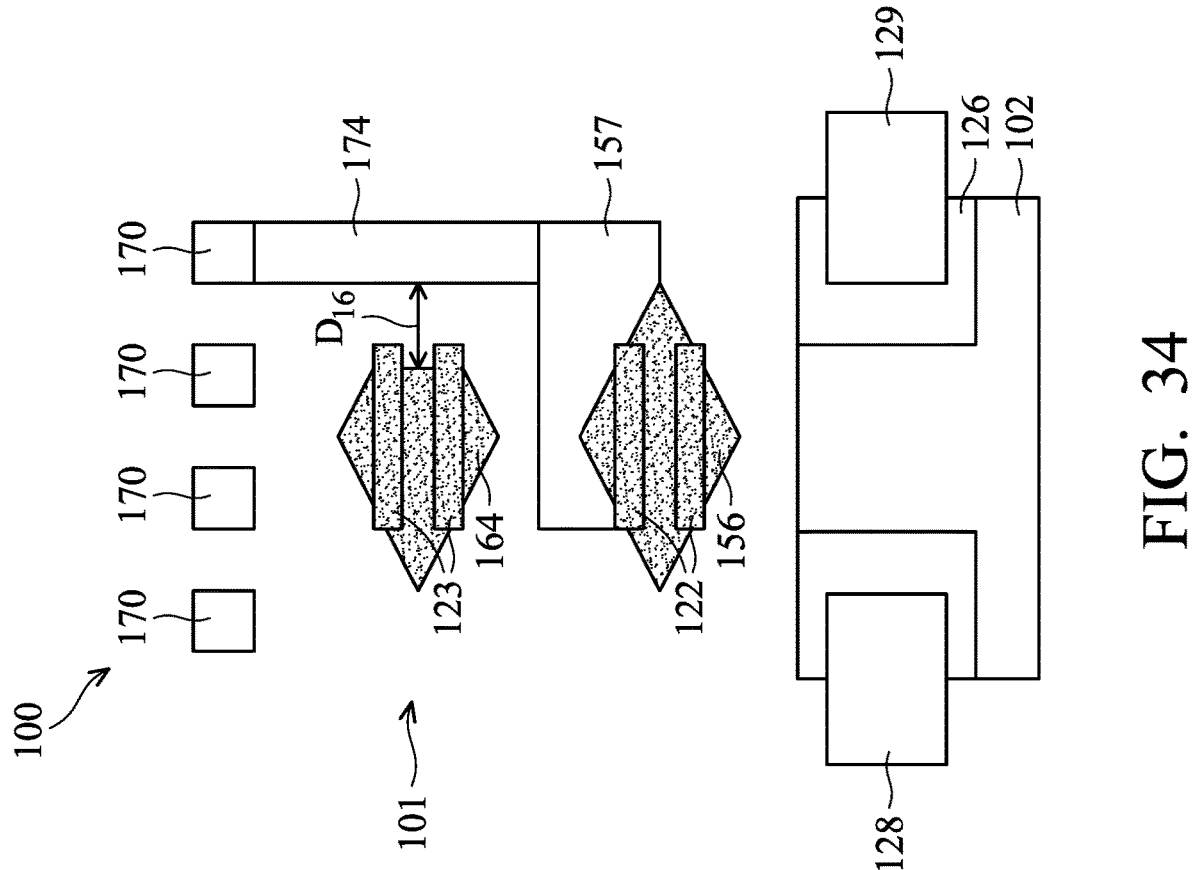

FIG. 34 illustrates a CFET 101 similar to the CFET 101 of FIG. 30, in accordance with some embodiments. The CFET 101 of FIG. 34 differs from the CFET 101 of FIG. 30 in that the source/drain regions 156 and 164 are formed with a faceted or diamond epitaxial growth process. The left half of the asymmetrical source/drain region 164 is substantially a diamond shape. The right half of the asymmetrical source/drain region 164 has a flat right edge due to the processes described previously. The right edge of the source/drain region 156 is separated from the conductive via 168 by the dimension D16.

Figure 35:
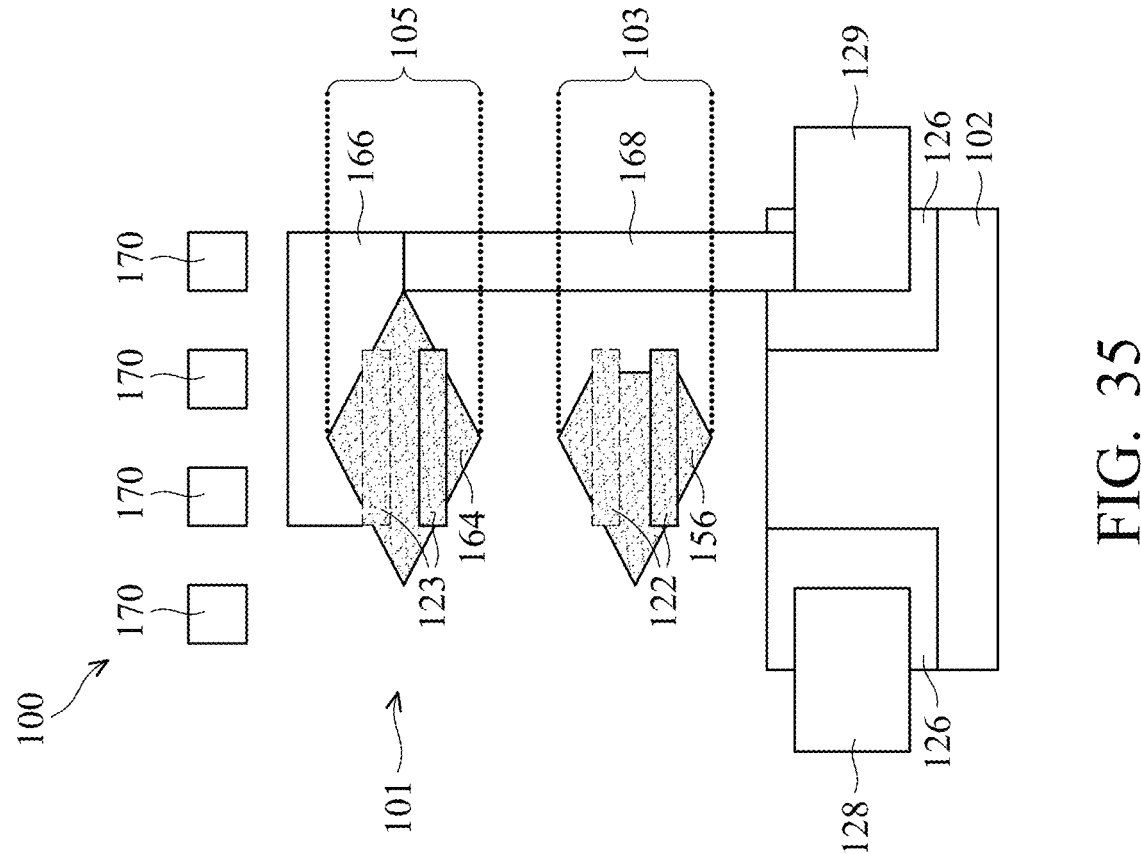

FIG. 35 illustrates a CFET 101 similar to the CFET 101 of FIG. 33, in accordance with some embodiments. The CFET 101 of FIG. 35 differs from the CFET 101 of FIG. 33 in that the semiconductor nanostructures 122 and 123 do not remain in the source/drain regions 156 and 164. The left half of the asymmetrical source/drain region 156 is substantially a diamond shape. The right half of the asymmetrical source/drain region 156 has a flat right edge due to the processes described previously.

Figure 36:
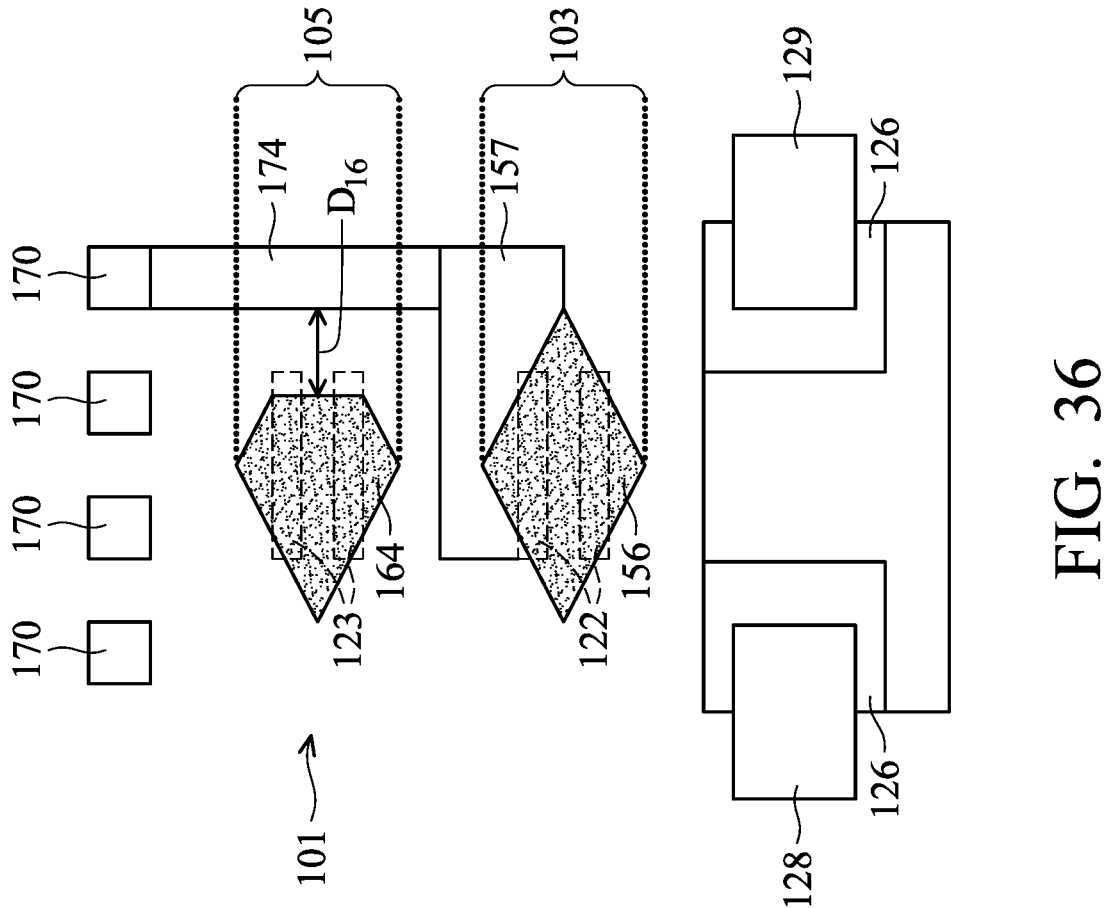

FIG. 36 illustrates a CFET 101 similar to the CFET 101 of FIG. 34, in accordance with some embodiments. The CFET 101 of FIG. 36 differs from the CFET 101 of FIG. 34 in that the semiconductor nanostructures 122 and 123 do not remain in the source/drain regions 156 and 164. The left half of the asymmetrical source/drain region 164 is substantially a diamond shape. The right half of the asymmetrical source/drain region 156 has a flat right edge due to the processes described previously.

Figure 37:
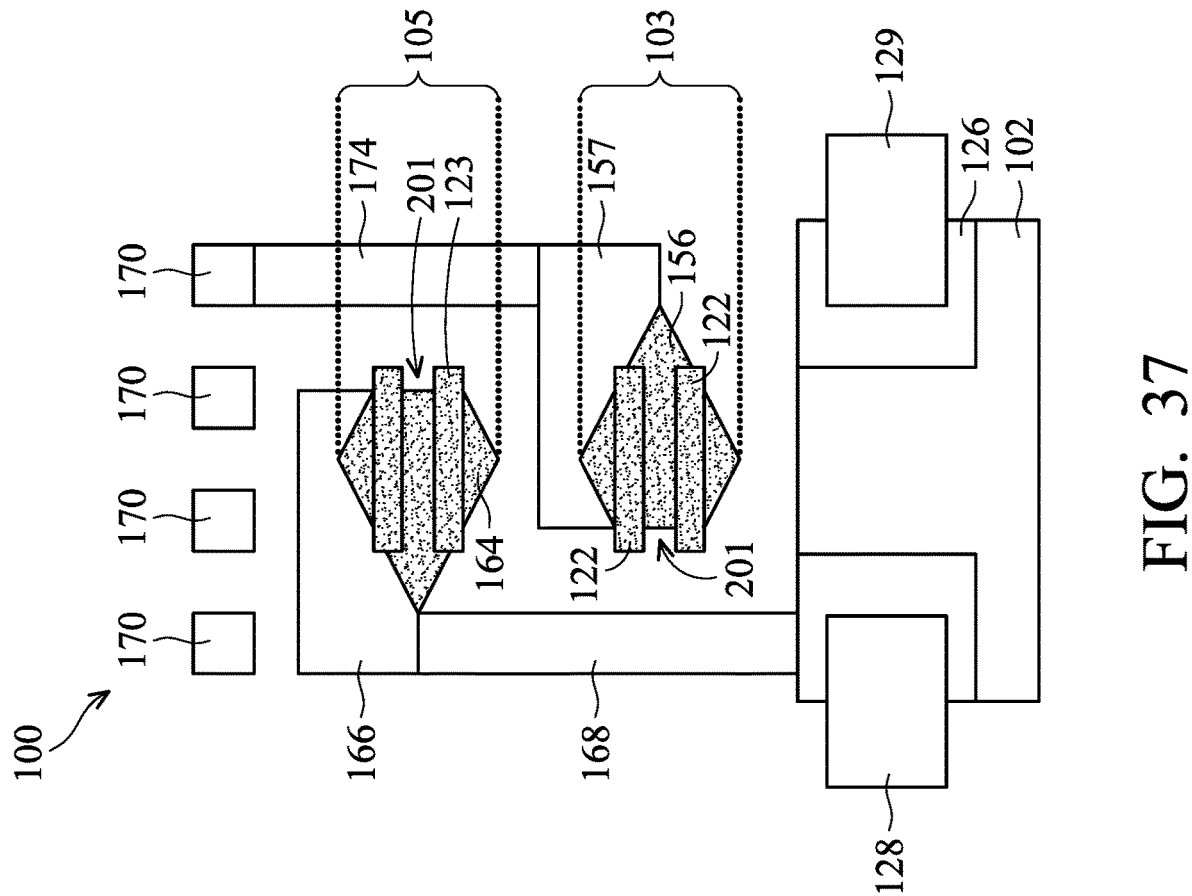

FIG. 37 illustrates a CFET 101, in accordance with some embodiments. In FIG. 37, the semiconductor nanostructures 122 and 123 remain in the source/drain regions 156 and 164. A source/drain contact 157 is formed on the source/drain region 156. A conductive via 174 couples the source/drain contacts 157 to one of the metal lines 170. A source/drain contact 166 is formed on the source/drain region 164. The conductive via 168 couples the source/drain contact 166 to the buried metal line 128. Both of the source/drain regions 156 and 164 are asymmetric, though on opposite sides. Both of the source/drain regions 156 and 164 have fork shaped features 201.

Figure 38:
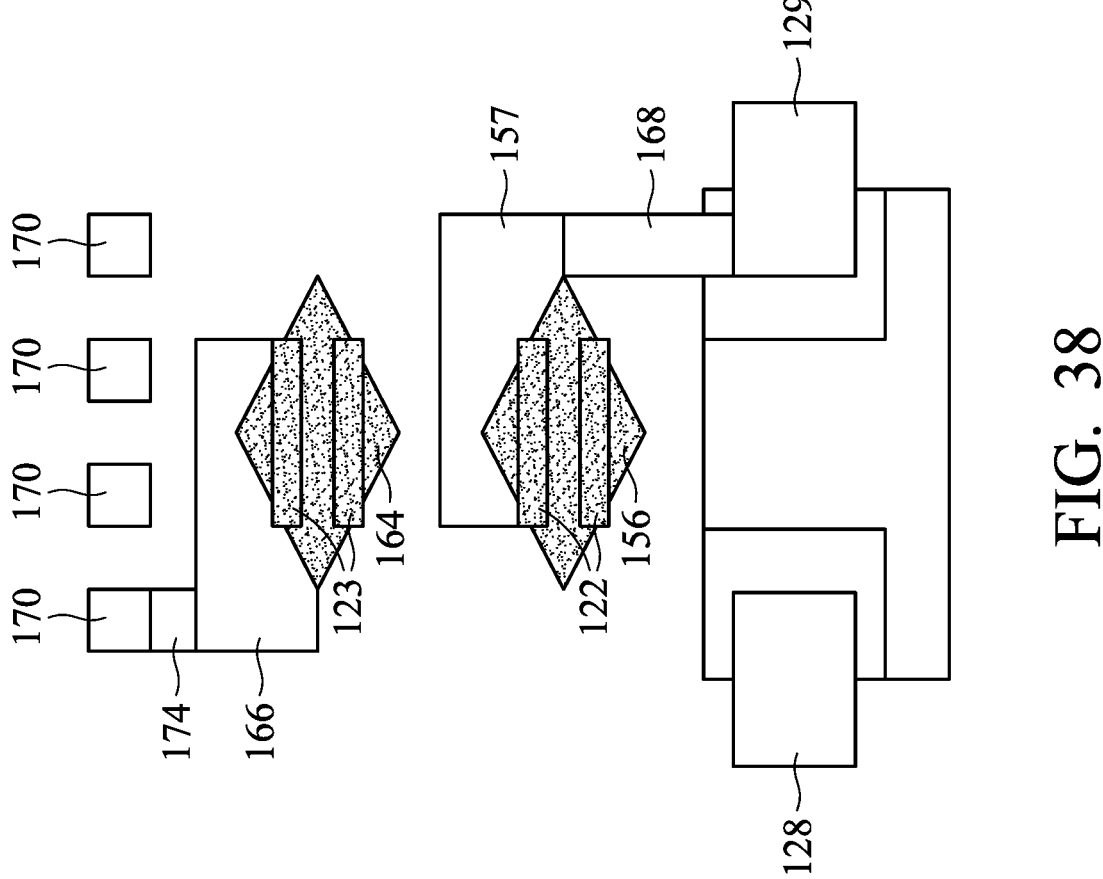

FIG. 38 illustrates a CFET 101, in accordance with some embodiments. The semiconductor nanostructures 122 and 123 remain in the source/drain regions 156 and 164. A source/drain contacts 157 is on the source/drain region 156. A conductive via 168 extends between the source/drain contacts 157 and the buried metal line 129. A source/drain contact 166 is on the source/drain region 164. A conductive via 174 extends between the source/drain contact 166 and one of the metal lines 170. In FIG. 38, the source/drain regions 156 and 164 are both symmetrical and aligned with each other in the Z direction. This is possible because there is no conductive via extending vertically from one of the source/drain regions 156/164 past the other source/drain region 156/164.

Figure 39:
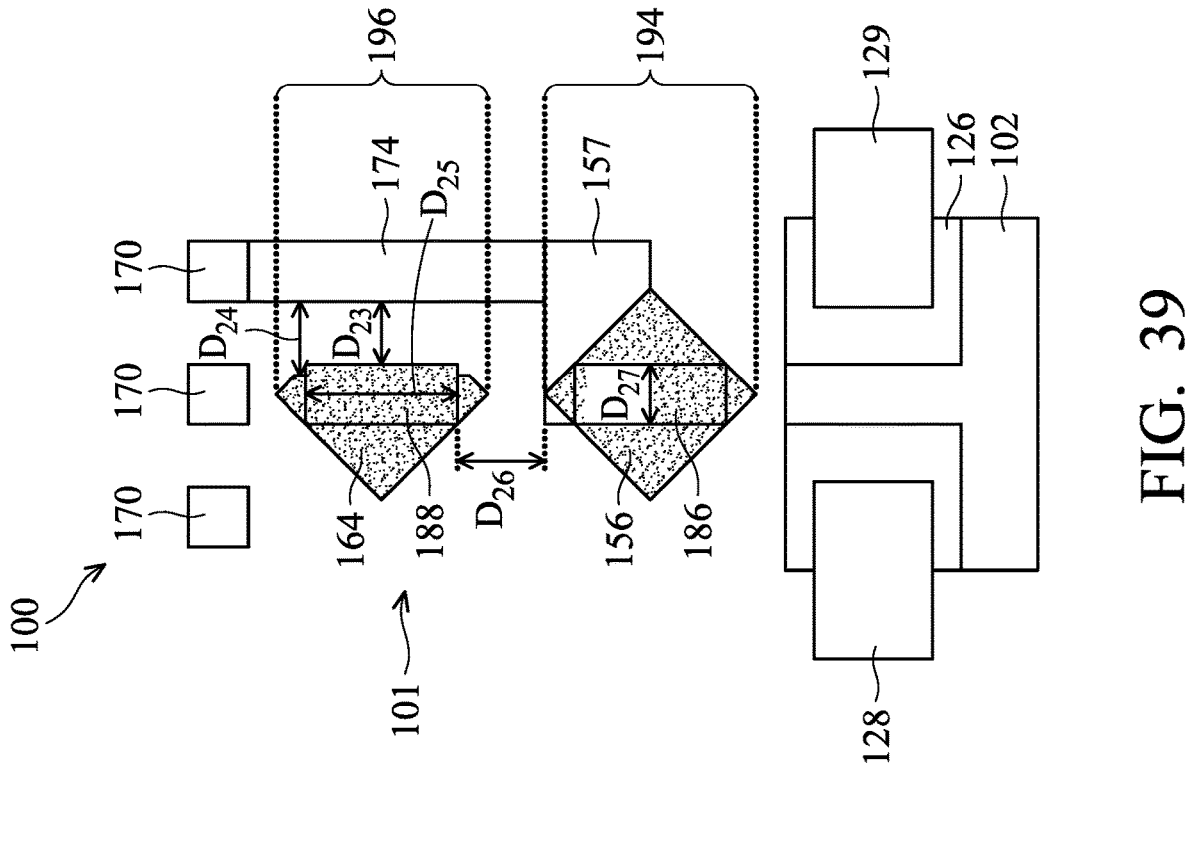

FIG. 39 illustrates a CFET 101, in accordance with some embodiments. The CFET 101 is similar to the CFET 101 of FIG. 34, except that the CFET 101 of FIG. 39 includes FinFET transistors 194 and 196 rather than nanostructure transistors 103 and 105. The right edge of the source/drain region 164 is to the left of the right edge of the semiconductor channel layer 188. Accordingly, the source/drain region 164 is asymmetrical with respect to the semiconductor channel layer 188. The source/drain region 156 is symmetrical with respect to the semiconductor channel layer 186. The right edge of the semiconductor channel layer 188 is separated from the conductive via 174 in the Y direction by a dimension D23 between 8 nm and 12 nm. The right edge of the source/drain region 164 is separated from the conductive via 174 in the Y direction by a dimension D24 between 10 nm and 16 nm. The semiconductor layers 186 and 188 have a dimension D25 in the Z direction between 20 nm and 50 nm. The semiconductor layers 186 and 188 are separated from each other in the Z direction by a dimension D26 between 10 nm and 20 nm. The semiconductor layers 186 and 188 have a dimension in the Y direction between 4 nm and 10 nm. Other dimensions can be utilized without departing from the scope of the present disclosure. The semiconductor layers 186 and 188 remain in the source/drain regions 156 and 164.

Figure 40:
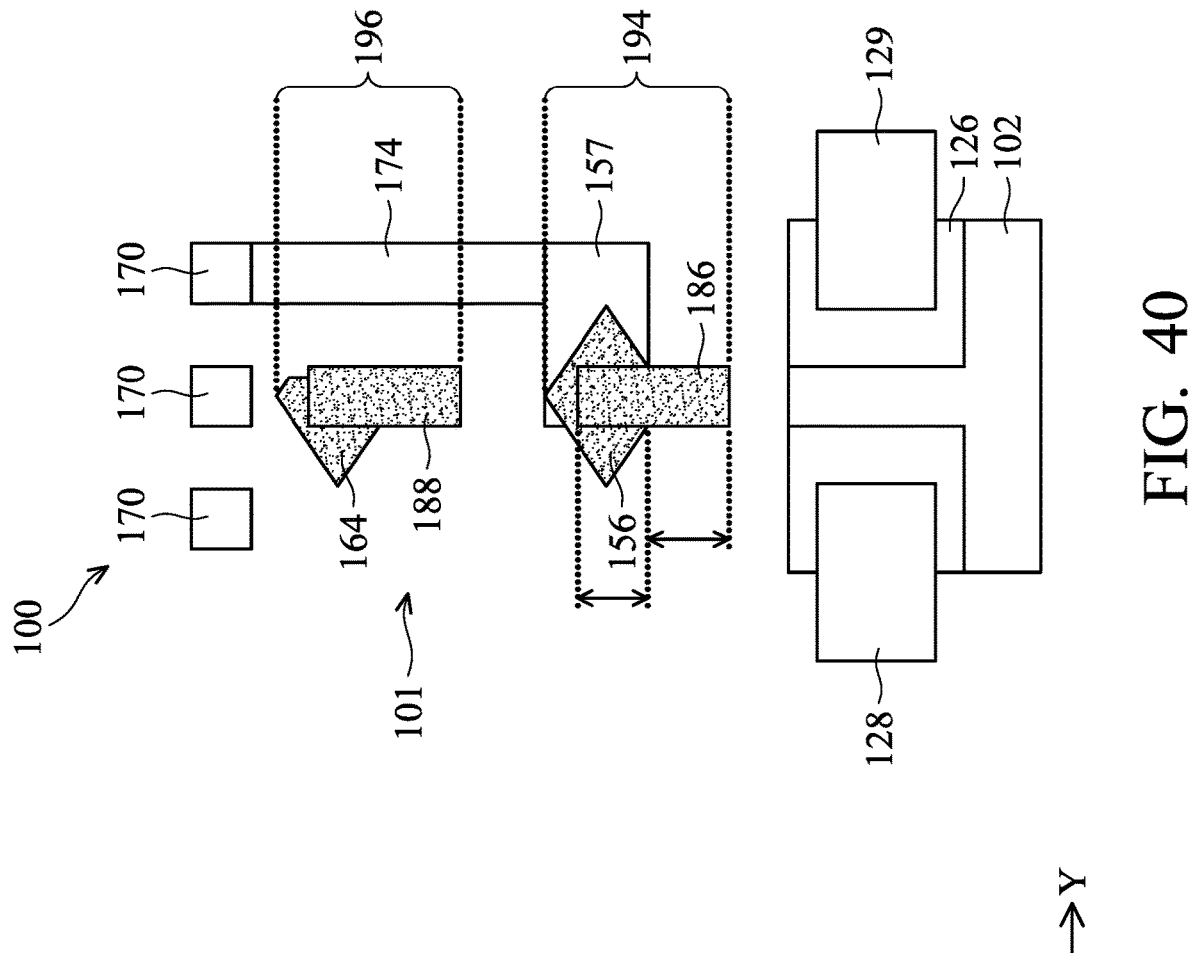

FIG. 40 illustrates a CFET 101, in accordance with some embodiments. The CFET 101 of FIG. 40 is substantially similar to the CFET 101 of FIG. 39, except that the source/drain regions 156 and 164 are both arranged asymmetrically with respect to the channel regions 186 and 188. In particular, the lowest portion of the source/drain regions 156 and 164 are about halfway from the top of the respective channel layers 186 and 188. This can be accomplished by ensuring that the bottom of the trenches 152, 154, 160, and 162 are at a level intermediate to the respective channel regions 186/188. This will ensure that the source/drain regions 156 and 164 cannot grow from the lower portions of the semiconductor channel layers 186 and 188. The semiconductor layers 186 and 188 remain in the source/drain regions 156 and 164.

Figure 41:
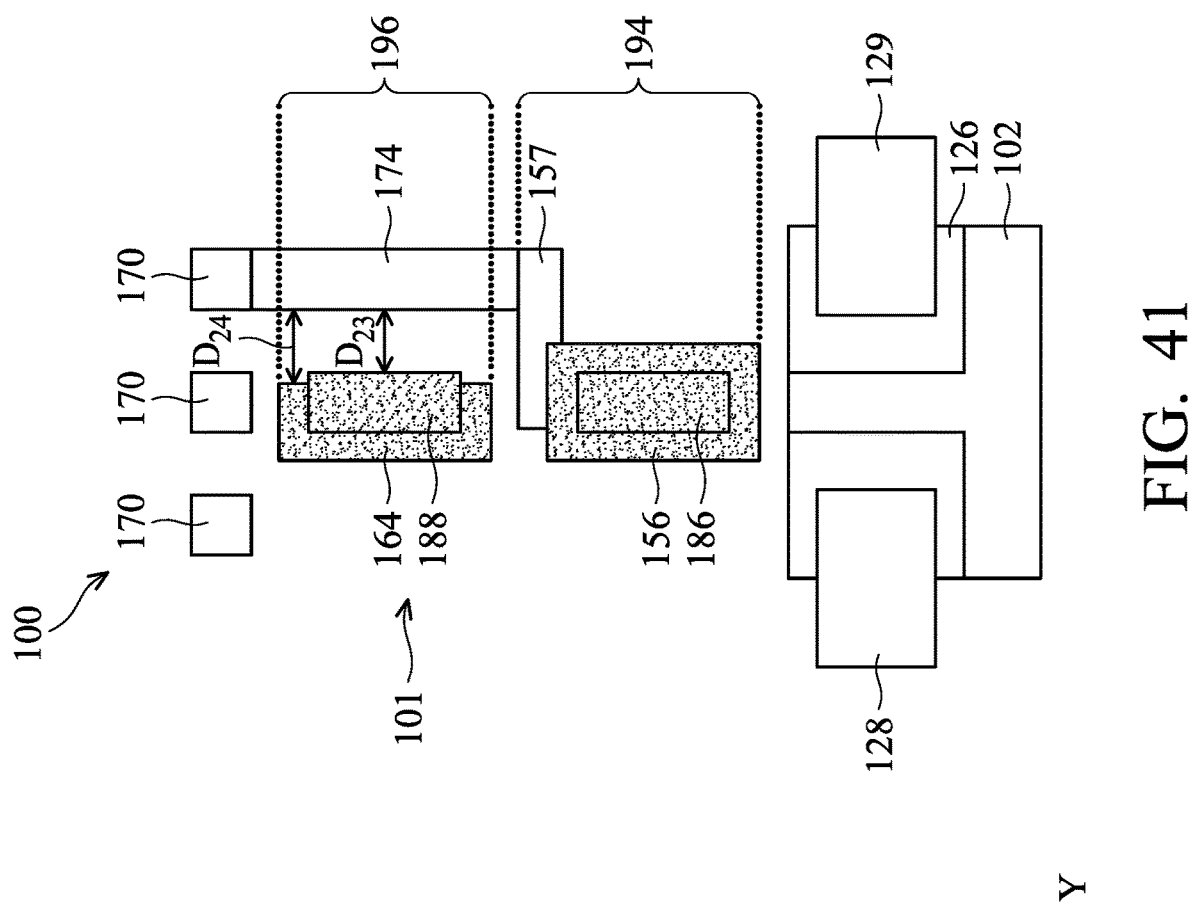

FIG. 41 illustrates a CFET 101, in accordance with some embodiments. The CFET 101 of FIG. 41 is substantially similar to the CFET 101 of FIG. 39, except that the source/drain regions 156 and 164 are grown with the rectangular epitaxy, resulting in a substantially rectangular shape. The source/drain region 164 separated from the conductive via 174 by a dimension D24. The channel region 188 is separated from the conductive via 174 by the dimension D23. The semiconductor layers 186 and 188 remain in the source/drain regions 156 and 164.

FIG. 42 is a flow diagram of a method 400 for forming an integrated circuit, in accordance with some embodiments. The method 400 can utilize systems, processes, components, and principles described in relation to FIGS. 1A-41. At 402, the method 400 includes forming a first channel region of a first transistor of a CFET. One example of a CFET is the CFET 101 of FIG. 29. One example the first transistor is the transistor 103 of FIG. 29. One example of a first channel region is the channel region 122 of FIG. 29. At 404, the method 400 includes forming a second channel region of a second transistor of a CFET, the second channel region being vertically aligned with the first channel region. One example of a second transistor is the transistor 105 of FIG. 29. One example of a second channel region is the channel region 123 of FIG. 29. At 406, the method 400 includes forming a first source/drain region coupled to the first channel region and being laterally asymmetric with respect to the first channel region. One example of a first source/drain region is the source/drain region 156 of FIG. 29. At 408, the method 400 includes forming a second source/drain region coupled to the second channel region and being laterally symmetric with respect to the second channel region. One example of a second source/drain region is the source/drain region 164 of FIG. 29.

Embodiments of the present disclosure provide an integrated circuit including a CFET having source/drain regions and contact vias that consume a small amount of area while reducing the risk of unintended short circuits between source/drain regions and adjacent conductive vias. The CFET transistor includes a first transistor and a second transistor stacked vertically. Embodiments of the present disclosure provide asymmetrically shaped source/drain regions to enable conductive vias to be formed near source/drain regions without the risk of contacting the source/drain regions. The result is integrated circuits with dense arrays of CFETs and reduce risk of undesired short circuits. This leads to better performing devices and higher wafer yields.

In one embodiment, an integrated circuit includes a first transistor. The first transistor includes a first channel region and a first source/drain region coupled to the first channel region. The integrated circuit includes a second transistor. The first transistor and the second transistor are stacked vertically. The second transistor includes a second channel region aligned vertically with the first channel region and a second source/drain region coupled to the second channel region. The second source/drain region is laterally asymmetric with respect to the second channel region.

In one embodiment, an integrated circuit includes a first transistor. The first transistor includes a plurality of first stacked channel regions vertically aligned with each other and a first source/drain region coupled to the first stacked channel regions and laterally asymmetric with respect to the first stacked channel regions.

In one embodiment, a method includes forming a first channel region of a first transistor of a CFET and forming a second channel region of a second transistor of a CFET, the second channel region being vertically aligned with the first channel region. The method includes forming a first source/drain region coupled to the first channel region and being laterally asymmetric with respect to the first channel region. The method includes forming a second source/drain region coupled to the second channel region and being laterally symmetric with respect to the second channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first transistor including:
      a first channel region; and
      a first source/drain region coupled to the first channel region;
   a second transistor, wherein the first transistor and the second transistor are stacked vertically, the second transistor including:
      a second channel region aligned vertically with the first channel region; and
      a second source/drain region coupled to the second channel region, wherein the second source/drain region is laterally asymmetric with respect to the second channel region, wherein the first channel region and the second channel region are laterally centered on a vertical axis, the second source/drain region including:
         a first lateral end; and
         a second lateral end opposite the first lateral end, wherein the first lateral end is further from the vertical axis than is the second lateral end.

2. The integrated circuit of claim 1, wherein the first source/drain region includes:
   a first lateral end; and
   a second lateral end opposite the first lateral end, wherein the first lateral end is substantially a same distance from the vertical axis as is the second end.

3. The integrated circuit of claim 2, wherein the first lateral end of the second source/drain region is substantially pointed, wherein the second lateral end of the second source/drain region is substantially a flat vertical surface.

4. The integrated circuit of claim 3, wherein the first and second lateral ends of the first source/drain region are both substantially pointed.

5. The integrated circuit of claim 1, comprising a conductive via electrically coupled to the first source/drain region and extending past the second source/drain region, wherein the second source/drain region is laterally further from the conductive via than is the first source/drain region.

6. The integrated circuit of claim 5, wherein the second channel region is laterally closer to the conductive via than is the second source/drain region.

7. The integrated circuit of claim 5, wherein the second channel region is laterally further from the conductive via than is the second source/drain region.

8. The integrated circuit of claim 5, comprising a buried metal line below both the first and second transistors, wherein the conductive via contacts the buried metal line.

9. The integrated circuit of claim 1, wherein the first and second transistors are FinFET transistors.

10. The integrated circuit of claim 1, wherein the first and second transistors are gate all around transistors.

11. The integrated circuit of claim 1, wherein the first and second transistors are a CFET transistor.

12. An integrated circuit, comprising:
   a first transistor including:
      a plurality of first stacked channel regions vertically aligned with each other; and
      a first source/drain region coupled to the first stacked channel regions and laterally asymmetric with respect to the first stacked channel regions, wherein the first transistor includes a second source/drain region coupled to the first stacked channels and laterally symmetric with the first stacked channels.

13. The integrated circuit of claim 12, comprising:
   a second transistor stacked vertically with the first transistor and including:
      a plurality of second stacked channels aligned with the first stacked channels; and
      a second source/drain region coupled to the plurality of second stacked channels.

14. The integrated circuit of claim 13, wherein the second source/drain region is laterally asymmetric with respect to the second stacked channels.

15. The integrated circuit of claim 12, wherein the first stacked channels and the first source/drain region include a forked structure.

16. A method, comprising:
   forming a first channel region of a first transistor of a CFET;
   forming a second channel region of a second transistor of a CFET, the second channel region being vertically aligned with the first channel region;
   forming a dielectric layer;
   forming a first trench in the dielectric layer exposing a portion of the first channel region, the first trench being laterally asymmetric with respect to the first channel region;
   forming, in the first trench, a first source/drain region coupled to the first channel region and being laterally asymmetric with respect to the first channel region; and
   forming a second source/drain region coupled to the second channel region and being laterally symmetric with respect to the second channel region;
   forming the first source/drain region in the first trench.

17. The method of claim 16, comprising:
   forming a second trench in the dielectric layer exposing a portion of the second channel region, wherein the second trench is laterally symmetric with respect to the second channel region; and forming the second source/drain region in the second trench.

18. The method of claim 16, further comprising forming:

forming a first source/drain contact coupled to the first source/drain region; and forming a second source/drain contact coupled to the second source/drain region.

19. The method of claim 18, further comprising forming a buried metal line below the CFET.

20. The method of claim 19, further comprising forming a conductive via extending between the buried the metal line and the first source/drain contact.

\* \* \* \* \*